United States Patent
Kusada et al.

(10) Patent No.: US 9,941,457 B2
(45) Date of Patent: Apr. 10, 2018

(54) THERMOELECTRIC GENERATOR UNIT AND THERMOELECTRIC GENERATOR SYSTEM

(71) Applicant: Panasonic Intellectual Property Management Co., Ltd., Osaka (JP)

(72) Inventors: Hideo Kusada, Osaka (JP); Tsutomu Kanno, Kyoto (JP); Akihiro Sakai, Nara (JP); Kohei Takahashi, Osaka (JP); Hiromasa Tamaki, Osaka (JP); Yuka Yamada, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 347 days.

(21) Appl. No.: 14/661,628

(22) Filed: Mar. 18, 2015

(65) Prior Publication Data

US 2015/0194588 A1    Jul. 9, 2015

Related U.S. Application Data

(63) Continuation of application No. PCT/JP2014/003091, filed on Jun. 10, 2014.

(30) Foreign Application Priority Data

Jul. 30, 2013  (JP) ................................. 2013-157682

(51) Int. Cl.
*H01L 35/30* (2006.01)
*H01L 35/16* (2006.01)
(Continued)

(52) U.S. Cl.
CPC .............. *H01L 35/30* (2013.01); *H01L 35/16* (2013.01); *H01L 35/22* (2013.01); *H01L 35/32* (2013.01); *H01L 35/325* (2013.01)

(58) Field of Classification Search
CPC ......... H01L 35/30; H01L 35/32; H01M 14/00
(Continued)

(56) References Cited

U.S. PATENT DOCUMENTS

2008/0173343 A1    7/2008  Kanno et al.
2013/0038071 A1    2/2013  Kano et al.
(Continued)

FOREIGN PATENT DOCUMENTS

FR    2 965 403 A1    3/2012
JP    59-191897 A    10/1984
(Continued)

OTHER PUBLICATIONS

International Search Report for corresponding International Application No. PCT/JP2014/003091 dated Aug. 19, 2014.
(Continued)

*Primary Examiner* — Jayne L Mershon
(74) *Attorney, Agent, or Firm* — Renner Otto Boisselle & Sklar, LLP

(57) ABSTRACT

An exemplary thermoelectric generator unit according to the present disclosure includes a plurality of tubular thermoelectric generators. Each generator generates electromotive force in an axial direction based on a difference in temperature between its inner and outer peripheral surfaces. The unit further includes a container housing the generators inside and a plurality of electrically conductive members providing electrical interconnection among the generators. The container has fluid inlet and outlet ports through which a fluid flows inside the container, and a plurality of openings into which the respective generators are inserted. In one implementation, the unit includes a baffle, which is provided between the fluid inlet port and the generators and changes the flow direction of the fluid that has flowed into the container through the fluid inlet port.

20 Claims, 31 Drawing Sheets

(51) Int. Cl.
*H01L 35/22* (2006.01)
*H01L 35/32* (2006.01)

(58) Field of Classification Search
USPC .......................................................... 136/224
See application file for complete search history.

(56) References Cited

U.S. PATENT DOCUMENTS

| | | | |
|---|---|---|---|
| 2013/0068273 | A1 | 3/2013 | Kanno et al. |
| 2013/0104953 | A1* | 5/2013 | Poliquin ............... H01L 35/30 136/224 |

FOREIGN PATENT DOCUMENTS

| | | |
|---|---|---|
| JP | 04-003278 U | 1/1992 |
| JP | 10-243670 A | 9/1998 |
| JP | 2005-197385 A | 7/2005 |
| JP | 2013-016685 A | 1/2013 |
| JP | 2013-038914 A | 2/2013 |
| WO | WO 2008/056466 A1 | 5/2008 |
| WO | WO 2012/014366 A1 | 2/2012 |

OTHER PUBLICATIONS

Kanno et al., "A Tubular Electric Power Generator Using Off-Diagonal Thermoelectric Effects", preprints from the 72nd Symposium of the Japan Society of Applied Physics, 30a-F-14, 2011.

Sakai et al., "Enhancement in performance of the tubular thermoelectric generation (TTEG)", International Conference on Thermoelectrics, 2012.

Kanno et al., "A Tubular Thermoelectric Generator with Piled Conical Rings Structure", Advanced Technology Research Laboratories, Panasonic Corporation, Kyoto, Japan 2011.

Kanno et al., "Development of thermoelectric generation tube for utilising unutilized thermo energy", Panasonic Corporation, Japan, Jul. 24, 2012, pp. 100-108 (with concise English translation).

* cited by examiner (a)                    (b)

THERMOELECTRIC GENERATOR UNIT AND THERMOELECTRIC GENERATOR SYSTEM

This is a continuation of International Application No. PCT/JP2014/003091, with an international filing date of Jun. 10, 2014, which claims priority of Japanese Patent Application No. 2013-157682, filed on Jul. 30, 2013, the contents of which are hereby incorporated by reference.

BACKGROUND

1. Technical Field

The present disclosure relates to a thermoelectric generator unit including a thermoelectric conversion element which converts heat into electric power, and also relates to a thermoelectric generator system including a plurality of thermoelectric generator units.

2. Description of the Related Art

A thermoelectric conversion element is an element which can convert either heat into electric power or electric power into heat. A thermoelectric conversion element made of a thermoelectric material that exhibits the Seebeck effect can obtain thermal energy from a heat source at a relatively low temperature (of 200 degrees Celsius or less, for example) and can convert the thermal energy into electric power. With a thermoelectric generation technique based on such a thermoelectric conversion element, it is possible to collect and effectively utilize thermal energy which would conventionally have been dumped unused into the ambient in the form of steam, hot water, exhaust gas, or the like.

A thermoelectric conversion element made of a thermoelectric material will be hereinafter referred to as a "thermoelectric generator". A thermoelectric generator generally has a so-called "π structure" where p- and n-type semiconductors, of which the carriers have mutually different electrical polarities, are combined together (see Japanese Laid-Open Patent Publication No. 2013-016685, for example). In a thermoelectric generator with the π structure, a p-type semiconductor and an n-type semiconductor are connected together electrically in series together and thermally parallel with each other. In the π structure, the direction of a temperature gradient and the direction of electric current flow are either mutually parallel or mutually antiparallel to each other. This makes it necessary to provide an output terminal on the high-temperature heat source side or the low-temperature heat source side. Consequently, to connect a plurality of such thermoelectric generators, each having the π structure, electrically in series together, a complicated wiring structure is required.

PCT International Application Publication No. 2008/056466 (which will be hereinafter referred to as "Patent Document 1") discloses a thermoelectric generator including a stacked body of a bismuth layer and a layer of a different metal from bismuth between first and second electrodes that face each other. In the thermoelectric generator disclosed in Patent Document 1, the planes of stacking are inclined with respect to a line that connects the first and second electrodes together. PCT International Application Publication No. 2012/014366 (which will be hereinafter referred to as "Patent Document 2"), kanno et al., preprints from the $72^{nd}$ Symposium of the Japan Society of Applied Physics, 30a-F-14 "A Tubular Electric Power Generator Using Off-Diagonal Thermoelectric Effects" (2011), and A. Sakai et al., International conference on thermoelectrics 2012 "Enhancement in performance of the tubular thermoelectric generator (TTEG)" (2012) disclose tubular thermoelectric generators.

SUMMARY

Development of a practical thermoelectric generator unit and system that uses such thermoelectric generation technologies is awaited.

A thermoelectric generator unit according to an embodiment of the present disclosure includes: a plurality of tubular thermoelectric generators, each of which has an outer peripheral surface, an inner peripheral surface and a flow path defined by the inner peripheral surface, and each of which generates electromotive force in an axial direction of each tubular thermoelectric generator based on a difference in temperature between the inner and outer peripheral surfaces; a container housing the plurality of tubular thermoelectric generators inside, the container having fluid inlet and outlet ports through which a fluid flows inside the container, and a plurality of openings into which the respective tubular thermoelectric generators are inserted; a plurality of electrically conductive members providing electrical interconnection among the plurality of tubular thermoelectric generators; and a baffle provided between the fluid inlet port and the plurality of tubular thermoelectric generators. The baffle changes the flow direction of the fluid that has flowed into the container through the fluid inlet port.

A thermoelectric generator unit according to the present disclosure contributes to increasing the practicality of thermoelectric power generation.

These general and specific aspects may be implemented using a system, and a method, and any combination of systems, and methods.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 19 is a cross-sectional view illustrating another exemplary connection pattern of the first conduit 72a to the fluid inlet port 38a.

FIG. 20 is a cross-sectional view illustrating still another exemplary connection pattern of the first conduit 72a to the fluid inlet port 38a.

DETAILED DESCRIPTION

Figure 1A:
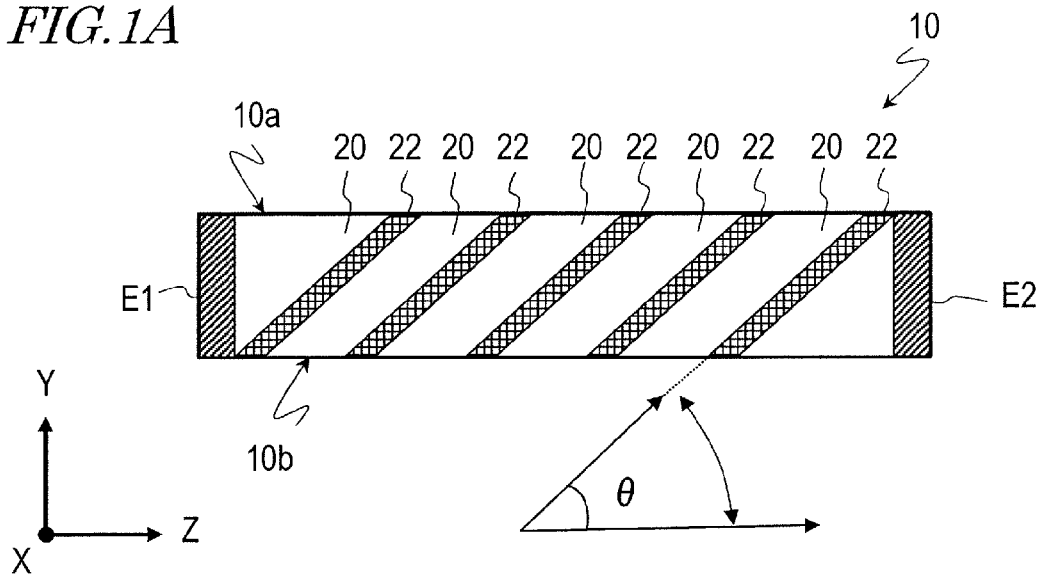
FIG. 1A is a schematic cross-sectional view of a thermoelectric generator 10.

A thermoelectric generator unit according to a non-limiting exemplary implementation of the present disclosure includes a plurality of tubular thermoelectric generators. Each of the tubular thermoelectric generators has an outer peripheral surface, an inner peripheral surface and a flow path defined by the inner peripheral surface. Each tubular thermoelectric generator is configured to generate electromotive force in its axial direction based on a difference in temperature between the inner and outer peripheral surfaces.

This thermoelectric generator unit further includes a container housing the plurality of tubular thermoelectric generators inside and a plurality of electrically conductive members providing electrical interconnection among the plurality of tubular thermoelectric generators. The container has fluid inlet and outlet ports through which a fluid flows inside the container, and a plurality of openings into which the respective tubular thermoelectric generators are inserted.

In one implementation, a baffle is provided between the fluid inlet port of the container and the plurality of tubular thermoelectric generators. This baffle changes the flow direction of the fluid that has flowed into the container through the fluid inlet port. In another implementation, the thermoelectric generator unit includes a conduit, one end of which is connected to the fluid inlet port. The container has a shell surrounding the plurality of tubular thermoelectric generators. And the conduit is arranged so that an extension of the center axis of the conduit passes between the plurality of tubular thermoelectric generators and an inner wall of the shell. In still another implementation, the container has a shell surrounding the plurality of tubular thermoelectric generators, and an internal confining wall provided between the plurality of tubular thermoelectric generators and the shell.

As will be described in detail later, a thermoelectric generator unit according to an embodiment includes a plurality of tubular thermoelectric generators. When a temperature difference is created between the inner and outer peripheral surfaces of each tubular thermoelectric generator, electromotive force is generated in the axial direction of the tubular thermoelectric generator. For example, by housing each tubular thermoelectric generator in a container filled with a cold heat transfer medium (such as cold water) and by supplying a hot heat transfer medium (such as hot water) into a flow path defined by the inner peripheral surface of each tubular thermoelectric generator, each tubular thermoelectric generator can generate electric power. In the meantime, heat is also exchanged between the cold and hot heat transfer media. It should be noted that although these heat transfer media will be referred to herein as "hot" and "cold" heat transfer media, these terms "hot" and "cold" actually do not refer to specific absolute temperature levels of those media but just mean that there is a relative temperature difference between those media. Also, the "medium" is typically a gas, a liquid or a fluid that is a mixture of a gas and a liquid. However, the "medium" may contain solid, e.g., powder, which is dispersed within a fluid. Hereinafter, the hot heat transfer medium and the cold heat transfer medium will be sometimes simply referred to as "the hot medium" and "the cold medium", respectively.

When a thermoelectric generator unit is operating, the inside of a container that houses respective tubular thermoelectric generators is typically filled with some liquid such as hot water or cold water. Meanwhile, the container is sometimes emptied by draining the liquid from inside the container when the thermoelectric generator unit needs to be subjected to maintenance, for example. Likewise, just after the thermoelectric generator unit has been installed, for example, its container is not filled with liquid yet but is still empty. In the present specification, the "empty" state refers herein to not only a state where there is almost no liquid in the container but also a state where at least one tubular thermoelectric generator is partially exposed out of liquid.

For example, suppose a situation where the container of the thermoelectric generator unit is emptied to subject the unit to maintenance. When the maintenance is finished, some liquid such as hot water or cold water is introduced into the container to start operating the thermoelectric generator unit again. In this case, to fill the container with the liquid, the air inside the container needs to be removed. The air is typically expelled from inside of the container by introducing liquid into the container at a relatively high pressure. That is to say, the liquid introduced into the container when the thermoelectric generator unit is going to start operating again has a relatively high flow speed. Particularly when a number of thermoelectric generator units are connected together, the air needs to be extracted from inside the respective containers of those thermoelectric generator units. In such a situation, the flow speed of the liquid introduced into the respective containers of those thermoelectric generator units is usually higher than when a single thermoelectric generator unit is used.

However, if the liquid being introduced into an empty container has a high pressure, the liquid flowing into the container could do damage on the tubular thermoelectric generators. For that reason, it would be beneficial to ensure that the fluid flowing into the container will not damage the tubular thermoelectric generators. In that case, when starting to operate again after going through maintenance, the thermoelectric generator unit can be prevented from causing any failure due to damage done on its tubular thermoelectric generators, thus improving the practicality of thermoelectric power generation.

<Basic Configuration and Principle of Operation of Thermoelectric Generator>

Before embodiments of a thermoelectric generator unit according to the present disclosure are described, the basic configuration and principle of operation of a thermoelectric generator for use in each thermoelectric generator unit will be described. As will be described later, in a thermoelectric generator unit according to the present disclosure, a tubular thermoelectric generator is used. However, the principle of operation of such a tubular thermoelectric generator can also be understood more easily through description of the principle of operation of a thermoelectric generator in a simpler shape.

Figure 1B:
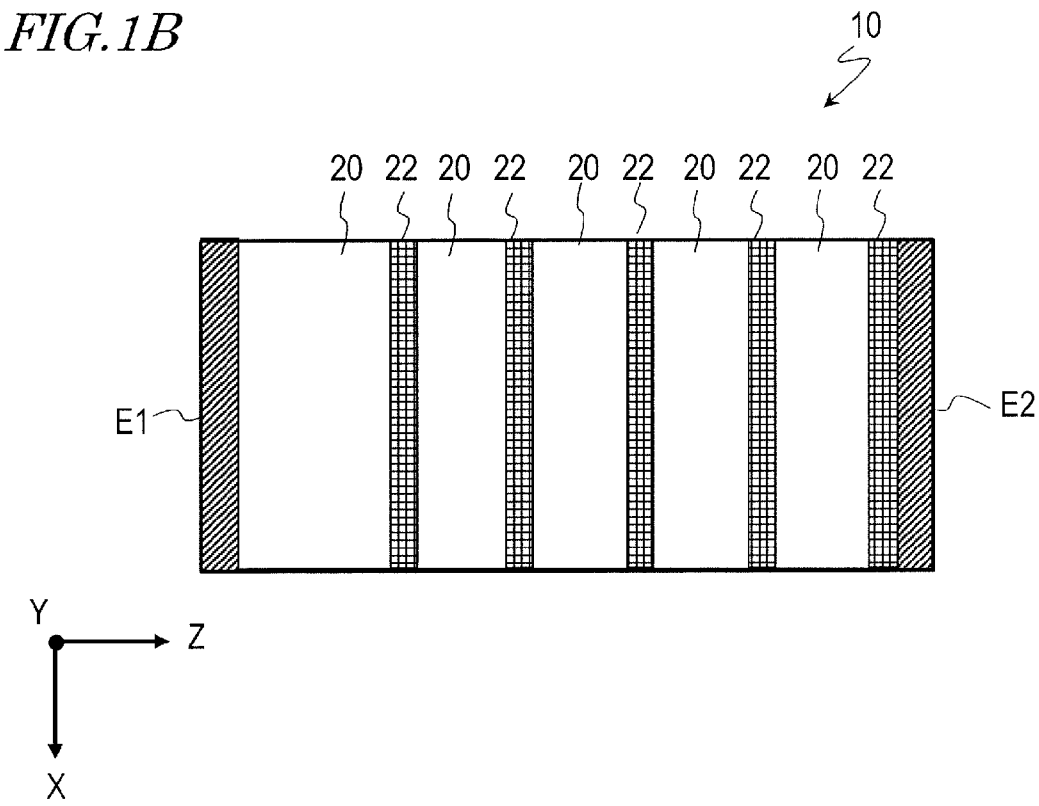
FIG. 1B is a top view of the thermoelectric generator 10 shown in FIG. 1A.

First of all, look at FIGS. 1A and 1B. FIG. 1A is a schematic cross-sectional view of a thermoelectric generator 10 with a generally rectangular parallelepiped shape, and FIG. 1B is a top view of the thermoelectric generator 10. For reference sake, X-, Y- and Z-axis that intersect with each other at right angles are shown in FIGS. 1A and 1B. The thermoelectric generator 10 shown in FIGS. 1A and 1B includes a stacked body with a structure in which multiple metal layers 20 and thermoelectric material layers 22 are alternately stacked one upon the other so that their planes of stacking are inclined. Although the stacked body is supposed to have a rectangular parallelepiped shape in this example, the principle of operation will be the same even if the stacked body has any other shape.

In the thermoelectric generator 10 shown in FIGS. 1A and 1B, first and second electrodes E1 and E2 are arranged so as to sandwich the stacked body horizontally between them. In the cross section shown in FIG. 1A, the planes of stacking define an angle of inclination $\theta$ (where $0<\theta<\pi$ radians) with respect to the Z-axis direction. The angle of inclination $\theta$ will be hereinafter simply referred to as an "inclination angle".

In the thermoelectric generator 10 with such a configuration, when a temperature difference is created between its upper surface 10a and its lower surface 10b, the heat will be transferred preferentially through the metal layers 20 with higher thermal conductivity than the thermoelectric material layers 22. Thus, a Z-axis direction component is produced in the temperature gradient of each of those thermoelectric material layers 22. As a result, electromotive force occurs in the Z-axis direction in each thermoelectric material layer 22 due to the Seebeck effect, and eventually the electromotive forces are superposed one upon the other in series inside this stacked body. Consequently, a significant potential difference is created as a whole between the first and second electrodes E1 and E2. A thermoelectric generator including the stacked body shown in FIGS. 1A and 1B is disclosed in PCT International Application Publication No. 2008/056466 (Patent Document 1), the entire disclosure of which is hereby incorporated by reference.

Figure 2:
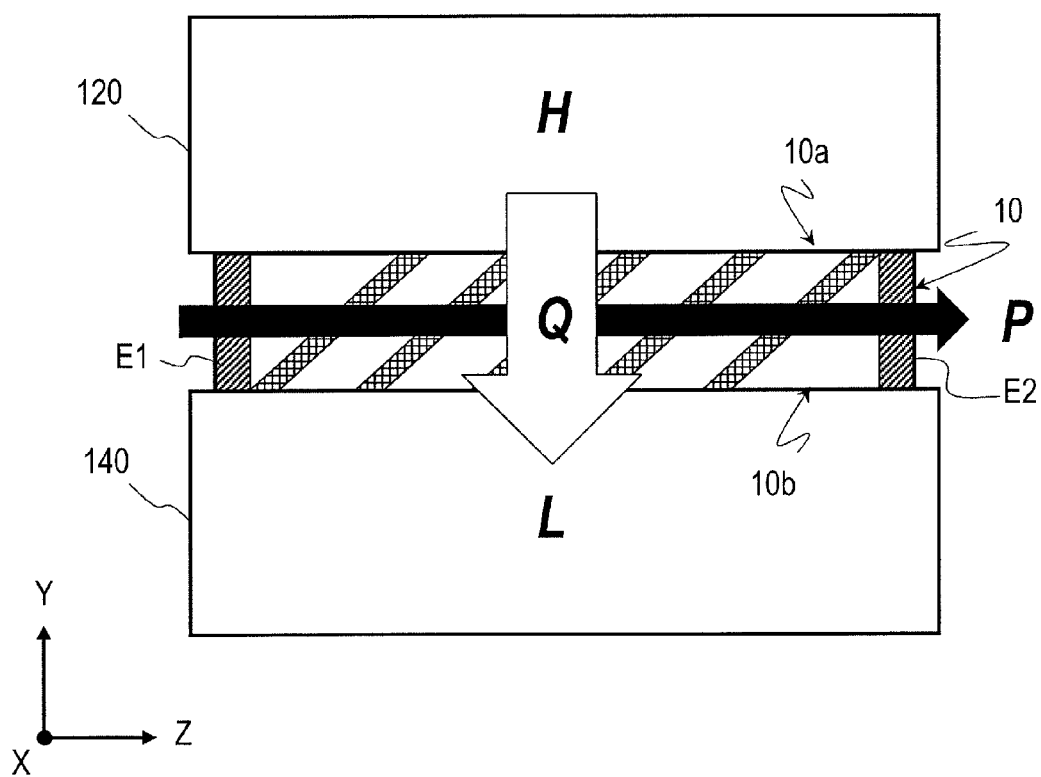
FIG. 2 schematically illustrates a situation where a high-temperature heat source 120 is brought into contact with the upper surface 10a of the thermoelectric generator 10 and a low-temperature heat source 140 is brought into contact with its lower surface 10b.

FIG. 2 schematically illustrates a situation where a high-temperature heat source 120 is brought into contact with the upper surface 10a of the thermoelectric generator 10 and a low-temperature heat source 140 is brought into contact with its lower surface 10b. In such a situation, heat Q flows from the high-temperature heat source 120 toward the low-temperature heat source 140 through the thermoelectric generator 10, and electric power P can be extracted from the thermoelectric generator 10 through the first and second electrodes E1 and E2. From a macroscopic point of view, in this thermoelectric generator 10, the direction of temperature gradient (Y-axis direction) and the direction of the electric current (Z-axis direction) intersect with each other at right angles. That is why there is no need to create a temperature difference between the two electrodes E1 and E2, through which the electric power is extracted. FIG. 2 schematically illustrates an example in which the electric power P flows from the left toward the right on the paper. However, this is only an example. For example, if the kind of the thermoelectric material used is changed, the electric power P may flow in the opposite direction from the one shown in FIG. 2.

Although the stacked body of the thermoelectric generator 10 is supposed to have a rectangular parallelepiped shape in the example described above for the sake of simplicity, a thermoelectric generator, of which the stacked body has a tubular shape, will be used in the embodiments to be described below. A thermoelectric generator in such a tubular shape will be hereinafter referred to as a "tubular thermoelectric generator" or "thermoelectric generation tube". It should be noted that in the present specification, the term "tube" is interchangeably used with the term "pipe", and is to be interpreted to encompass both a "tube" and a "pipe".

<Outline of Thermoelectric Generator Unit>

Next, a thermoelectric generator unit according to the present disclosure will be outlined.

Figure 3A:
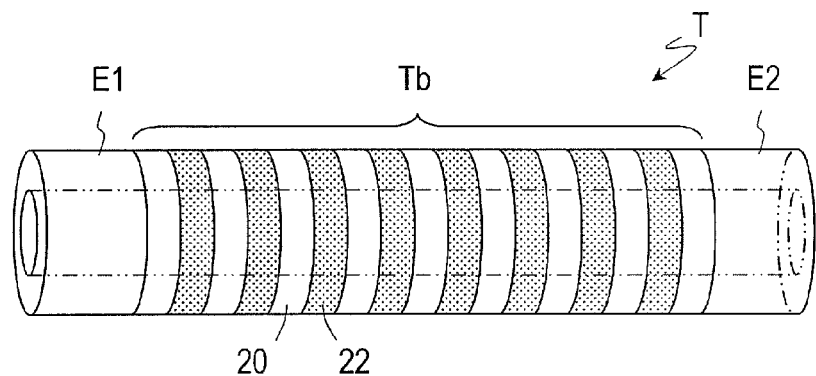
FIG. 3A is a perspective view illustrating a general configuration for a tubular thermoelectric generator T which may be used in an exemplary thermoelectric generator unit according to the present disclosure.
Figure 3B:
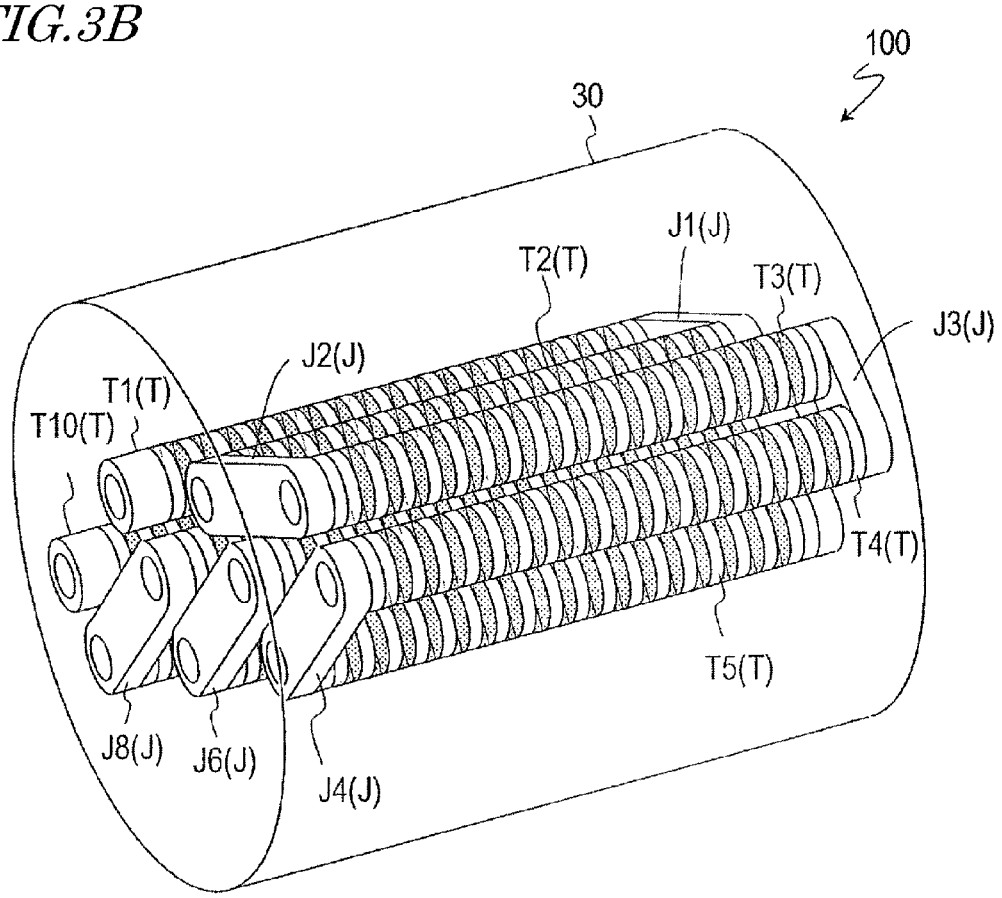
FIG. 3B is a perspective view illustrating a general configuration for an exemplary thermoelectric generator unit 100 according to the present disclosure.

First of all, look at FIGS. 3A and 3B. FIG. 3A is a perspective view illustrating an exemplary tubular thermoelectric generator T. The tubular thermoelectric generator T includes a tube body Tb in which multiple metal layers 20 and thermoelectric material layers 22 with a through hole at their center are alternately stacked one upon the other so as to be inclined and a pair of electrodes E1 and E2. A method of making such a tubular thermoelectric generator T is disclosed in Patent Document 2, for example. According to the method disclosed in Patent Document 2, multiple metallic cups, each having a hole at the bottom, and multiple thermoelectric material cups, each also having a hole at the bottom, are alternately stacked one upon the other and subjected to a plasma sintering process in such a state, thereby binding them together. The entire disclosure of PCT International Application Publication No. 2012/014366 is hereby incorporated by reference.

The tubular thermoelectric generator T shown in FIG. 3A may be connected to a conduit so that a hot medium flows through a flow path defined by its inner peripheral surface (which will be sometimes hereinafter referred to as an "internal flow path"). In that case, the outer peripheral surface of the tubular thermoelectric generator T may be brought into contact with a cold medium. In this manner, a temperature difference is created between the inner and outer peripheral surfaces of the tubular thermoelectric generator T, thereby generating a potential difference between the pair of electrodes E1 and E2. As a result, the electric power generated can be extracted.

The shape of the tubular thermoelectric generator T may be anything tubular, without being limited to cylindrical. In other words, when the tubular thermoelectric generator T is cut along a plane which is perpendicular to the axis of the tubular thermoelectric generator T, the resultant shapes created by sections of the "outer peripheral surface" and the "inner peripheral surface" do not need to be circles, but may be any closed curves, e.g., ellipses or polygons. Although the axis of the tubular thermoelectric generator T is typically linear, it is not limited to being linear. These can be seen easily from the principle of thermoelectric generation that has already been described with reference to FIGS. 1A, 1B and 2.

FIG. 3B is a perspective view illustrating a general configuration for an exemplary thermoelectric generator unit 100 according to the present disclosure. The thermoelectric generator unit 100 shown in FIG. 3B includes a plurality of tubular thermoelectric generators T, a container 30 which houses these tubular thermoelectric generators T inside, and a plurality of electrically conductive members J to electrically connect these tubular thermoelectric generators T together. In the example illustrated in FIG. 3B, ten tubular thermoelectric generators T1 to T10 are housed inside the container 30. Those ten tubular thermoelectric generators T1 to T10 are typically arranged substantially parallel to each other but may also be arranged in any other pattern.

Each of these tubular thermoelectric generators T1 to T10 has an outer peripheral surface, an inner peripheral surface and an internal flow path defined by the inner peripheral surface as described above. Each of these tubular thermoelectric generators T1 to T10 is configured to generate electromotive force along its axis based on a difference in temperature created between the inner and outer peripheral surfaces. That is to say, by creating a temperature difference between the outer and inner peripheral surfaces in each of those tubular thermoelectric generators T1 to T10, electric power generated can be extracted from the tubular thermoelectric generators T1 to T10. For example, by bringing a hot medium and a cold medium into contact with the internal flow path and the outer peripheral surface, respectively, in each of the tubular thermoelectric generators T1 to T10, electric power generated can be extracted from the tubular thermoelectric generators T1 to T10. Conversely, a cold medium and a hot medium may be brought into contact with the inner and outer peripheral surfaces, respectively, in each of the tubular thermoelectric generators T1 to T10.

In the example illustrated in FIG. 3B, the medium to be brought into contact with the outer peripheral surfaces of the tubular thermoelectric generators T1 to T10 inside the container 30 and the medium to be brought into contact with the inner peripheral surface of each tubular thermoelectric generator T1 to T10 in the internal flow path of the respective tubular thermoelectric generator are supplied through different conduits (not shown), thus being isolated so as not to intermix.

Figure 4:
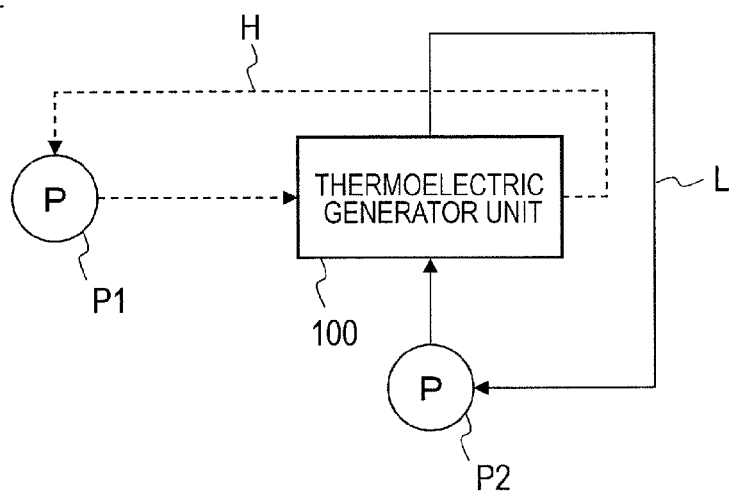
FIG. 4 is a block diagram illustrating an exemplary configuration for introducing a temperature difference between the outer and inner peripheral surfaces of the tubular thermoelectric generator T.

FIG. 4 is a block diagram illustrating an exemplary configuration for introducing a temperature difference between the outer and inner peripheral surfaces of the tubular thermoelectric generator T. In FIG. 4, the dotted arrow H schematically indicates the flow of a hot medium and the solid arrow L schematically indicates the flow of a cold medium. In the example illustrated in FIG. 4, the hot and cold media are circulated by pumps P1 and P2, respectively. For example, the hot medium may be supplied to the internal flow path in each of the tubular thermoelectric generators T1 to T10 and the cold medium may be supplied into the container 30. Although not shown in FIG. 4, heat is supplied from a high-temperature heat source (such as a heat exchanger, not shown) to the hot medium and heat is supplied from the cold medium to a low-temperature heat source (not shown, either). As the high-temperature heat source, steam, hot water and exhaust gas at relatively low temperatures (of 200 degrees Celsius or less, for example) which have been dumped unused into the ambient can be used. Naturally, heat sources at even higher temperatures may also be used.

In the example illustrated in FIG. 4, the hot and cold media are supposed to be circulated by the pumps P1 and P2, respectively. However, this is only an example of a thermoelectric generator unit according to the present disclosure. Alternatively, one or both of the hot and cold media may be dumped from their heat source into the ambient without forming a circulating system. For example, high-temperature hot spring water that has sprung from the ground may be supplied as the hot medium to the thermoelectric generator unit 100, and when its temperature lowers, the hot spring water may be used for any purpose other than power generation or just discharged. The same can be said about the cold medium. That is to say, phreatic water, river water or seawater may be pumped up and supplied to the thermoelectric generator unit 100. After any of these kinds of water has been used as the cold medium, its temperature may be lowered to an appropriate level as needed and then the water may be either poured back to its original source or just discharged to the ambient.

Now look at FIG. 3B again. In the thermoelectric generator unit 100 according to the present disclosure, a plurality of tubular thermoelectric generators T are electrically connected together via the electrically conductive members J. In the example illustrated in FIG. 3B, each pair of tubular thermoelectric generators T arranged adjacent to each other are connected together via their associated electrically conductive member J. As a result, these tubular thermoelectric generators T are electrically connected together in series as a whole. For example, the respective right ends of two tubular thermoelectric generators T3 and T4 which are illustrated as front ones in FIG. 3B are connected together with an electrically conductive member J3. On the other hand, the respective left ends of these two tubular thermoelectric generators T3 and T4 are connected to two other tubular thermoelectric generators T2 and T5 via electrically conductive members J2 and J4, respectively.

Figure 5:
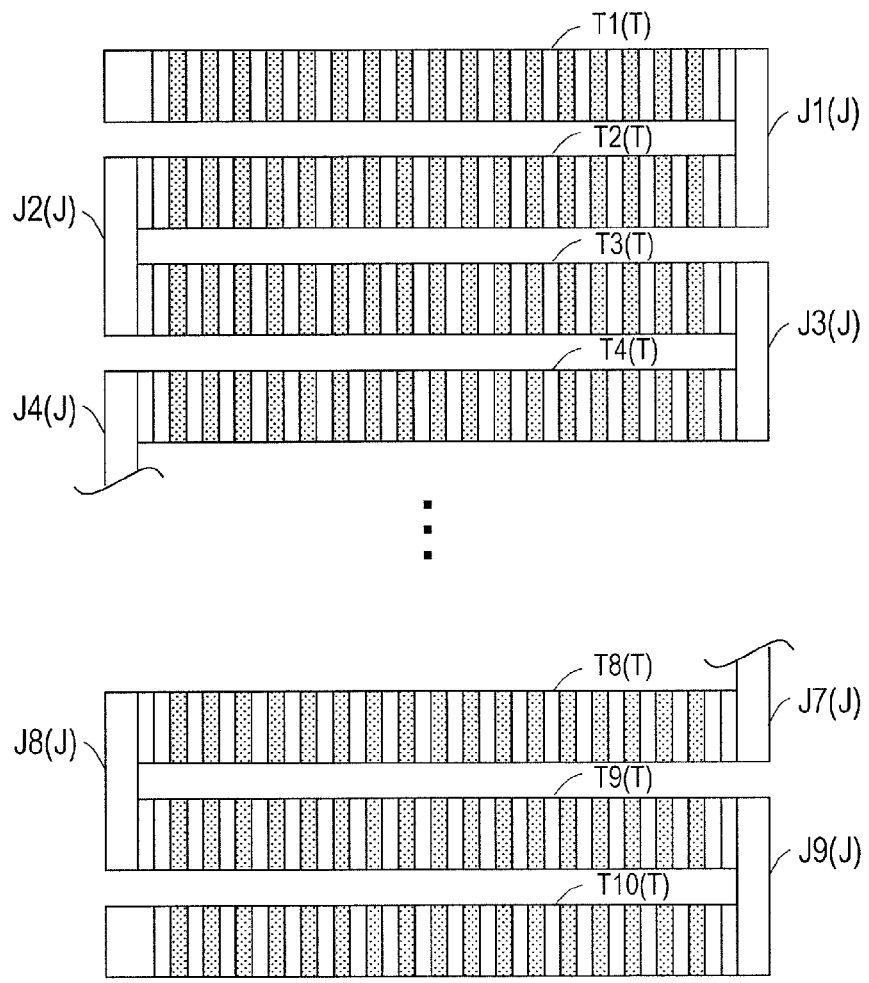
FIG. 5 schematically illustrates how the tubular thermoelectric generators T1 to T10 may be electrically connected together.

FIG. 5 schematically illustrates how those tubular thermoelectric generators T1 to T10 may be electrically connected together. As shown in FIG. 5, each of the electrically conductive members J1 to J9 electrically connects its associated two tubular thermoelectric generators together. That is to say, the electrically conductive members J1 to J9 are arranged to electrically connect these tubular thermoelectric generators T1 to T10 in series together as a whole. In this example, the circuit comprised of the tubular thermoelectric generators T1 to T10 and the electrically conductive members J1 to J9 is a traversable one. However, this circuit may also include some tubular thermoelectric generators which are connected in parallel, and it is not essential that the circuit be traversable.

In the example illustrated in FIG. 5, an electric current may flow from the tubular thermoelectric generator T1 to the tubular thermoelectric generator T10, for example. However, the electric current may also flow from the tubular thermoelectric generator T10 to the tubular thermoelectric generator T1. The direction of this electric current is determined by the kind of a thermoelectric material used to make the tubular thermoelectric generator T, the direction of flow of heat generated between the inner and outer peripheral surfaces of the tubular thermoelectric generator T, and the direction of inclination of the planes of stacking in the tubular thermoelectric generator T, for example. The connection of the tubular thermoelectric generators T1 to T10 is determined so that electromotive forces occurring in the respective tubular thermoelectric generators T1 to T10 do not cancel one another, but are superposed.

It should be noted that the direction in which the electric current flows through the tubular thermoelectric generators T1 to T10 has nothing to do with the direction in which the medium (i.e., either the hot medium or the cold medium) flows through the internal flow path of the tubular thermoelectric generators T1 to T10. For instance, in the example illustrated in FIG. 5, the medium going through the internal flow path may flow from the left toward the right on the paper in each and every one of the tubular thermoelectric generators T1 to T10.

<Detailed Configuration of Tubular Thermoelectric Generator T>

Figure 6A:
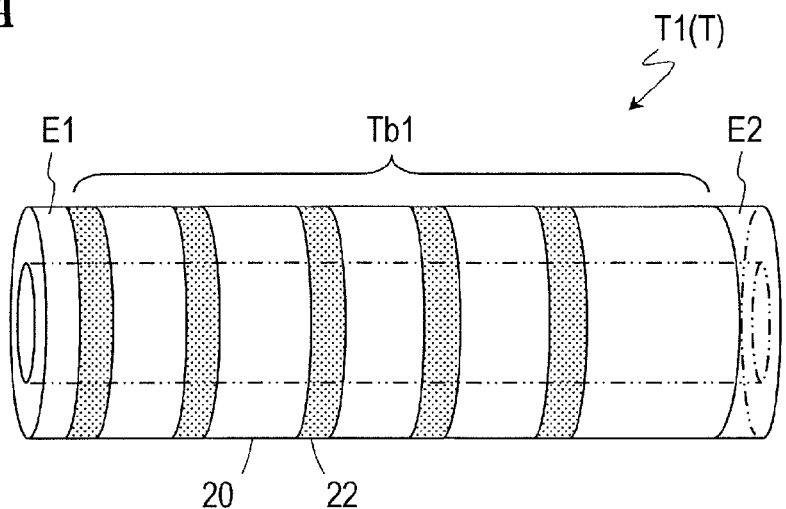
FIG. 6A is a perspective view illustrating one of the tubular thermoelectric generators T (e.g., the tubular thermoelectric generator T1 in this example) that the thermoelectric generator system 100 has.

Next, a detailed configuration for the tubular thermoelectric generator T will be described with reference to FIGS. 6A and 6B. FIG. 6A is a perspective view illustrating one of the tubular thermoelectric generators T (e.g., the tubular thermoelectric generator T1 in this example) that the thermoelectric generator system 100 has. The tubular thermoelectric generator T1 includes a tube body Tb1 and first and second electrodes E1 and E2 which are arranged at both ends of the tube body Tb1. The tube body Tb1 has a configuration in which multiple metal layers 20 and multiple thermoelectric material layers 22 are alternately stacked one upon the other. In the present specification, the direction in which a line that connects the first and second electrodes E1 and E2 together runs will be sometimes hereinafter referred to as a "stacking direction". The stacking direction agrees with the axial direction of the tubular thermoelectric generator.

Figure 6B:
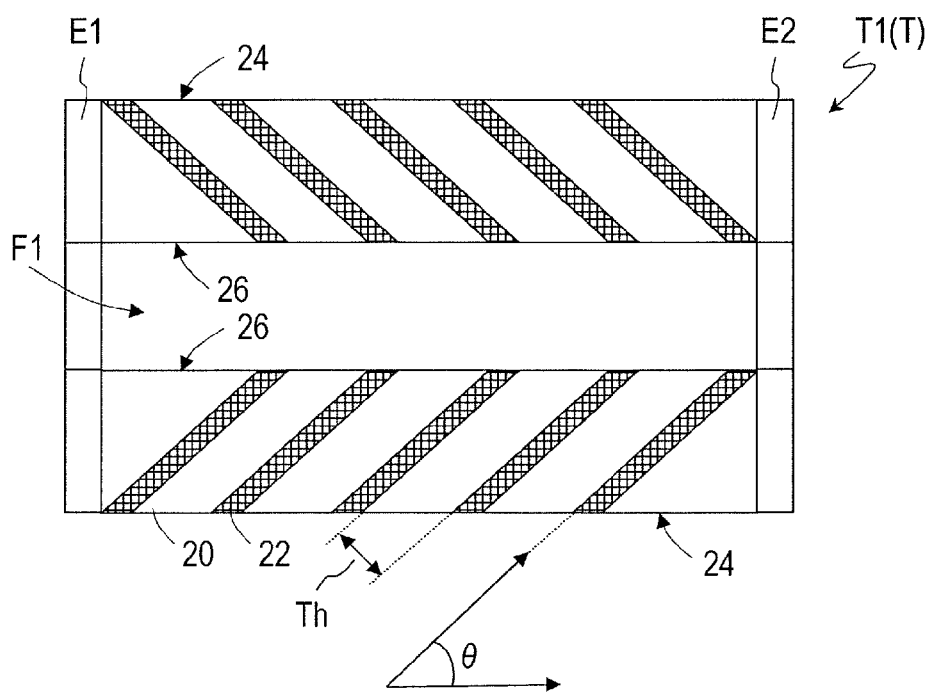
FIG. 6B schematically illustrates a cross section where the tubular thermoelectric generator T1 is cut along a plane which contains the axis (center axis) of the tubular thermoelectric generator T1.

FIG. 6B schematically illustrates a cross section of the tubular thermoelectric generator T1 as viewed on a plane including the axis (center axis) of the tubular thermoelectric generator T1. As shown in FIG. 6B, the tubular thermoelectric generator T1 has an outer peripheral surface 24 and an inner peripheral surface 26. A region which is defined by the inner peripheral surface 26 forms a flow path F1. In the illustrated example, cross sections of the outer peripheral surface 24 and the inner peripheral surface 26 taken perpendicular to the axial direction each present the shape of a circle. However, these shapes are not limited to circles, but may be ellipses or polygons, as described above. The cross-sectional area of the flow path on such a cross section that intersects with the axial direction at right angles is not particularly limited. The cross-sectional area of the flow path or the number of tubular thermoelectric generators to provide may be determined appropriately by the flow rate of the medium to be supplied into the internal flow path of the tubular thermoelectric generator T.

Although the first and second electrodes E1 and E2 each have a circular cylindrical shape in the example illustrated in FIGS. 6A and 6B, this is only an example and the first and second electrodes E1 and E2 do not have to have such a shape. At or near the respective end of the tube body Tb1, the first electrode E1 and the second electrode E2 may each have any arbitrary shape which is electrically connectable to at least one of the metal layers 20 or the thermoelectric material layers 22 and which does not obstruct the flow path F1. In the example shown in FIGS. 6A and 6B, the first electrode E1 and the second electrode E2 have outer peripheral surfaces conforming to the outer peripheral surface 24 of the tube body Tb1; however, it is not necessary for the outer peripheral surfaces of the first electrode E1 and the second electrode E2 to conform to the outer peripheral surface 24 of the tube body Tb1. For example, the diameter of the outer peripheral surface (i.e., the outer diameter) of the first and second electrodes E1 and E2 may be larger or smaller than that of the tube body Tb1. Also, when viewed on a plane that intersects with the axial direction at right angles, the cross-sectional shape of the first and second electrodes E1 and E2 may be different from that of the outer peripheral surface 24 of the tube body Tb1.

The first and second electrodes E1 and E2 may be made of a material with electrical conductivity and are typically made of a metal. The first and second electrodes E1 and E2 may be comprised of a single or multiple metal layers 20 which are located at or near the ends of the tube body Tb1. In that case, portions of the tube body Tb1 function as the first and second electrodes E1 and E2. Alternatively, the first and second electrodes E1 and E2 may also be formed out of a metal layer or annular metallic member which is arranged so as to partially cover the outer peripheral surface of the tube body Tb1. Still alternatively, the first and second electrodes E1 and E2 may also be a pair of circular cylindrical metallic members which are fitted into the flow path F1 through the ends of the tube body Tb1 so as to be in contact with the inner peripheral surface of the tube body Tb1.

As shown in FIG. 6B, the metal layers 20 and thermoelectric material layers 22 are alternately stacked one upon the other so as to be inclined. A tubular thermoelectric generator with such a configuration operates on basically the same principle as what has already been described with reference to FIGS. 1A, 1B and 2. That is why if a temperature difference is created between the outer peripheral surface 24 and inner peripheral surface 26 of the tubular thermoelectric generator T1, a potential difference is generated between the first and second electrodes E1 and E2. The general direction of the temperature gradient is the radial direction of the tubular thermoelectric generator T1 (i.e., the direction that intersects with the stacking direction at right angles).

The inclination angle $\theta$ of the planes of stacking in the tube body Tb1 may be set within the range of not less than 5 degrees and not more than 60 degrees, for example. The inclination angle $\theta$ may be not less than 20 degrees and not more than 45 degrees. An appropriate range of the inclination angle $\theta$ varies according to the combination of the material to make the metal layers 20 and the thermoelectric material to make the thermoelectric material layers 22.

The ratio of the thickness of each metal layer 20 to that of each thermoelectric material layer 22 in the tube body Tb1 (which will be hereinafter simply referred to as a "stacking ratio") may be set within the range of 20:1 to 1:9, for example. In this case, the thickness of the metal layer 20 refers herein to its thickness as measured perpendicularly to the plane of stacking (i.e., the thickness indicated by the arrow Th in FIG. 6B). In the same way, the thickness of the thermoelectric material layer 22 refers herein to its thickness as measured perpendicularly to the plane of stacking. It should be noted that the total number of the metal layers 20 and thermoelectric material layers 22 that are stacked one upon the other may be set appropriately.

The metal layers 20 may be made of any arbitrary metallic material. For example, the metal layers 20 may be made of nickel or cobalt. Nickel and cobalt are examples of metallic materials which exhibit excellent thermoelectric generation properties. Optionally, the metal layers 20 may include silver or gold. Furthermore, the metal layers 20 may include any of these metallic materials either by itself or as their alloy. If the metal layers 20 are made of an alloy, the alloy may include copper, chromium or aluminum. Examples of such alloys include constantan, CHROMEL™, and ALUMEL™.

The thermoelectric material layers 22 may be made of any arbitrary thermoelectric material depending on their operating temperature. Examples of thermoelectric materials which may be used to make the thermoelectric material layers 22 include: thermoelectric materials of a single element, such as bismuth or antimony; alloy-type thermoelectric materials, such as BiTe-type, PbTe-type and SiGe-type; and oxide-type thermoelectric materials, such as $Ca_xCoO_2$, $Na_xCoO_2$ and $SrTiO_3$. In the present specification, the "thermoelectric material" refers herein to a material, of which the Seebeck coefficient has an absolute value of 30 μV/K or more and the electrical resistivity is 10 mΩcm or less. Such a thermoelectric material may be a crystalline one or an amorphous one. If the hot medium has a temperature of approximately 200 degrees Celsius or less, the thermoelectric material layers 22 may be made of a dense body of bismuth-antimony-tellurium, for example. Bismuth-antimony-tellurium may be, but does not have to be, represented by a chemical composition Optionally, bismuth-antimony-tellurium may include a dopant such as selenium. The mole fractions of bismuth and antimony may be adjusted appropriately.

Other examples of the thermoelectric materials to make the thermoelectric material layers 22 include bismuth telluride and lead telluride. When the thermoelectric material layers 22 are made of bismuth telluride, it may be of the chemical composition $Bi_2Te_X$, where 2<X<4. A representative chemical composition of bismuth telluride is $Bi_2Te_3$, which may include antimony or selenium. The chemical composition of bismuth telluride including antimony may be represented by $(Bi_{1-Y}Sb_Y)_2Te_X$, where 0<Y<1, and more preferably 0.6<Y<0.9.

The first and second electrodes E1 and E2 may be made of any material as long as the material has good electrical conductivity. For example, the first and second electrodes E1 and E2 may be made of a metal selected from the group consisting of nickel, copper, silver, molybdenum, tungsten, aluminum, titanium, chromium, gold, platinum and indium. Alternatively, the first and second electrodes E1 and E2 may also be made of a nitrides or oxides, such as titanium nitride (TiN), indium tin oxide (ITO), and tin dioxide ($SnO_2$). Still alternatively, the first or second electrode E1, E2 may also be made of solder, silver solder or electrically conductive paste, for example. It should be noted that if both ends of the tube body Tb1 are metal layers 20, then the first and second electrodes E1 and E2 may be replaced with those metal layers 20 as described above.

In the foregoing description, an element with a configuration in which metal layers and thermoelectric material layers are alternately stacked one upon the other has been described as a typical example of a tubular thermoelectric generator. However, this is just an example, and the tubular thermoelectric generator which may be used according to the present disclosure does not have to have such a configuration. Rather electrical power can also be generated thermoelectrically as described above as long as a first layer made of a first material with a relatively low Seebeck coefficient and relatively high thermal conductivity and a second layer made of a second material with a relatively high Seebeck coefficient and relatively low thermal conductivity are stacked alternately one upon the other. That is to say, the metal layer 20 and thermoelectric material layer 22 are only examples of such first and second layers, respectively.

<Embodiment of Thermoelectric Generator Unit>

Figure 7:
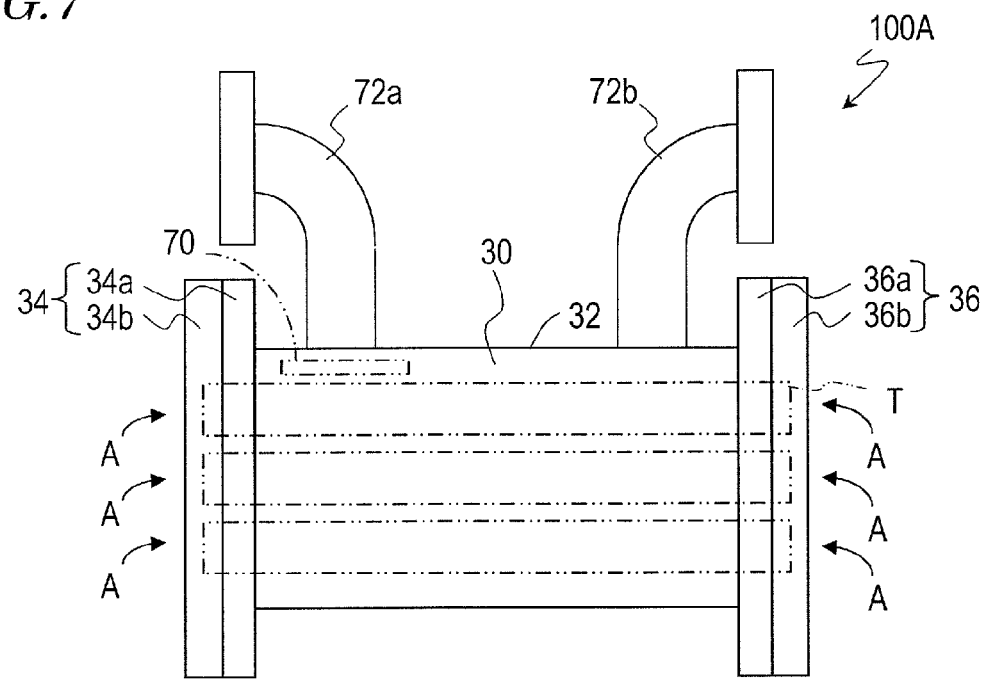
FIG. 7 is a front view illustrating an exemplary thermoelectric generator unit according to an embodiment of the present disclosure.

Next, look at FIG. 7, which is a front view illustrating an exemplary thermoelectric generator unit according to an embodiment of the present disclosure. As shown in FIG. 7, the thermoelectric generator unit 100A according to this implementation includes a number of tubular thermoelectric generators T and a container 30 which houses those tubular thermoelectric generators T inside. At a glance, such a structure looks like the "shell and tube structure" of a heat exchanger. In a heat exchanger, however, a number of tubes just function as pipelines to make fluid flow through and do not have to be electrically connected together. In a thermoelectric generator unit according to the present disclosure, on the other hand, those tubular thermoelectric generators need to be electrically connected together in practice with good stability, unlike the heat exchanger.

As already described with reference to FIG. 4, a hot medium and a cold medium are supplied to the thermoelectric generator unit 100A. The hot medium may be supplied into the respective internal flow paths of the tubular thermoelectric generators T1 to T10 through multiple openings A, for example. Meanwhile, the cold medium is supplied into the container 30 through a fluid inlet port to be described later. As a result, a temperature difference is created between the outer and inner peripheral surfaces of each tubular thermoelectric generator T. In this case, in the thermoelectric generator unit 100A, not only heat is exchanged between the hot and cold media but also electromotive force occurs in the axial direction in each of the tubular thermoelectric generators T1 to T10.

In the example shown in FIG. 7, the container 30 includes a cylindrical shell 32 which surrounds the tubular thermoelectric generators T and a pair of plates 34 and 36 which are arranged to close the open ends of the shell 32. More specifically, in the example shown in FIG. 7, the plates 34 and 36 are respectively fixed onto the left and right ends of the shell 32. Each of these plates 34 and 36 has multiple openings A into which respective tubular thermoelectric generators T are inserted. Both ends of an associated tubular thermoelectric generator T are inserted into each corresponding pair of openings A of the plates 34 and 36.

Just like the tube sheets of a shell and tube heat exchanger, these plates 34 and 36 have the function of supporting a plurality of tubes (i.e., the tubular thermoelectric generators T) so that these tubes are spatially separated from each other. Those tubular thermoelectric generators T are typically arranged parallel to each other inside the container 30. Nevertheless, those tubular thermoelectric generators T do not have to be arranged parallel to each other but may also be arranged either non-parallel or skew to each other. In the example described below, those tubular thermoelectric generators T are arranged parallel to each other inside the container 30. As will be described in detail later, the plates 34 and 36 have an electrical connection capability that the tube sheets of a heat exchanger do not have.

In the example illustrated in FIG. 7, the plate 34 includes a first plate portion 34a fixed to the shell 32 and a second plate portion 34b which is attached to the first plate portion 34a so as to be readily removable from the first plate portion 34a. Likewise, the plate 36 also includes a first plate portion 36a fixed to the shell 32 and a second plate portion 36b which is attached to the first plate portion 36a so as to be readily removable from the first plate portion 36a. The openings A in the plates 34 and 36 penetrate through, respectively, the first plate portions 34a and 36a and the second plate portions 34b and 36b, thus leaving the flow paths of the thermoelectric generation tubes T open to the exterior of the container 30.

Examples of materials to make the container 30 include metals such as stainless steel, HASTELLOY™ or INCONEL™. Examples of other materials to make the container 30 include polyvinyl chloride and acrylic resin. The shell 32 and the plates 34, 36 may be made of the same material or may be made of two different materials. If the shell 32 and the first plate portions 34a and 36a are made of metal(s), then the first plate portions 34a and 36a may be welded onto the shell 32. Or if flanges are provided at both ends of the shell 32, the first plate portions 34a and 36a may be fixed onto those flange portions.

Since some fluid (that is either the cold medium or hot medium) is introduced into the container 30 while the thermoelectric generator unit 100A is operating, the inside of the container 30 should be kept either airtight or watertight. As will be described later, each opening A of the plates 34, 36 is sealed to keep the inside of the container 30 either airtight or watertight once the ends of the tubular thermoelectric generator T have been inserted through the opening A. A structure in which no gap is left between the shell 32 and the plates 34, 36 and which is kept either airtight or watertight throughout the operation is realized.

Figure 8:
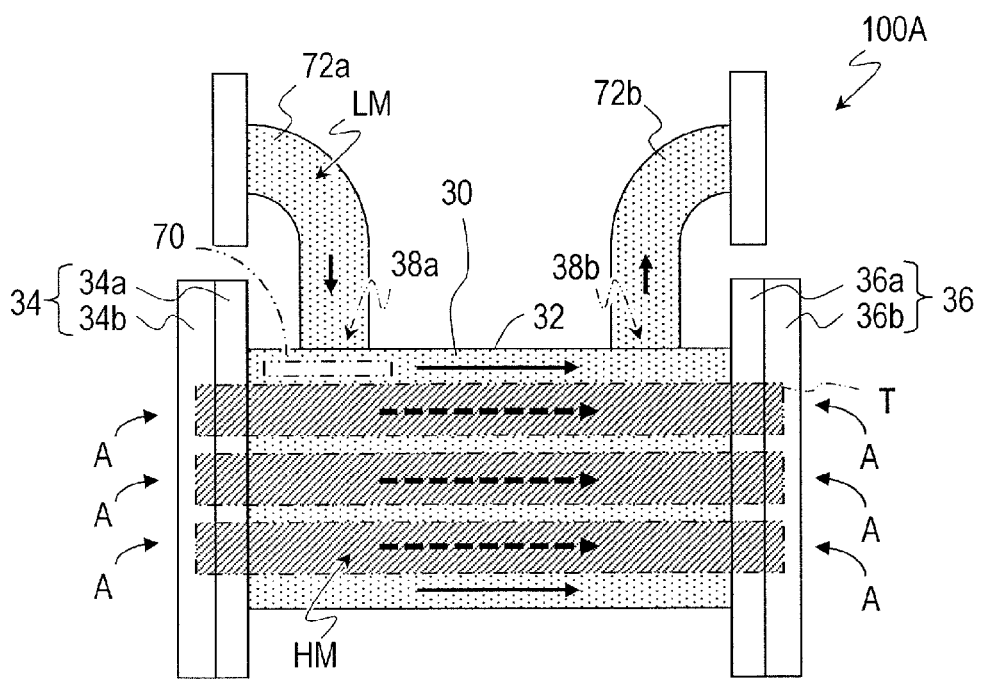
FIG. 8 schematically shows exemplary flow directions of the hot and cold heat transfer media introduced into the thermoelectric generator unit.

As shown in FIG. 8, the container 30 has a fluid inlet port 38a and a fluid outlet port 38b through which a fluid flows inside the container 30. In this thermoelectric generator unit 100A, the fluid inlet and outlet ports 38a and 38b are arranged in the upper part of the container 30. However, the fluid inlet port 38a does not have to be arranged in the upper part of the container 30 but may also be arranged in the lower part of the container 30 as well. The same can be said about the fluid outlet port 38b. The fluid inlet and outlet ports 38a and 38b may be openings cut through the side surface of the shell 32 of the container 30. In the example illustrated in FIG. 8, first and second conduits 72a and 72b are connected to the fluid inlet and outlet ports 38a and 38b, respectively.

As shown in FIGS. 7 and 8, a baffle 70 is provided inside the container 30. This baffle 70 is arranged between the fluid inlet port 38a and the tubular thermoelectric generators T. As will be described in detail later, this baffle 70 is configured to change the flow direction of the fluid that has flowed into the container 30. The fluid inlet and outlet ports 38a and 38b do not always have to be used as inlet and outlet for a fluid but may be inverted at regular or irregular intervals. That is to say, the fluid flow direction does not have to be fixed. That is why another baffle may be arranged between the fluid outlet port 38b and the tubular thermoelectric generators T. Also, although only one fluid inlet port 38a and only one fluid outlet port 38b are shown in FIG. 8, this is only an example, and more than one fluid inlet port 38a and/or more than one fluid outlet port 38b may be provided as well. In that case, a plurality of baffles may be arranged inside the container 30.

FIG. 8 schematically shows exemplary flow directions of the hot and cold media introduced into the thermoelectric generator unit 100A. In the example shown in FIG. 8, a hot medium HM is supplied into the internal flow path of each of the tubular thermoelectric generators T1 to T10, while a cold medium LM is supplied into the container 30. In this example, the hot medium HM is introduced into the internal flow path of each tubular thermoelectric generator through the openings A cut through the plate 34. The hot medium HM introduced into the internal flow path of each tubular thermoelectric generator contacts with the inner peripheral surface of the tubular thermoelectric generator. On the other hand, the cold medium LM is introduced into the container 30 through the fluid inlet port 38a. The cold medium LM introduced into the container 30 contacts with the outer peripheral surface of each tubular thermoelectric generator.

In the example shown in FIG. 8, while flowing through the internal flow path of each tubular thermoelectric generator, the hot medium HM exchanges heat with the cold medium LM. The hot medium HM, of which the temperature has decreased through heat exchange with the cold medium LM, is discharged out of the thermoelectric generator unit 100A through the openings A of the plate 36. On the other hand, while flowing inside the container 30, the cold medium LM exchanges heat with the hot medium HM.

The cold medium LM, of which the temperature has increased through heat exchange with the hot medium HM, is discharged out of the thermoelectric generator unit 100A through the fluid outlet port 38b. The flow directions of the hot and cold media HM and LM shown in FIG. 8 are only an example. One or both of the hot and cold media HM and LM may flow from the right to the left on the paper.

In one implementation, the hot medium HM (e.g., hot water) may be introduced into the flow path of each tubular thermoelectric generator T, and the cold medium LM (e.g., cooling water) may be introduced through the fluid inlet port 38a to fill the inside of the container 30 with the cold medium LM. Conversely, the cold medium LM (e.g., cooling water) may be introduced into the flow path of each tubular thermoelectric generator T, and the hot medium HM (e.g., hot water) may be introduced through the fluid inlet port 38a to fill the inside of the container 30 with the hot medium HM. In this manner, a temperature difference which is large enough to generate electric power can be created between the outer and inner peripheral surfaces 24 and 26 of each tubular thermoelectric generator T.

<Cushioning Member>

Figure 9:
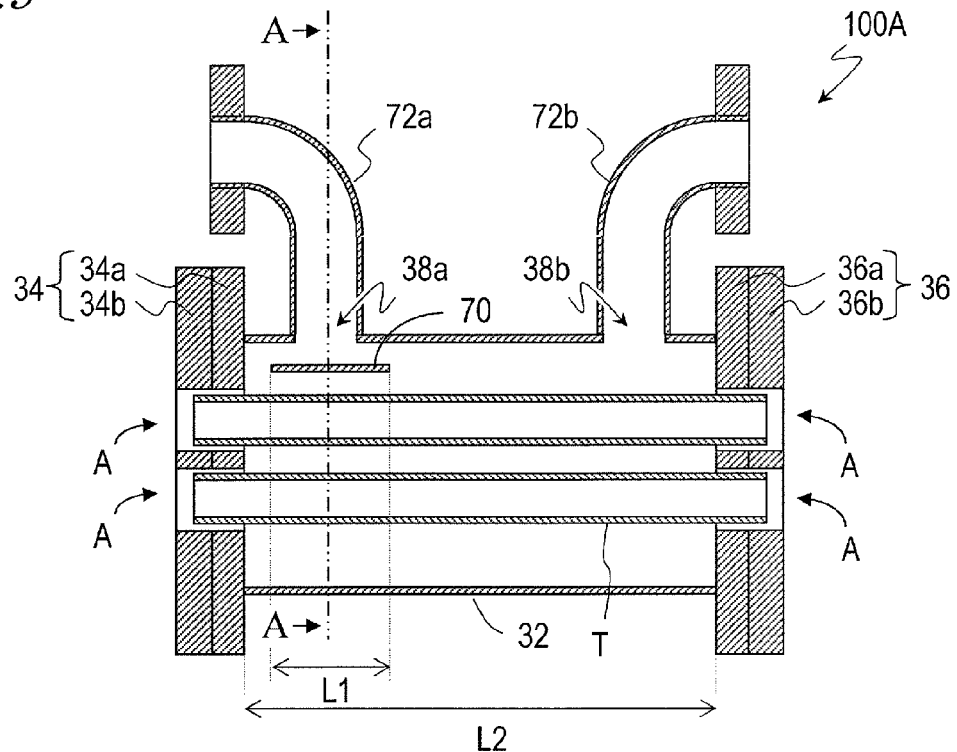
FIG. 9 is a schematic cross-sectional view of the thermoelectric generator unit 100A shown in FIGS. 7 and 8.

FIG. 9 schematically illustrates a cross section of the thermoelectric generator unit 100A shown in FIGS. 7 and 8. The cross section schematically shown in FIG. 9 is viewed on a plane which includes the center axis of the shell 32 in a circular cylindrical shape, for example, and which intersects with the horizontal plane at right angles. As shown in FIG. 9, the baffle (cushioning member) 70 may be fixed on the inner wall of the container 30, for example, so as to be located between the fluid inlet port 38a and the tubular thermoelectric generators T. That is why when the container 30 is not filled with fluid yet, fluid flowing into the container through the fluid inlet port 38a collides against the baffle 70 first, and then goes toward the bottom of the container 30. In this manner, the fluid flowing in through the fluid inlet port 38a can be prevented from colliding against the tubular thermoelectric generators T directly.

As described above, the respective tubular thermoelectric generators T are supported in the container 30 by having their ends inserted into their associated pairs of openings A of the plates 34 and 36. That is to say, in the example illustrated in FIGS. 7 to 9, each tubular thermoelectric generator T is supported only at their ends. That is why if fluid collided directly against such a tubular thermoelectric generator T in a state where the container 30 is still not filled with the fluid yet, mechanical stress would be applied to its tube body Tb, thus possibly causing a fracture to the tube body Tb or a wear on its outer peripheral surface. Such inconveniences could easily be caused easily in a tubular thermoelectric generator T arranged close to the fluid inlet port 38a, in particular. It should be noted that if the container 30 is almost filled with a fluid, the fluid in the container cushions the tubular thermoelectric generators T. For that reason, when the thermoelectric generator unit 100A is operating continuously, there are slim chances of getting the tubular thermoelectric generator T damaged by fluid being introduced into the container 30.

In this embodiment, the baffle 70 changes the flow direction of a fluid that has flowed into the container 30, thereby reducing the impact on the tubular thermoelectric generators T. The baffle 70 just needs to reduce the momentum of the fluid flowing in through the fluid inlet port 38a.

Figure 10:
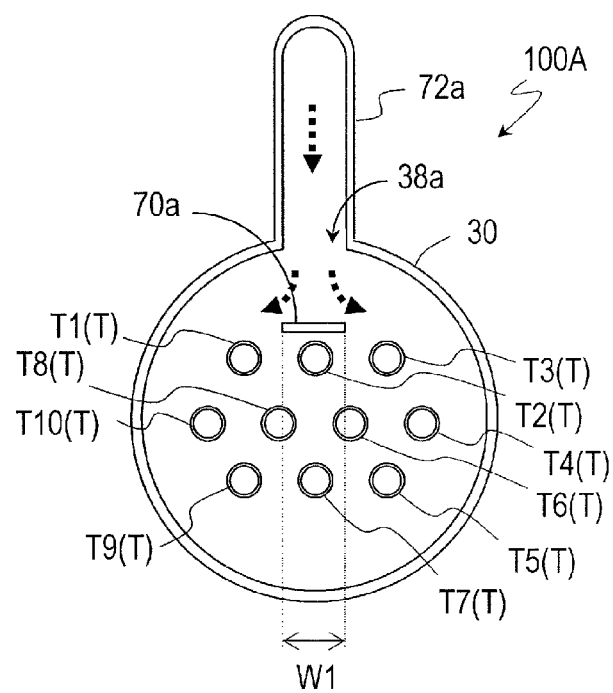
FIG. 10 is a schematic cross-sectional view illustrating the shell 32 of the container 30 and the first conduit 72a as viewed on a plane which intersects with the axial direction of the tubular thermoelectric generators T at right angles.

FIG. 10 schematically illustrates a cross section of the shell 32 of the container 30 and the first conduit 72a as viewed on a plane which intersects with the axial direction of the tubular thermoelectric generators T at right angles.

That is to say, the cross section shown in FIG. 10 corresponds to the plane A-A shown in FIG. 9. In FIG. 10, the flow directions of the fluid are schematically indicated by the dashed arrows. In the rest of the description, the flow directions of a fluid will also be indicated by such dashed arrows unless otherwise stated.

In the example shown in FIG. 10, a flat-plate baffle 70a is arranged between the fluid inlet port 38a and the tubular thermoelectric generator T2 located right under the fluid inlet port 38a. This baffle 70a is arranged so as to cover the tubular thermoelectric generator T2 at least partially in the container 30. In the example illustrated in FIG. 10, the fluid flows through the first conduit 72a vertically downward on the paper and enters the container 30 through the fluid inlet 38a. The fluid that has flowed into the container 30 collides against, and has its flow direction changed by, the baffle 70a. That is to say, the fluid that has collided against the baffle 70a flows along the surface of the baffle 70a except its part that has been splashed. For example, part of the fluid that has flowed into the container 30 has its flow direction changed from a direction parallel to the vertical direction into the lateral direction (horizontal direction) on the paper. As a result, the fluid that has flowed into the container 30 can be prevented from colliding directly against the tubular thermoelectric generator T located right under the fluid inlet port 38a.

In the present specification, on a cross section which intersects with the axial direction of the tubular thermoelectric generators T at right angles, the direction that intersects at right angles with the direction in which the fluid flows through the fluid inlet port 38a will be hereinafter referred to as a "width direction". In the following description, the length measured in the width direction will be sometimes hereinafter simply referred to as a "width". The width of the baffle 70a (i.e., the length indicated by the arrow W1 in FIG. 10) is typically greater than the outside diameter of the tubular thermoelectric generator T. That is why in the example illustrated in FIG. 10, the baffle 70a prevents the fluid that has flowed into the container 30 from colliding directly against the tubular thermoelectric generator T (e.g., the tubular thermoelectric generator T2 in this example) located right under the baffle 70a.

The baffle 70a has a predetermined length as measured in the axial direction of the tubular thermoelectric generator T. The length of the baffle 70a as measured in the axial direction of the tubular thermoelectric generator T (i.e., the length indicated by the arrow L1 in FIG. 9) may be set to be equal to the length of the shell 32 as measured in the axial direction of the tubular thermoelectric generator T (i.e., the length indicated by the arrow L2 in FIG. 9). Part of the fluid that has flowed into the container 30 collides against the baffle 70a, runs along the surface of the baffle 70a in the axial direction of the tubular thermoelectric generator T, and then falls off the end of the baffle 70a in the axial direction of the tubular thermoelectric generator T. By setting the length L1 to be substantially equal to the length L2, the fluid that has collided against the baffle 70a and then fallen off the end of the baffle 70a in the axial direction of the tubular thermoelectric generator T from colliding against the tubular thermoelectric generator T located right under the baffle 70a (e.g., the tubular thermoelectric generator T2 in this example). As can be seen, in one implementation, the baffle 70 is arranged to cover at least one tubular thermoelectric generator T in the container 30.

Figure 11:
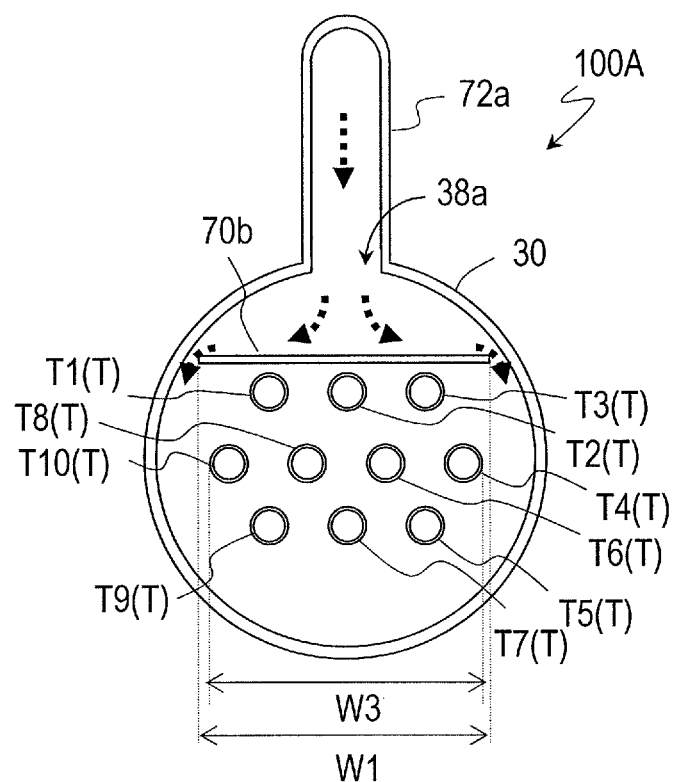
FIG. 11 is a schematic cross-sectional view illustrating another example of the baffle 70.

FIG. 11 is a schematic cross-sectional view illustrating another example of the baffle 70. As shown in FIG. 11, the baffle 70 may have such a shape as to shield a plurality of tubular thermoelectric generators T from the fluid that has flowed into the container 30 through the fluid inlet port 38a. It should be noted that in the present specification, the tubular thermoelectric generators T can also be regarded as being "shielded" even if the length of the baffle as measured in the axial direction of the tubular thermoelectric generators T (i.e., the length indicated by the arrow L1 in FIG. 9) is shorter than the length of the shell 32 as measured in the axial direction of the tubular thermoelectric generators T (i.e., the length indicated by the arrow L2 in FIG. 9).

In the example shown in FIG. 11, a set of three tubular thermoelectric generators T1, T2 and T3, a set of four tubular thermoelectric generators T10, T8, T6 and T4, and another set of three tubular thermoelectric generators T9, T7 and T5 are arranged vertically on the paper so as to be spatially separated from each other. And in each of these three sets, the respective tubular thermoelectric generators T are also spaced apart from each other. In the example shown in FIG. 11, the width of the baffle 70b is greater than the maximum length in the width direction of the region where the tubular thermoelectric generators T are arranged (i.e., the length indicated by the arrow W3 in FIG. 11). In that case, on a cross section that intersects with the axial direction of the tubular thermoelectric generators T at right angles, there are no tubular thermoelectric generators T at all on the extension of the fluid's flow direction at the end of the baffle 70b. Thus, the fluid that has collided against the baffle 70b can be prevented from flowing toward the tubular thermoelectric generators T. Consequently, it is possible to avoid a situation where a fluid that has collided against the baffle 70b and has had its flow direction changed collides against, and does damage on, the tubular thermoelectric generators T.

Figure 12:
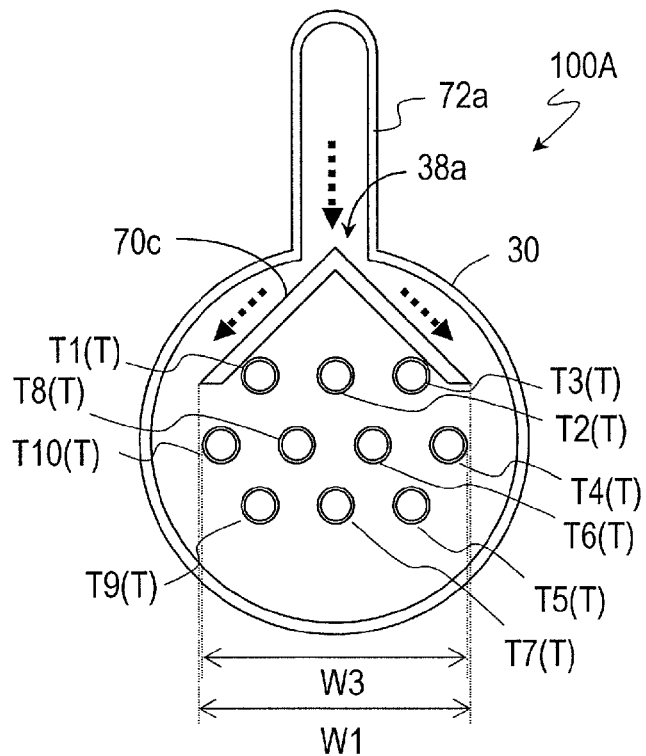
FIG. 12 is a schematic cross-sectional view illustrating still another example of the baffle 70.
Figure 13:
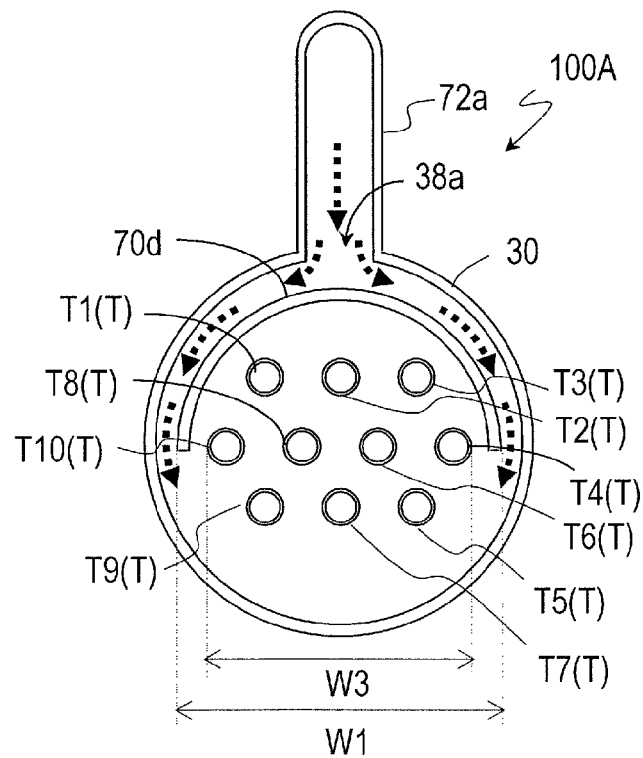
FIG. 13 is a schematic cross-sectional view illustrating yet another example of the baffle 70.

FIGS. 12 and 13 are schematic cross-sectional views illustrating two other exemplary baffles 70. Specifically, the baffle 70c shown in FIG. 12 is folded at the middle and that middle portion projects toward the fluid inlet port 38a. On the other hand, the baffle 70d shown in FIG. 13 has a semi-circular cylindrical shape and its middle portion also projects toward the fluid inlet port 38a. That is to say, when viewed on a plane that intersects with the axial direction of the tubular thermoelectric generators T at right angles, cross sections of these two baffles 70c and 70d both project toward the fluid inlet port 38a. These baffles 70c and 70d have such a shape as shielding the tubular thermoelectric generators T from the fluid that has flowed into the container 30 through the fluid inlet port 38a. That is to say, in the examples illustrated in FIGS. 12 and 13, the inequality W1>W3 is satisfied.

As shown in FIGS. 12 and 13, the baffle 70 may have such a shape as projecting toward the fluid inlet port 38a. By forming the baffle 70 in such a shape as projecting toward the fluid inlet port 38a, the fluid that has flowed into the container 30 through the fluid inlet port 38a can be scattered even more effectively. In addition, the mechanical stress on the baffle 70 itself can also be lightened.

In the examples shown in FIGS. 12 and 13, each of the baffles 70c and 70d has its other end, opposite from the fluid inlet port 38a, opened. However, this is only an example. Alternatively, when viewed on a plane which intersects with the axial direction of the tubular thermoelectric generators T at right angles, cross sections of these baffles 70c and 70d may also have such a shape as surrounding the tubular thermoelectric generators T. In that case, as long as the inequality L1<L2 is satisfied (see FIG. 9), the container 30 can still be filled with the fluid that has been introduced through the fluid inlet port 38a.

Figure 14:
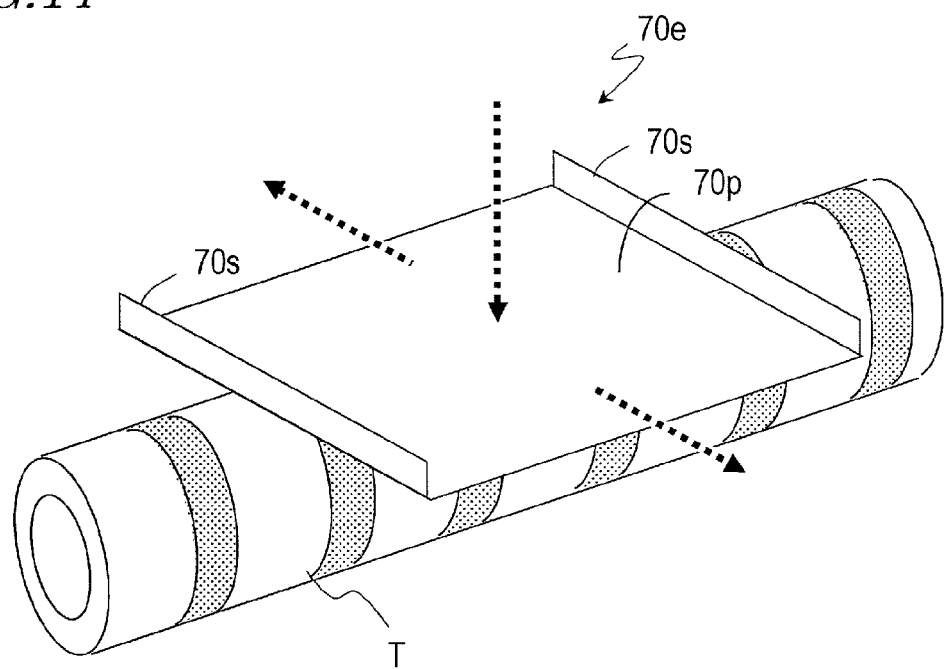
FIG. 14 is a perspective view illustrating yet another example of the baffle 70.
Figure 15:
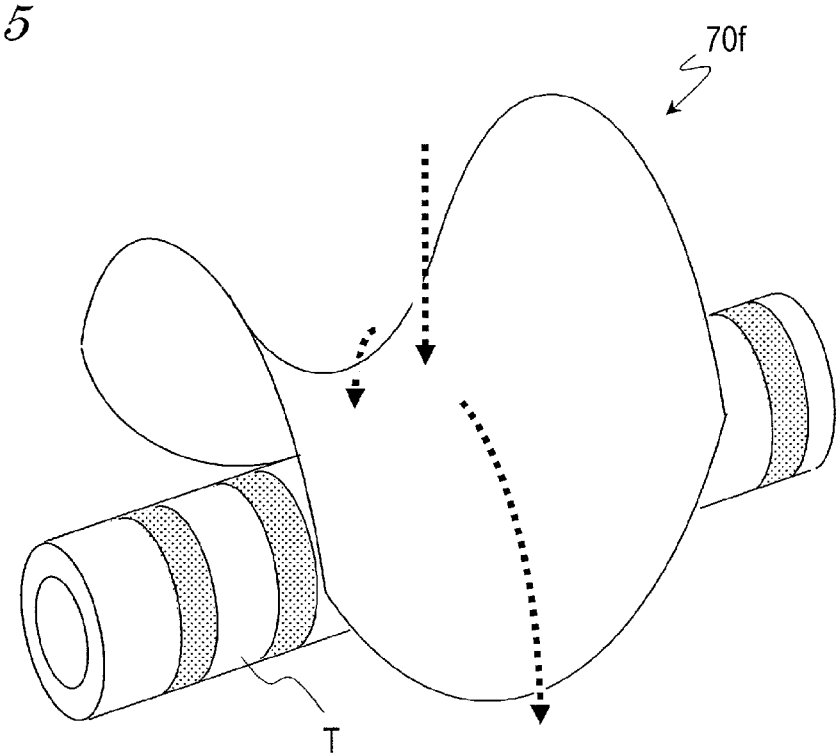
FIG. 15 is a perspective view illustrating yet another example of the baffle 70.

FIGS. 14 and 15 are perspective views illustrating two other exemplary baffles 70. In FIGS. 14 and 15, only one tubular thermoelectric generator T is illustrated under the baffle 70 to avoid complexity. However, this is just an example, and a plurality of tubular thermoelectric generators T may naturally be arranged under the baffle 70.

The baffle 70e shown in FIG. 14 includes a rectangular flat plate portion 70p and two wall portions 70s standing upright from the flat plate portion 70p. Among the four outer edges of the flat plate portion 70p, two outer edges are parallel to the axial direction of the tubular thermoelectric generator T and the other two outer edges cross the axial direction of the tubular thermoelectric generator T at right angles. The two wall portions 70s are extended perpendicularly upward from those two outer edges of the flat plate portion 70p that cross the axial direction of the tubular thermoelectric generator T at right angles. The wall portions 70s change the flow direction of the fluid that has collided against the baffle 70e into a direction that intersects with the axial direction of the tubular thermoelectric generator T at right angles. Consequently, the fluid that has collided against the baffle 70e can be prevented from falling off in the axial direction of the tubular thermoelectric generator T.

The baffle 70f shown in FIG. 15 has a saddle shape and is arranged so that its cross section as viewed on a plane that intersects with the axial direction of the tubular thermoelectric generator T at right angles projects toward the fluid inlet port 38a. In this case, the fluid that has collided against the baffle 70f can also be prevented from falling off in the axial direction of the tubular thermoelectric generator T.

As can be seen from the foregoing description, the shape and size of the baffle 70 may be determined arbitrarily. The baffle 70 may have the shape of a plate, a bar, a circular cone, a cup, a drain board, or a mesh, for example. The baffle 70 may be partially bent and may have a semi-circular cylindrical shape or a propeller shape. Optionally, the baffle 70 may have a movable portion. The surface of the baffle 70 that faces the fluid inlet port 38a does not have to be a flat surface but may have a groove portion or a fin. Still alternatively, the baffle 70 may be a porous member. The baffle 70 may have throughholes. It should be noted that as long as a predetermined mechanical strength is ensured, the material for the baffle 70 may also be selected arbitrarily.

<Another Embodiment of Thermoelectric Generator Unit>

Figure 16:
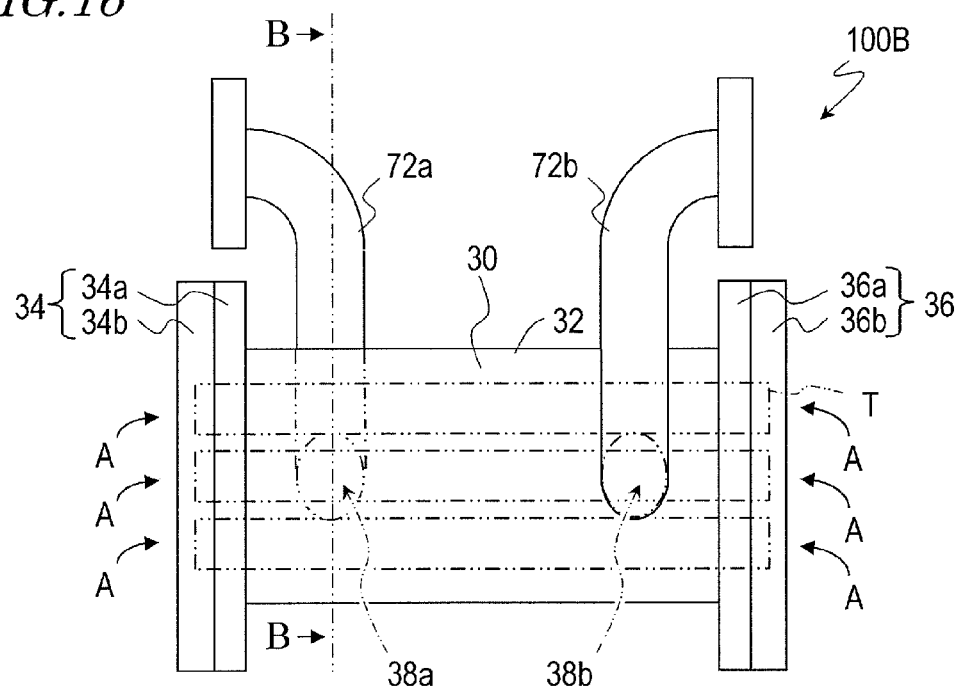
FIG. 16 is a front view illustrating an exemplary thermoelectric generator unit according to another embodiment of the present disclosure.

Next, look at FIG. 16, which is a front view illustrating an exemplary thermoelectric generator unit according to another embodiment of the present disclosure. Just like the thermoelectric generator unit 100A described above, a thermoelectric generator unit 100B according to this implementation also includes a plurality of tubular thermoelectric generators T and a container 30 to house those tubular thermoelectric generators T inside. In the following description, some features of this thermoelectric generator unit 100B that are common in terms of configuration or operation with those of the thermoelectric generator unit 100A will not be described all over again to avoid redundancies.

Figure 17:
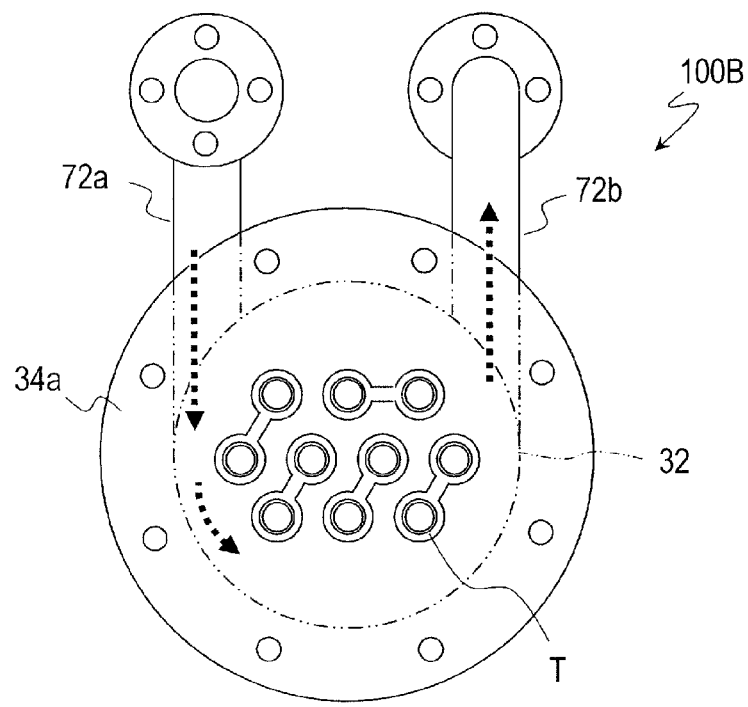
FIG. 17 is a left side view of the thermoelectric generator unit 100B shown in FIG. 16.

FIG. 17 is a left side view of the thermoelectric generator unit 100B shown in FIG. 16. In FIG. 17, illustration of the second plate portion 34b of the plate 34 is omitted. In the example shown in FIGS. 16 and 17, the fluid inlet port 38a is arranged at the rear of the thermoelectric generator unit 100B and is connected to a first conduit 72a. On the other hand, the fluid outlet port 38b is arranged at the front of the thermoelectric generator unit 100B and is connected to a second conduit 72b. However, this is only an example, and the fluid inlet and outlet ports 38a and 38b may also be arranged over the container 30 as in the thermoelectric generator unit 100A.

In this thermoelectric generator unit 100B, the first conduit 72a is arranged so that the fluid that has flowed in through the fluid inlet port 38a runs toward the inner wall of the shell 32, not toward the tubular thermoelectric generators T. In this example, the first conduit 72a is arranged so that the extension of the center axis of the first conduit 72a passes between the tubular thermoelectric generators T and the inner wall of the shell 32. As a result, the percentage of the fluid that collides directly against the tubular thermoelectric generators T after having flowed into the container 30 through the fluid inlet port 38a can be reduced. Consequently, it is possible to avoid a situation where the fluid that has collided directly against the tubular thermoelectric generators T does damage on the tubular thermoelectric generators T. As shown in FIG. 17, the second conduit 72b may also be arranged so that the extension of the center axis of the second conduit 72b passes between the tubular thermoelectric generators T and the inner wall of the shell 32.

The configuration of this thermoelectric generator unit 100B will be described in further detail with reference to FIG. 18, which schematically illustrates a cross section of the shell 32 of the container 30 and the first conduit 72a as viewed on a plane which intersects with the axial direction of the tubular thermoelectric generators T at right angles. The cross section shown in FIG. 18 corresponds to the plane B-B shown in FIG. 16.

Figure 18:
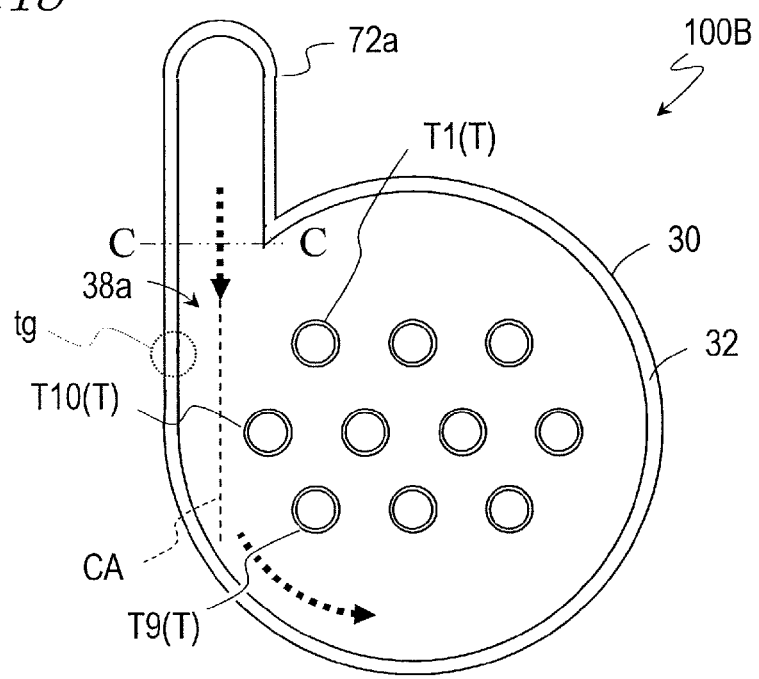
FIG. 18 is a schematic cross-sectional view illustrating a cross section of the shell 32 of the container 30 and the first conduit 72a as viewed on a plane which intersects with the axial direction of the tubular thermoelectric generators T at right angles.

In the exemplary configuration shown in FIG. 18, the first conduit 72a is arranged so that the extension of the center axis of the first conduit 72a (as indicated by the dotted line CA in FIG. 18) passes between the tubular thermoelectric generators T and the inner wall of the shell 32. That is to say, in the example shown in FIG. 18, the extension of the center axis of the first conduit 72a passes on the left-hand side of the outer peripheral surface of the leftmost one T10 of the tubular thermoelectric generators T housed in the container 30. In this case, the center axis of the first conduit 72a means the center axis of the first conduit 72a as defined across the fluid inlet port 38a. That is to say, this extension is parallel to a normal to a plane closest to the fluid inlet port 38a (e.g., the plane C-C shown in FIG. 18) among multiple cross sections of the first conduit 72a as viewed on a plane that intersects with the center axis of the first conduit 72a at right angles so that the profiles of the inner wall of the first conduit 72a are closed loops. The flow direction of the fluid that has flowed into the container 30 through the fluid inlet port 38a may be substantially parallel to the extension of the center axis of the first conduit 72a as defined across the fluid inlet port 38a. Consequently, almost all of the fluid that has flowed into the container 30 through the fluid inlet port 38a collides against the inner wall of the shell 32 first in the container 30.

In the exemplary configuration shown in FIG. 18, the first conduit 72a is connected to the fluid inlet port 38a so that the respective inner walls of the first conduit 72a and the circular cylindrical shell 32 are smoothly connected together at their connecting portions tg. As a result, the fluid that has flowed into the container 30 through the fluid inlet port 38a can run along the inner wall of the shell 32, and the percentage of the fluid that collides against the tubular thermoelectric generators T after having flowed into the container 30 and then been splashed from the inner wall of the shell 32 can be reduced.

Figure 19:
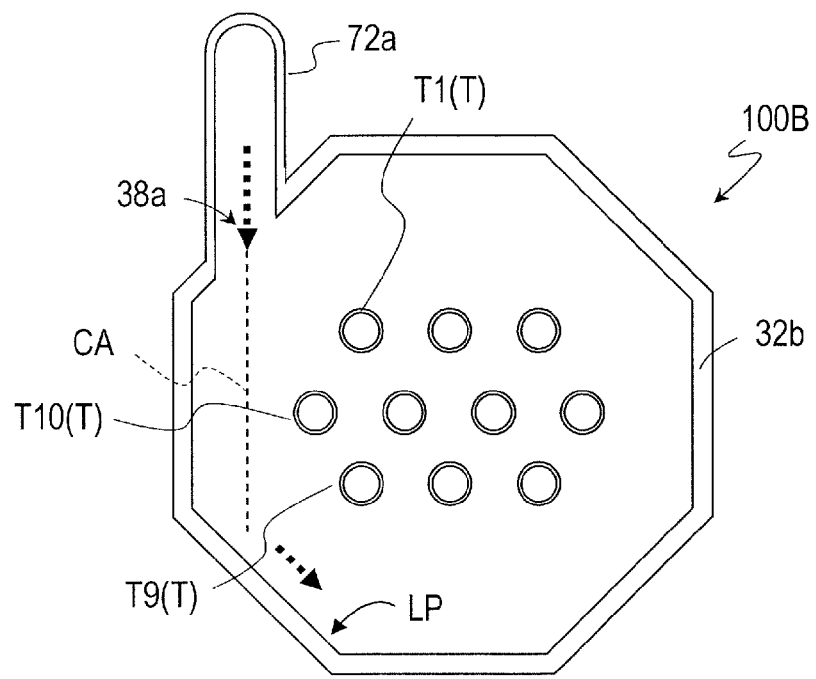

It should be noted that the respective inner walls of the first conduit 72a and the circular cylindrical shell 32 do not always have to be connected smoothly together. FIG. 19 illustrates another exemplary connection pattern of the first conduit 72a to the fluid inlet port 38a. In the exemplary configuration shown in FIG. 19, when viewed on a plane which intersects with the axial direction of the tubular thermoelectric generators T at right angles, the shell 32b has a polygonal cross section. In the example shown in FIG. 19, the first conduit 72a is also arranged so that the extension CA of the center axis of the first conduit 72a passes between the tubular thermoelectric generators T and the inner wall of the shell 32b. In the example shown in FIG. 19, the fluid that has flowed into the container 30 through the fluid inlet port 38a collides first against a tilted surface located below the tubular thermoelectric generators T among multiple inner wall surfaces of the shell 32b. Most of the fluid that has collided against the tilted surface LP flows along the tilted surface LP.

Figure 20:
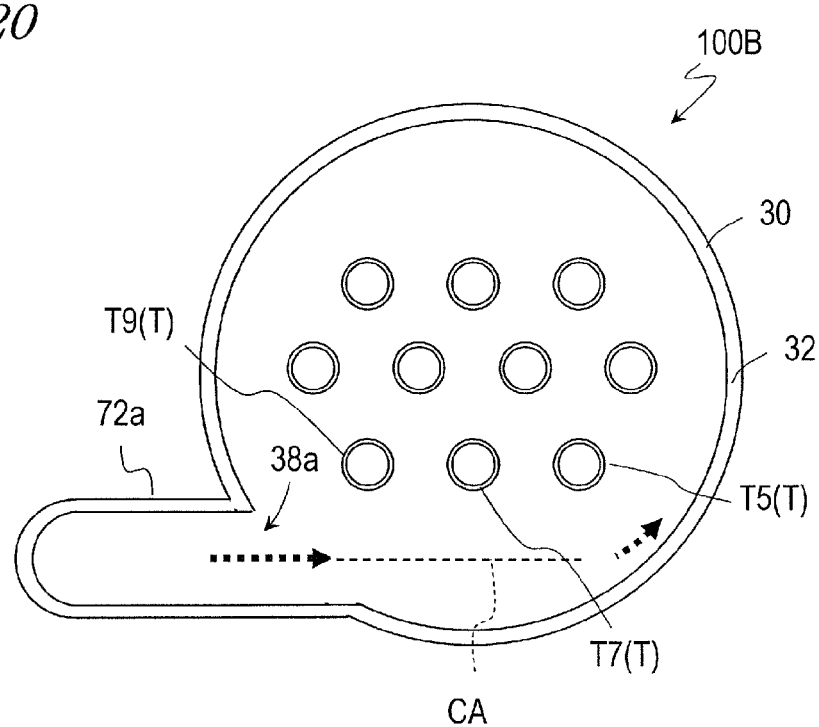

FIG. 20 illustrates still another exemplary connection pattern of the first conduit 72a to the fluid inlet port 38a. In the example shown in FIG. 20, the first conduit 72a is also arranged so that the extension CA of the center axis of the first conduit 72a passes between the tubular thermoelectric generators T and the inner wall of the shell 32. In the example shown in FIG. 20, the extension CA of the center axis of the first conduit 72a passes under the respective outer peripheral surfaces of the lowermost ones T9, T7 and T5 of the tubular thermoelectric generators T housed in the container 30. Such a connection pattern may also be adopted depending on the flow speed of the fluid flowing into the container 30 through the fluid inlet port 38a.

It should be noted that unless a sufficient space can be left between the tubular thermoelectric generators T and the inner wall of the shell 32, a baffle 70 such as any of the ones described above may also be arranged between the fluid inlet port 38a and the tubular thermoelectric generators T.

<Still Another Embodiment of Thermoelectric Generator Unit>

Figure 21:
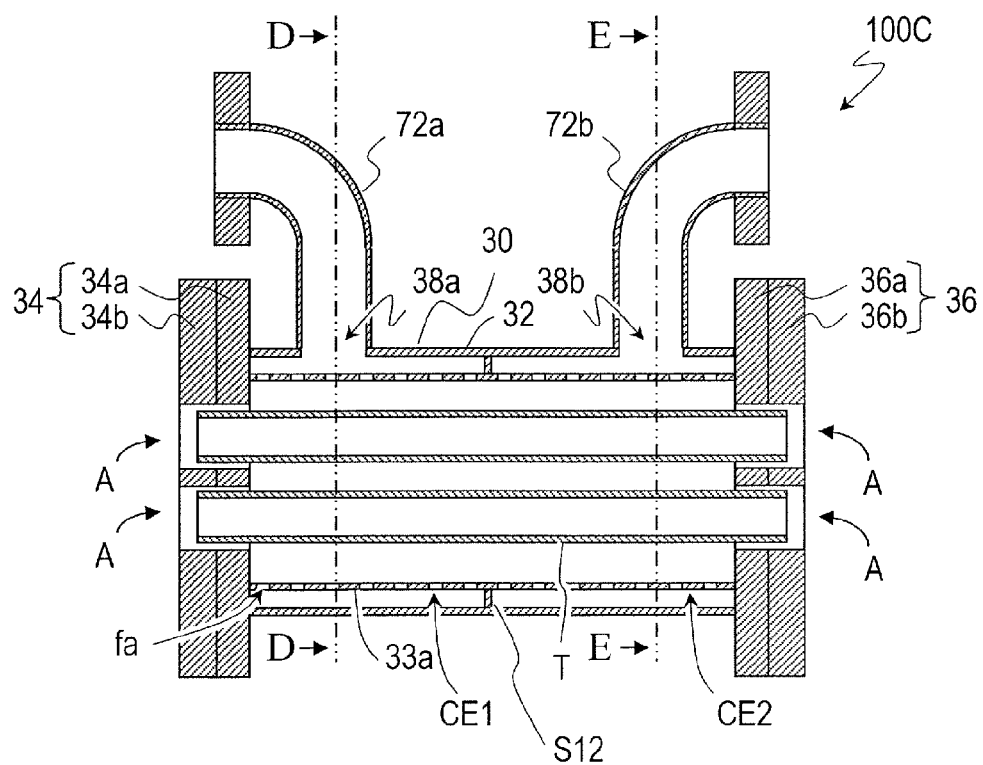
FIG. 21 is a schematic cross-sectional view illustrating an exemplary thermoelectric generator unit according to still another embodiment of the present disclosure.

Next, look at FIG. 21, which is a schematic cross-sectional view illustrating an exemplary thermoelectric generator unit according to still another embodiment of the present disclosure. The cross section schematically shown in FIG. 21 is viewed on a plane which includes the center axis of the shell 32 in a circular cylindrical shape, for example, and which intersects with the horizontal plane at right angles. Just like the thermoelectric generator units 100A and 100B described above, a thermoelectric generator unit 100C according to this implementation also includes a plurality of tubular thermoelectric generators T and a container 30 to house those tubular thermoelectric generators T inside. In the following description, some features of this thermoelectric generator unit 100C that are common in terms of configuration or operation with those of the thermoelectric generator unit 100A or 100B will not be described all over again to avoid redundancies.

In the exemplary configuration shown in FIG. 21, the container 30 has an internal confining wall 33a, which is arranged between the tubular thermoelectric generators T and the shell 32 surrounding the tubular thermoelectric generators T inside the container 30. In the example shown in FIG. 21, the internal confining wall 33a is arranged to surround the tubular thermoelectric generators T. That is to say, the space inside of the container 30 is divided by the internal confining wall 33a into two inner spaces, one of which is the space inside of the internal confining wall 33a and the other of which is the space defined between the internal confining wall 33a and the inner wall of the shell 32.

As shown in FIG. 21, the fluid inlet port 38a communicates with the space defined between the internal confining wall 33a and the inner wall of the shell 32. In this embodiment, the fluid that has flowed into the container 30 through the fluid inlet port 38a collides first against the internal confining wall 33a. Thus, the fluid that has flowed in through the fluid inlet port 38a can be prevented from colliding directly against the tubular thermoelectric generators T. Consequently, it is possible to avoid a situation where the fluid that has collided directly against the tubular thermoelectric generators T does damage on the tubular thermoelectric generators T.

In the example shown in FIG. 21, the internal confining wall 33a has a plurality of throughholes fa. Thus, the fluid that has flowed into the container 30 through the fluid inlet port 38a enters the space inside of the internal confining wall 33a through those throughholes fa. That is to say, the fluid inlet port 38a is arranged so that the fluid enters the space inside of the internal confining wall 33a through those throughholes fa. As a result, the mechanical stress imposed on the tubular thermoelectric generators T when the fluid is introduced into the container 30 can be lightened. The size, number and arrangement of those throughholes fa may be determined appropriately according to the flow rate of the fluid introduced into the container 30 through the fluid inlet port 38a.

In the exemplary configuration shown in FIG. 21, the container 30 has a partition S12, which divides the space between the shell 32 and the internal confining wall 33a into first and second spaces CE1 and CE2. In the example shown in FIG. 21, the first space CE1 is the space surrounded with the first plate portion 34a of the plate 34, the internal confining wall 33a, the inner wall of the shell 32 and the partition S12. On the other hand, the second space CE2 is the space surrounded with the first plate portion 36a of the plate 36, the internal confining wall 33a, the inner wall of the shell 32 and the partition S12.

Figure 22:
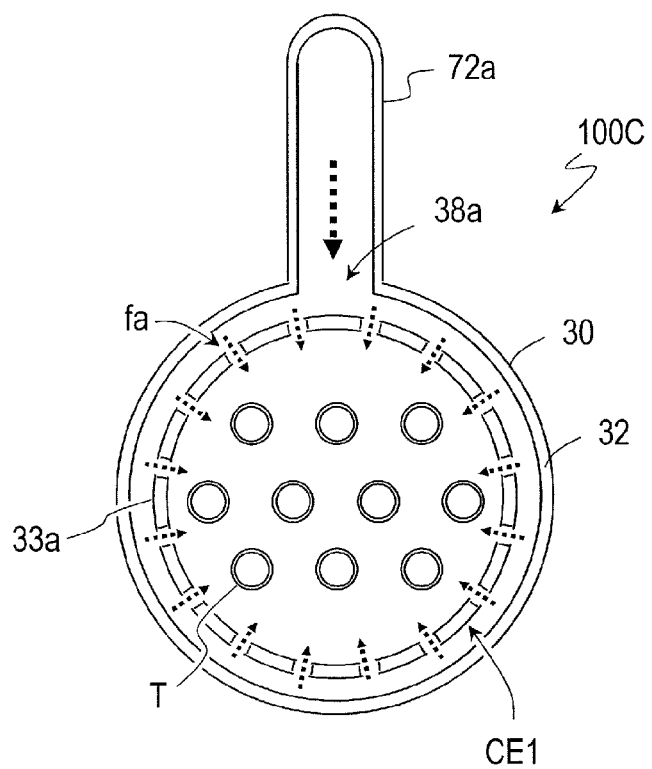
FIG. 22 is a schematic cross-sectional view illustrating a cross section of the shell 32 of the container 30 and the first conduit 72a as viewed on a plane which intersects with the axial direction of the tubular thermoelectric generators T at right angles.
Figure 23:
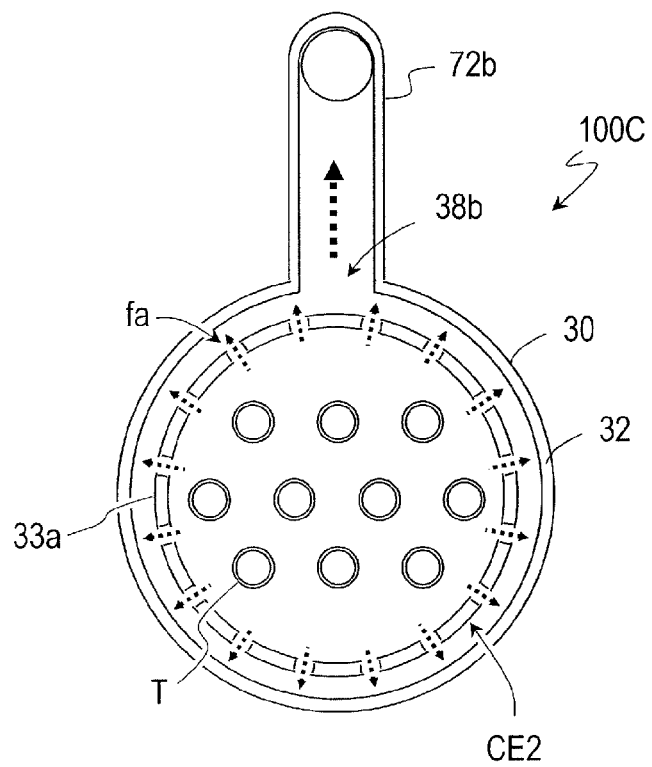
FIG. 23 is a schematic cross-sectional view illustrating a cross section of the shell 32 of the container 30 and the second conduit 72b as viewed on a plane which intersects with the axial direction of the tubular thermoelectric generators T at right angles.

FIG. 22 schematically illustrates a cross section of the shell 32 of the container 30 and the first conduit 72a as viewed on a plane which intersects with the axial direction of the tubular thermoelectric generators T at right angles. On the other hand, FIG. 23 schematically illustrates a cross section of the shell 32 of the container 30 and the second conduit 72b as viewed on a plane which intersects with the axial direction of the tubular thermoelectric generators T at right angles. The cross sections shown in FIGS. 22 and 23 respectively correspond to the planes D-D and E-E shown in FIG. 21.

When the thermoelectric generator unit 100C is operating, the two spaces separated by the internal confining wall 33a are both filled with the fluid introduced through the fluid inlet port 38a. As shown in FIGS. 22 and 23, the fluid inlet port 38a and fluid outlet port 38b communicate with the first and second spaces CE1 and CE2, respectively. Thus, the fluid that has flowed into the container 30 through the fluid inlet port 38a enters the first space CE1 and then flows into the space inside of the internal confining wall 33a through the throughholes fa. As a result, the fluid (such as a cold medium) that has flowed into the container 30 through the fluid inlet port 38a can be brought into contact with the outer peripheral surface of the tubular thermoelectric generators T. The fluid that has flowed into the space inside of the internal confining wall 33a flows out of the space inside of the internal confining wall 33a into the second space CE2 through the throughholes fa and then is discharged out of this thermoelectric generator unit 100C through the fluid outlet port 38b.

Figure 24:
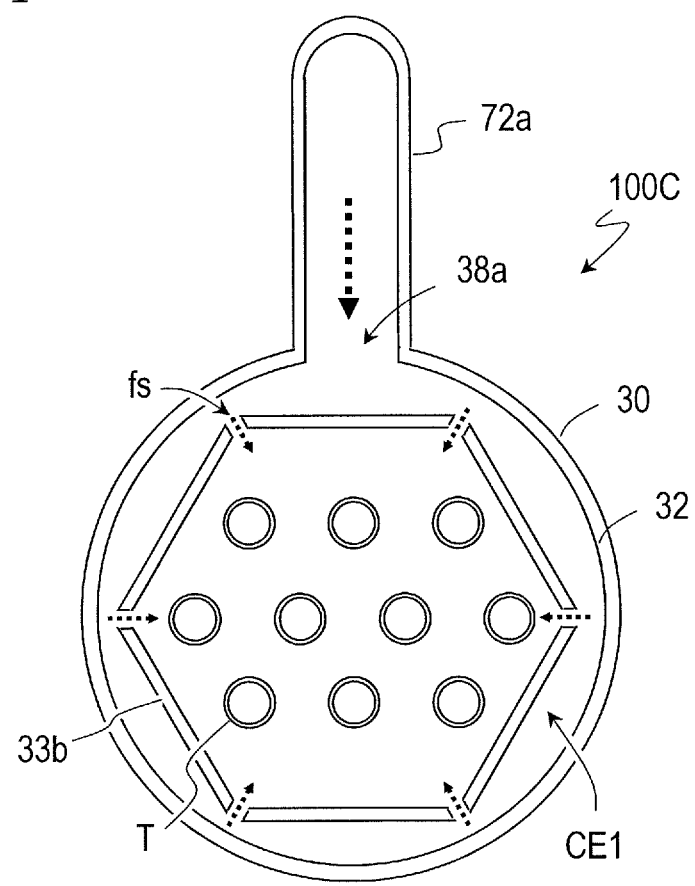
FIG. 24 is a schematic cross-sectional view illustrating a modified example of the internal confining wall.

FIG. 24 illustrates a modified example of the internal confining wall. The cross section shown in FIG. 24 corresponds to the plane D-D shown in FIG. 21. In the exemplary configuration shown in FIG. 24, the internal confining wall 33b has a hexagonal cross section. As can be seen, a cross section of the internal confining wall as viewed on a plane which intersects with the axis of the tubular thermoelectric generators T at right angles does not have to be a circular shape but may also be an elliptical or polygonal shape as well. For example, a number of (e.g., six) flat-plate members may be arranged inside of the container 30 and this set of flat plate members may be used as the internal confining wall 33b. In this case, a gap may be left between adjacent ones of those members. Then, slits fs are formed at the corners of the internal confining wall 33b. The fluid that has flowed into the container 30 through the fluid inlet port 38a enters the first space CE1 and then flows into the space inside of the internal confining wall 33b through the slits fs. As can be seen, the internal confining wall may have one or more slits instead of the throughholes. Optionally, each of those flat plate members may have throughholes, too.

<Implementation of Sealing from Fluids and Electrical Connection Between Tubular Thermoelectric Generators>

Figure 25:
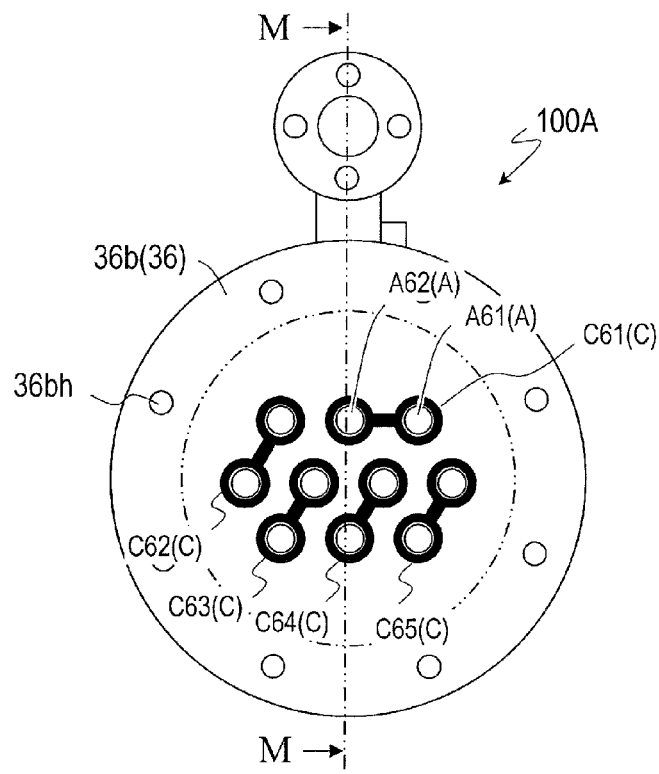
FIG. 25 illustrates one of the side faces of the thermoelectric generator unit 100A shown in FIG. 7 (a right side view in this case).

FIG. 25 illustrates one of the side surfaces of the thermoelectric generator unit 100A shown in FIG. 7 (a right side view in this case). The same implementation of sealing from fluids and electrical connection between the tubular thermoelectric generators T is applicable to all of the thermoelectric generator units 100A, 100B and 100C described above. Thus, the implementation of sealing from fluids and electrical connection between the tubular thermoelectric generators T will be described only with respect to the thermoelectric generator unit 100A to avoid redundancies.

As shown in FIG. 25, ten openings A have been cut through the plate 36. Likewise, ten openings A have also been cut through the other plate 34. In the example illustrated in FIG. 7, each opening A of the plate 34 and its associated opening A of the plate 36 are arranged mirror-symmetrically to each other, and ten lines which connect together the respective center points of ten pairs of associated openings A are parallel to each other. According to such a configuration, the respective tubular thermoelectric generators T may be supported parallel to each other through the pairs of associated openings A.

As shown in FIG. 25, the plate 36 has channels C, each of which has been formed to connect together at least two of the openings A cut through the plate 36 and will be sometimes hereinafter referred to as "interconnections". In the example illustrated in FIG. 25, the channel C61 connects together openings A61 and A62. Each of the other channels C62 to C65 also connects together two associated ones of the openings A in the plate 36. As will be described later, an electrically conductive member is housed in each of these channels C61 to C65.

Figure 26:
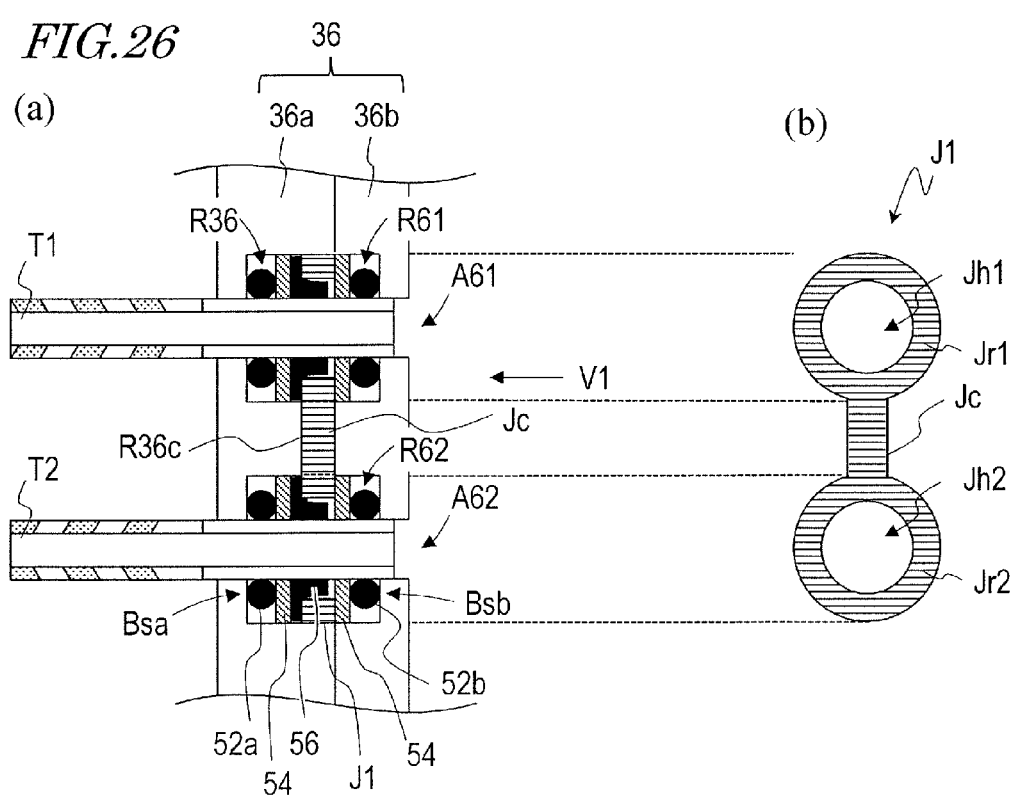
FIG. 26 schematically illustrates a cross section of a portion of a plate 36 and the appearance of an electrically conductive member J1.

Portion (a) of FIG. 26 schematically illustrates a partial cross-sectional view of the plate 36. Specifically, portion (a) of FIG. 26 schematically illustrates a cross section of the plate 36 as viewed on a plane including the respective center axes of both of two tubular thermoelectric generators T1 and T2. More specifically, portion (a) of FIG. 26 illustrates the structure of openings A61 and A62 of multiple openings A that the plate 36 has and a region surrounding them. Portion (b) of FIG. 26 schematically illustrates the appearance of an electrically conductive member J1 as viewed in the direction indicated by the arrow V1 in portion (a) of FIG. 26. This electrically conductive member J1 has two through holes Jh1 and Jh2. In detail, this electrically conductive member J1 includes a first ring portion Jr1 with the through hole Jh1, a second ring portion Jr2 with the through hole Jh2, and a connecting portion Jc to connect these two ring portions Jr1 and Jr2 together.

As shown in portion (a) of FIG. 26, one end of the tubular thermoelectric generator T1 (on the second electrode side) is inserted into the opening A61 of the plate 36 and one end of the tubular thermoelectric generator T2 (on the first electrode side) is inserted into the opening A62. In this state, those ends of the tubular thermoelectric generators T1 and T2 are respectively inserted into the through holes Jh1 and Jh2 of the electrically conductive member J1. That end of the tubular thermoelectric generator T1 (on the second electrode side) and that of the tubular thermoelectric generator T2 (on the first electrode side) are electrically connected together via this electrically conductive member J1. In the present specification, an electrically conductive member to connect two tubular thermoelectric generators electrically together will be hereinafter referred to as a "connection plate".

It should be noted that the first and second ring portions Jr1 and Jr2 do not have to have an annular shape. As long as electrical connection is established between the tubular thermoelectric generators, the through hole Jh1 or Jh2 may also have a circular, elliptical or polygonal shape as well. For example, the shape of the through hole Jh1 or Jh2 may be different from the cross-sectional shape of the first or second electrode E1 or E2 as viewed on a plane that intersects with the axial direction at right angles. In the present specification, the "ring" shape includes not only an annular shape but other shapes as well.

In the example illustrated in portion (a) of FIG. 26, the first plate portion 36a has a recess R36 which has been cut for the openings A61 and A62. This recess R36 includes a groove portion R36c to connect the openings A61 and A62 together. The connecting portion Jc of the electrically conductive member J1 is located in this groove portion R36c. On the other hand, recesses R61 and R62 have been cut in the second plate portion 36b for the openings A61 and A62, respectively. In this example, various members to establish sealing and electrical connection are arranged inside the space formed by these recesses R36, R61 and R62. That space forms a channel C61 to house the electrically conductive member J1 and the openings A61 and A62 are connected together via the channel C61.

In the example illustrated in portion (a) of FIG. 26, not only the electrically conductive member J1 but also a first O-ring 52a, washers 54, an electrically conductive ring member 56 and a second O-ring 52b are housed in the channel C61. The respective ends of the tubular thermoelectric generators T1 and T2 go through the holes of these members. The first O-ring 52a arranged closest to the shell 32 of the container 30 is in contact with the seating surface Bsa that has been formed in the first plate portion 36a and establishes sealing so as to prevent a fluid that has been supplied into the shell 32 from entering the channel C61. On the other hand, the second O-ring 52b arranged most distant from the shell 32 of the container 30 is in contact with a seating surface Bsb that has been formed in the second plate portion 36b and establishes sealing so as to prevent a fluid located outside of the second plate portion 36b from entering the channel C61.

The O-rings 52a and 52b are annular seal members with an O (i.e., circular) cross section. The O-rings 52a and 52b may be made of rubber, metal or plastic, for example, and have the function of preventing a fluid from leaking out, or flowing into, through a gap between the members. In portion (a) of FIG. 26, there is a space which communicates with the flow paths of the respective tubular thermoelectric generators T on the right-hand side of the second plate portion 36b and there is a fluid (the hot or cold medium in this example) in that space. According to this embodiment, by using the members shown in FIG. 26, electrical connection between the tubular thermoelectric generators T and sealing from the fluids (the hot and cold media) are established. The structure and function of the electrically conductive ring member 56 will be described in detail later.

The same members as the ones described for the plate 36 are provided for the plate 34, too. Although the respective openings A of the plates 34 and 36 are arranged mirror symmetrically, the groove portions connecting any two openings A together on the plate 34 are not arranged mirror symmetrically with the groove portions connecting any two openings A together on the plate 36. If the arrangement patterns of the electrically conductive members to electrically connect the tubular thermoelectric generators T together on the plates 34 and 36, were mirror symmetric to each other, then those tubular thermoelectric generators T could not be connected together in series.

If a plate (such as the plate 36) fixed onto the shell 32 includes first and second plate portions (36a and 36b), each of the multiple openings A cut through the first plate portion (36a) has a first seating surface (Bsa) associated therewith to receive the first O-ring 52a, and each of the multiple openings A cut through the second plate portion (36b) has a second seating surface (Bsb) to receive the second O-ring 52b. However, the plates 34 and 36 do not need to have the configuration shown in FIG. 26 and the plate 36 does not have to be divided into the first and second plate portions 36a and 36b, either. If the electrically conductive member J1 is pressed by another member instead of the second plate portion 36b, the respective first O-rings 52a press against the first seating surface (Bsa) to establish sealing, too.

In the example shown in portion (a) of FIG. 26, the electrically conductive ring member 56 is interposed between the tubular thermoelectric generator T1 and the electrically conductive member J1. Likewise, another electrically conductive ring member 56 is interposed between the tubular thermoelectric generator T2 and the electrically conductive member J1, too.

The electrically conductive member J1 is typically made of a metal. Examples of materials to make the electrically conductive member J1 include copper (oxygen-free copper), brass and aluminum. The material may be plated with nickel or tin for anticorrosion purposes. As long as electrical connection is established between the electrically conductive member J (e.g., J1 in this example) and the tubular thermoelectric generators T (e.g., T1 and T2 in this example) inserted into the two through holes of the electrically conductive member J (e.g., Jh1 and Jh2 in this example), the electrically conductive member J may be partially coated with an insulator. That is to say, the electrically conductive member J may include a body made of a metallic material and an insulating coating which covers the surface of the body at least partially. The insulating coating may be made of a resin such as TEFLON™, for example. If the body of the electrically conductive member J is made of aluminum, the surface may be partially coated with an oxide skin as an insulating coating.

Figure 27A:
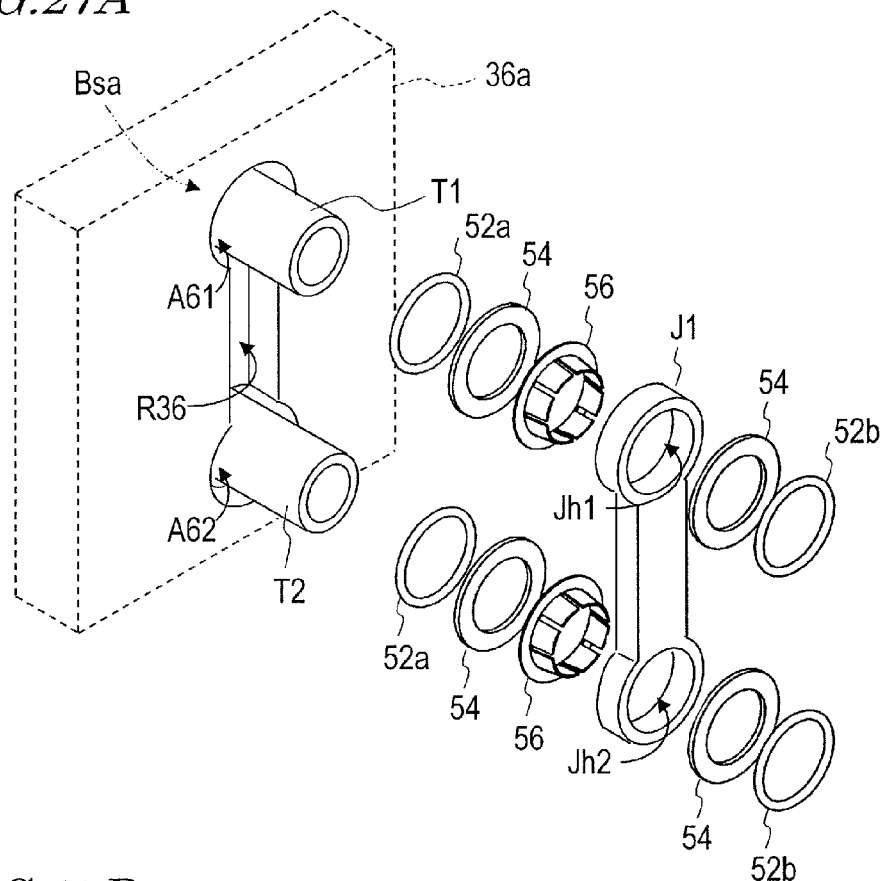
FIG. 27A is an exploded perspective view schematically illustrating the channel C61 to house the electrically conductive member J1 and its vicinity.

FIG. 27A is an exploded perspective view schematically illustrating the channel C61 to house the electrically conductive member J1 and its vicinity. As shown in FIG. 27A, the first O-rings 52a, electrically conductive ring members 56, electrically conductive member J1 and second O-rings 52b are inserted into the openings A61 and A62 from outside of the container 30. In this example, washers 54 are arranged between the first O-rings 52a and the electrically conductive ring members 56. Washers 54 may also be arranged between the electrically conductive member J1 and the second O-rings 52b. The washers 54 are inserted between the flat portions 56f of the electrically conductive ring members 56 to be described later and the O-rings 52a (or 52b).

Figure 27B:
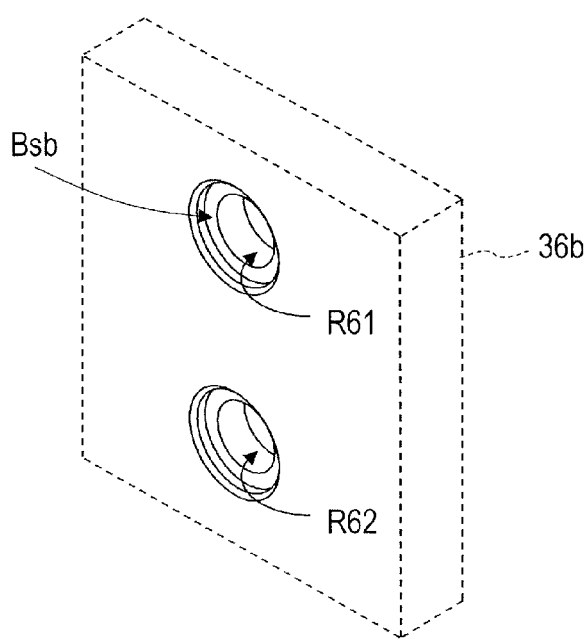
FIG. 27B is a perspective view schematically illustrating a portion of the sealing surface of the second plate portion 36b (i.e., the surface that faces the first plate portion 36a) associated with the openings A61 and A62.

FIG. 27B schematically illustrates a portion of the sealing surface of the second plate portion 36b (i.e., the surface that faces the first plate portion 36a) associated with the openings A61 and A62. As described above, the openings A61 and A62 of the second plate portion 36b each have a seating surface Bsb to receive the second O-ring 52b. That is why if the respective sealing surfaces of the first and second plate portions 36a and 36b are arranged to face each other and fastened together by flange connection, for example, the first O-rings 52a in the first plate portion 36a can be pressed against the seating surfaces Bsa. More specifically, the second seating surfaces Bsb press the first O-rings 52a against the seating surfaces Bsa through the second O-rings 52b, electrically conductive member J1 and electrically conductive ring members 56. In this manner, the electrically conductive member J1 can be sealed from the hot and cold media.

If the first and second plate portions 36a and 36b are made of an electrically conductive material such as a metal, then the sealing surfaces of the first and second plate portions 36a and 36b may be coated with an insulator material. Parts of the first and second plate portions 36a and 36b to contact with the electrically conductive member J during operation may be coated with an insulator so as to be electrically insulated from the electrically conductive member J. In one implementation, the sealing surfaces of the first and second plate portions 36a and 36b may be sprayed and coated with a fluoroethylene resin.

<Detailed Configuration for Electrically Conductive Ring Members>

A detailed configuration for the electrically conductive ring members 56 will be described with reference to FIGS. 28A and 28B.

Figure 28A:
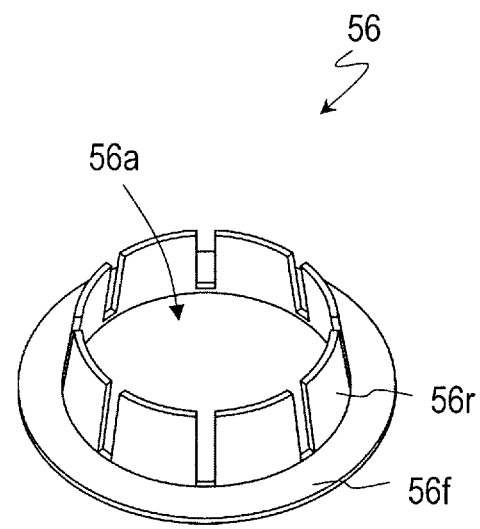
FIG. 28A is a perspective view illustrating an exemplary shape of the electrically conductive ring member 56.

FIG. 28A is a perspective view illustrating an exemplary shape of a single electrically conductive ring member 56. The electrically conductive ring member 56 shown in FIG. 28A includes a ringlike flat portion 56f and a plurality of elastic portions 56r. The flat portion 56f has a through hole 56a. Those elastic portions 56r project from around the periphery of the through hole 56a of the flat portion 56f and are biased toward the center of the through hole 56a with elastic force. Such an electrically conductive ring member 56 can be made easily by patterning a single metallic plate (with a thickness of 0.1 mm to a few mm, for example). Likewise, the electrically conductive members J can also be made easily by patterning a single metallic plate (with a thickness of 0.1 mm to a few mm, for example).

An end (on the first or second electrode side) of an associated tubular thermoelectric generator T is inserted into the through hole 56a of each electrically conductive ring member 56. That is why the shape and size of the through hole 56a of the ringlike flat portion 56f are designed so as to match the shape and size of the outer peripheral surface of that end (on the first or second electrode side) of the tubular thermoelectric generator T.

Figure 29A:
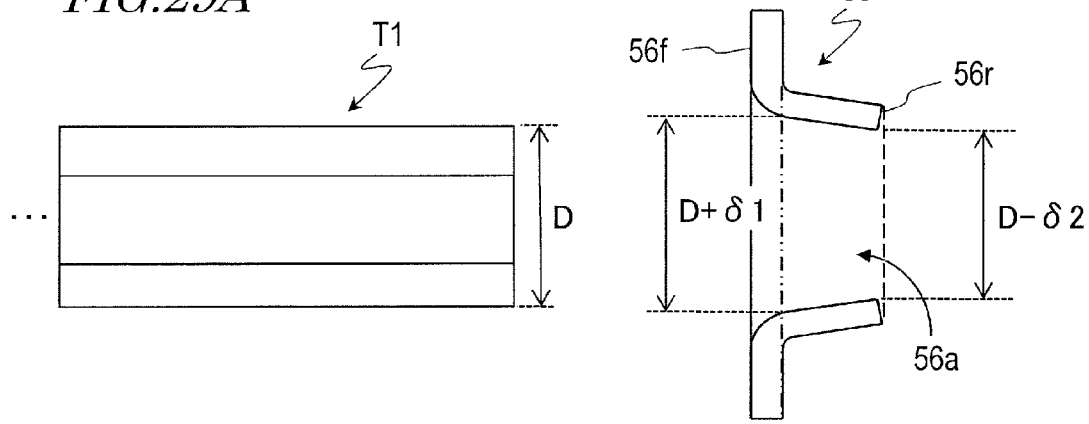
FIG. 29A is a cross-sectional view schematically illustrating the electrically conductive ring member 56 and tubular thermoelectric generator T1.
Figure 29B:
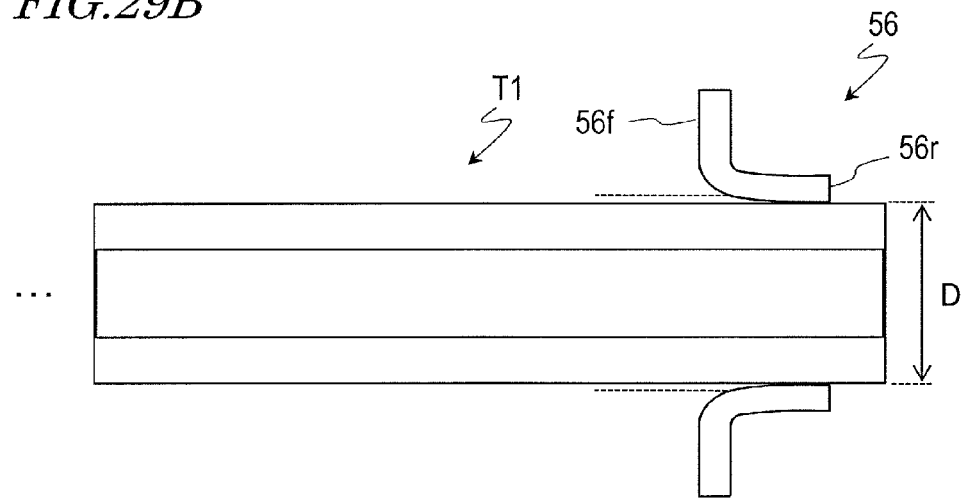
FIG. 29B is a cross-sectional view schematically illustrating a state where an end of the tubular thermoelectric generator T1 has been inserted into the electrically conductive ring member 56.
Figure 29C:
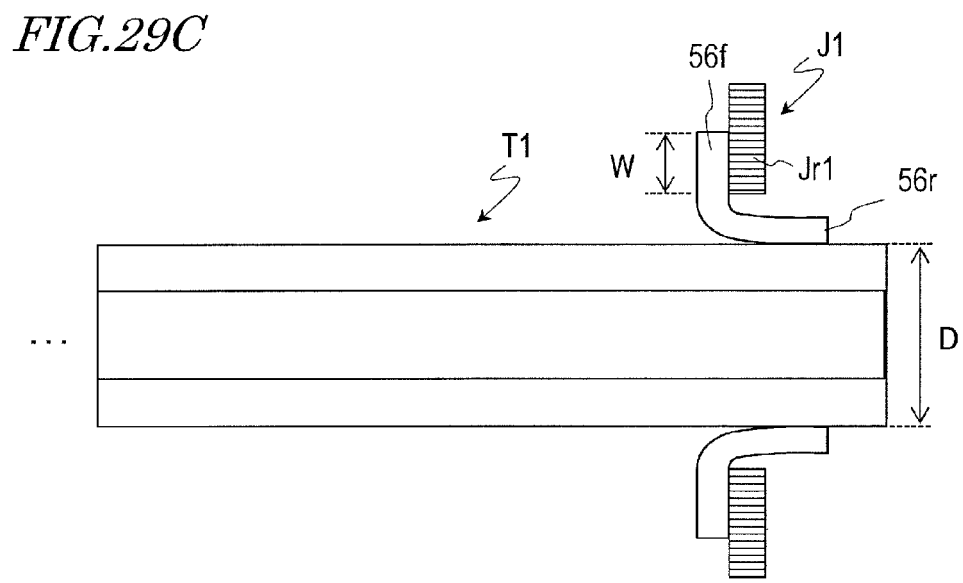
FIG. 29C is a cross-sectional view schematically illustrating a state where an end of the tubular thermoelectric generator T1 has been inserted into the electrically conductive ring member 56 and electrically conductive member J1.

Next, the shape of the electrically conductive ring member 56 will be described in further detail with reference to FIGS. 29A, 29B and 29C. FIG. 29A is a cross-sectional view schematically illustrating portions of the electrically conductive ring member 56 and tubular thermoelectric generator T1. FIG. 29B is a cross-sectional view schematically illustrating a state where an end of the tubular thermoelectric generator T1 has been inserted into the electrically conductive ring member 56. And FIG. 29C is a cross-sectional view schematically illustrating a state where an end of the tubular thermoelectric generator T1 has been inserted into the respective through holes of the electrically conductive ring member 56 and electrically conductive member J1. The cross sections illustrated in FIGS. 29A, 29B and 29C are viewed on a plane including the axis (i.e., the center axis) of the tubular thermoelectric generator T1.

Suppose the outer peripheral surface of the tubular thermoelectric generator T1 at that end (on the first or second electrode side) is a circular cylinder with a diameter D as shown in FIG. 29A. In that case, the through hole 56a of the electrically conductive ring member 56 is formed in a circular shape with a diameter D+δ1 (where δ1>1) so as to pass the end of the tubular thermoelectric generator T1. On the other hand, the respective elastic portions 56r have been formed so that biasing force is applied toward the center of the through hole 56a. The respective elastic portions 56r may be formed so as to be tilted toward the center of the through hole 56a as shown in FIG. 29A. That is to say, the elastic portions 56r have been shaped so as to be circumscribed with the outer peripheral surface of a circular cylinder, of which a cross section has a diameter that is smaller than D (and that is represented by D−δ2 (where δ2>0)) unless any external force is applied.

D+δ1>D>D−δ2 is satisfied. That is why when the end of the tubular thermoelectric generator T1 is inserted into the through hole 56a, the respective elastic portions 56r are brought into physical contact with the outer peripheral surface at the end of the tubular thermoelectric generator T1 as shown in FIG. 29B. In this case, since elastic force is applied to the respective elastic portions 56r toward the center of the through hole 56a, the respective elastic portions 56r press the outer peripheral surface at the end of the tubular thermoelectric generator T1 with the elastic force. In this manner, the outer peripheral surface of the tubular thermoelectric generator T1 inserted into the through hole 56a establishes stabilized physical and electrical contact with those elastic portions 56r.

Next, look at FIG. 29C. Inside the opening A cut through the plate 34, 36, the electrically conductive member J contacts with the flat portion 56f of the electrically conductive ring member 56. More specifically, when the end of the tubular thermoelectric generator T1 is inserted into the electrically conductive ring member 56 and electrically conductive member J1, the surface of the flat portion 56f of the electrically conductive ring member 56 contacts with the surface of the ring portion Jr1 of the electrically conductive member J1 as shown in FIG. 29C. As can be seen, the electrically conductive ring member 56 and the electrically conductive member J1 may be electrically connected together by bringing their planes into contact with each other. Since the electrically conductive ring member 56 and the electrically conductive member J1 contact with each other on their planes, a contact area which is large enough to make the electric current generated in the tubular thermoelectric generator T1 flow can be secured. The width W of the flat portion 56f is set appropriately to secure a contact area which is large enough to make the electric current generated in the tubular thermoelectric generator T1 flow. As long as a contact area can be secured between the electrically conductive ring member 56 and the electrically conductive member J1, either the surface of the flat portion 56f or the surface of the ring portion Jr1 of the electrically conductive member J1 may have some unevenness. For example, an even larger area of contact can be secured by making the surface of the ring portion Jr1 of the electrically conductive member J1 have an embossed pattern matching the one on the surface of the flat portion 56f.

Figure 30A:
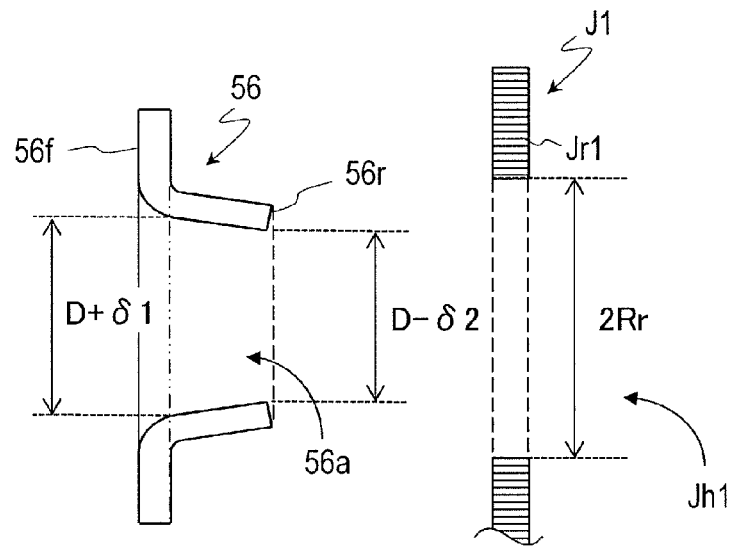
FIG. 30A is a cross-sectional view schematically illustrating the electrically conductive ring member 56 and a portion of the electrically conductive member J1.
Figure 30B:
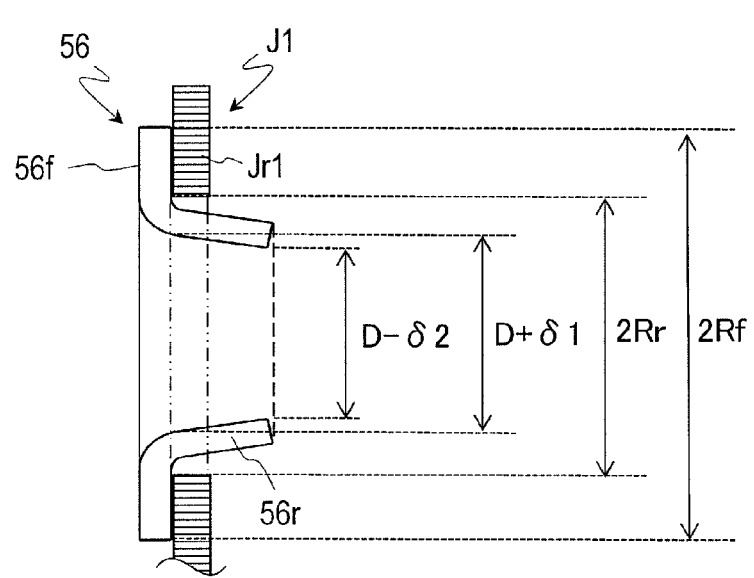
FIG. 30B is a cross-sectional view schematically illustrating a state where the elastic portions 56r of the electrically conductive ring member 56 have been inserted into the through hole Jh1 of the electrically conductive member J1.

Next, look at FIGS. 30A and 30B. FIG. 30A is a cross-sectional view schematically illustrating the electrically conductive ring member 56 and a portion of the electrically conductive member J1. FIG. 30B is a cross-sectional view schematically illustrating a state where the elastic portions 56r of the electrically conductive ring member 56 have been inserted into the through hole Jh1 of the electrically conductive member J1. The cross sections shown in FIGS. 30A and 30B are obtained by viewing the electrically conductive ring member 56 and the electrically conductive member J1 on a plane including the axis (center axis) of the tubular thermoelectric generator T1.

If the diameter of the through hole (e.g., Jh1 in this case) of the electrically conductive member J is supposed to be 2Rr, the through hole of the electrically conductive member J is formed to satisfy D<2Rr (i.e., so as to pass the end of the tubular thermoelectric generator T1 through itself). Also, if the diameter of the flat portion 56f of the electrically conductive ring member 56 is supposed to be 2Rf, the through hole of the electrically conductive member J is formed to satisfy 2Rr<2Rf so that the respective surfaces of the flat portion 56f and ring portion Jr1 contact with each other just as intended.

Figure 31:
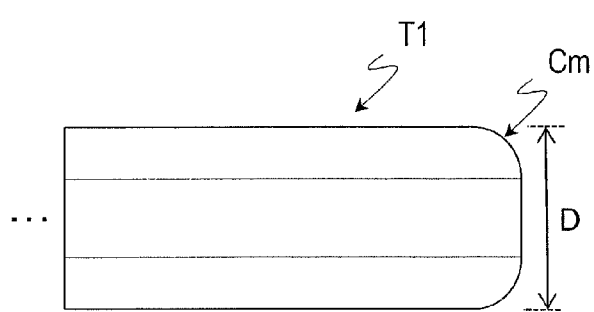
FIG. 31 is a cross-sectional view illustrating an exemplary tubular thermoelectric generator T with a chamfered portion Cm at its end.

Optionally, the end of the tubular thermoelectric generator T may have a chamfered portion Cm as shown in FIG. 31. The reason is that when the end of the tubular thermoelectric generator T (e.g., tubular thermoelectric generator T1) is inserted into the through hole 56a of the electrically conductive ring member 56, the elastic portions 56r of the electrically conductive ring member 56 and the end of the tubular thermoelectric generator T contact with each other, thus possibly getting the end of the tubular thermoelectric generator T damaged. However, by providing such a chamfered portion Cm at the end of the tubular thermoelectric generator T, such damage that could be done on the end of the tubular thermoelectric generator T due to the contact between the elastic portions 56r and the end of the tubular thermoelectric generator T can be avoided. And by avoiding the occurrence of the damage on the end of the tubular thermoelectric generator T, the electrically conductive member J can be sealed more securely from the hot and cold media. In addition, electrical contact failure between the outer peripheral surface of the tubular thermoelectric generator T and the elastic portions 56r can also be reduced. The chamfered portion Cm may have the curved surface as shown in FIG. 31 or may also have a planar surface.

And the electrically conductive member J1 contacts with the flat portion 56f of the electrically conductive ring member 56 inside of the openings A of the plate. More specifically, the surface of the first ring portion Jr1 (or the second ring portion Jr2) of the electrically conductive member J1 and the surface of the flat portion 56f of the electrically conductive ring member 56 contact with each other. In this manner, the electrically conductive member J1 is electrically connected to the outer peripheral surface at the end of the tubular thermoelectric generator T via the electrically conductive ring member 56. According to the exemplary configuration described above, by fastening the first and second plate portions 36a and 36b together, the flat portion 56f of the electrically conductive ring member 56 and the electrically conductive member J can make electrical contact with each other with good stability and sealing described above can be established.

Next, it will be described how the electrically conductive ring member 56 may be fitted into the tubular thermoelectric generator T.

First of all, as shown in FIG. 27A, the respective ends of the tubular thermoelectric generators T1 and T2 are inserted into the openings A61 and A62 of the first plate portion 36a. After that, the first O-rings 52a (and the washers 54 if necessary) are fitted into the tubular thermoelectric generators through their tip ends and pushed deeper into the openings A61 and A62. Next, the electrically conductive ring members 56 are fitted into the tubular thermoelectric generators through their tip ends and pushed deeper into the openings A61 and A62. Subsequently, the electrically conductive member J1 (and the washers 54 and second O-rings 52b if necessary) is/are fitted into the tubular thermoelectric generators through their tip ends and pushed deeper into the openings A61 and A62. Finally, the sealing surface of the second plate portion 36b is arranged to face the first plate portion 36a and the first and second plate portions 36a and 36b are fastened together by flange connection, for example, so that the respective tip ends of the tubular thermoelectric generators are inserted into the openings of the second plate portion 36b. In this case, the first and second plate portions 36a and 36b may be fastened together with bolts and nuts through the holes 36bh cut through the second plate portion 36b (shown in FIG. 25) and the holes cut through the first plate portion 36a.

The electrically conductive ring member 56 is not connected permanently to, and is readily removable from, the tubular thermoelectric generator T. For example, when the tubular thermoelectric generator T is replaced with a new tubular thermoelectric generator T, to remove the electrically conductive ring member 56 from the tubular thermoelectric generator T, the operation of fitting the electrically conductive ring members 56 into the tubular thermoelectric generators T may be performed in reverse order. The electrically conductive ring member 56 may be used a number of times (i.e., is recyclable) or replaced with a new one.

The electrically conductive ring member 56 does not always have to have the exemplary shape shown in FIG. 28A. The ratio of the width of the flat portion 56f (as measured radially) to the radius of the through hole 56a may also be defined arbitrarily. The respective elastic portions 56r may have any of various shapes and the number of the elastic portions 56r to provide may be set arbitrarily, too.

Figure 28B:
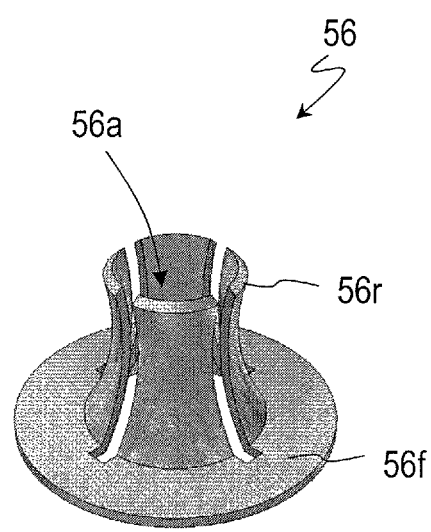
FIG. 28B is a perspective view illustrating another exemplary shape of the electrically conductive ring member 56.

FIG. 28B is a perspective view illustrating another exemplary shape of the electrically conductive ring member 56. The electrically conductive ring member 56 shown in FIG. 28B also has a ringlike flat portion 56f and a plurality of elastic portions 56r. The flat portion 56f has a through hole 56a. Each of the elastic portions 56r projects from around the through hole 56a of the flat portion 56f and is biased toward the center of the through hole 56a with elastic force. In this example, the number of the elastic portions 56r to provide is four. The number of the elastic portions 56r may be two but is suitably three or more. For example, six or more elastic portions 56r may be provided.

It should be noted that according to such an arrangement in which the flat-plate electrically conductive member J is brought into contact with the flat portion 56f of the electrically conductive ring member 56, some gap (or clearance) may be left between the through hole inside the ring portion of the electrically conductive member J and the tubular thermoelectric generator to be inserted into the hole. Thus, even if the tubular thermoelectric generator is made of a brittle material, the tubular thermoelectric generator can also be connected with good stability without allowing the ring portion Jr1 of the electrically conductive member J to do damage on the tubular thermoelectric generator.

<Electrical Connection Via Connection Plate>

As described above, the electrically conductive member (connection plate) is housed inside the channel C which has been cut to interconnect at least two of the openings A that have been cut through the plate 36. Note that the respective ends of the two tubular thermoelectric generators may be electrically connected together without the electrically conductive ring members 56. In other words, the electrically conductive ring members 56 may be omitted from the channel C. In that case, the respective ends of the two tubular thermoelectric generators may be electrically connected together via an electric cord, a conductor bar, or electrically conductive paste, for example. If the ends of the two tubular thermoelectric generators are electrically connected together via an electric cord, those ends of the tubular thermoelectric generators and the cord may be electrically connected together by soldering, crimping or crocodile-clipping, for example.

However, by electrically connecting the respective ends of the two tubular thermoelectric generators via the electrically conductive member J1 that is housed in the channel C as shown in FIGS. 26, 27A and 27B, the respective ends of the tubular thermoelectric generators T and the electrically conductive member J1 can be electrically connected together more stably. If the electrically conductive member J has a flat plate shape (e.g., if the connecting portion Jc has a broad width), the electrical resistance between the two tubular thermoelectric generators can be reduced compared to a situation where an electric cord is used. In addition, since no terminals are fixed onto the ends of the tubular thermoelectric generators T, the tubular thermoelectric generators T can be replaced easily. With the electrically conductive ring members 56, the respective ends of the two tubular thermoelectric generators can be not only fixed to each other but also electrically connected together.

In the thermoelectric generator unit 100A, the plate 34 or 36 has the channel C which has been cut to connect together at least two of the openings A, and therefore, electrical connecting function which has never been provided by any tube sheet for a heat exchanger is realized. In addition, since the thermoelectric generator unit 100A can be configured so that the first and second O-rings 52a and 52b press the seating surfaces Bsa and Bsb, respectively, sealing can be established so that either airtight or watertight condition is maintained with the ends of the tubular thermoelectric generators T inserted. As can be seen, by providing the channel C for the plate 34 or 36, even in an implementation in which the electrically conductive ring members 56 are omitted, the ends of the two tubular thermoelectric generators can also be electrically connected together and sealing from the fluids (e.g., the hot and cold media) can also be established.

<Relation Between Direction of Flow of Heat and Tilt Direction of Planes of Stacking>

Now, the relation between the direction of flow of heat in each thermoelectric generation tube T and the tilt direction of the planes of stacking in the thermoelectric generation tube T will be described with reference to FIGS. 32A and 32B.

Figure 32A:
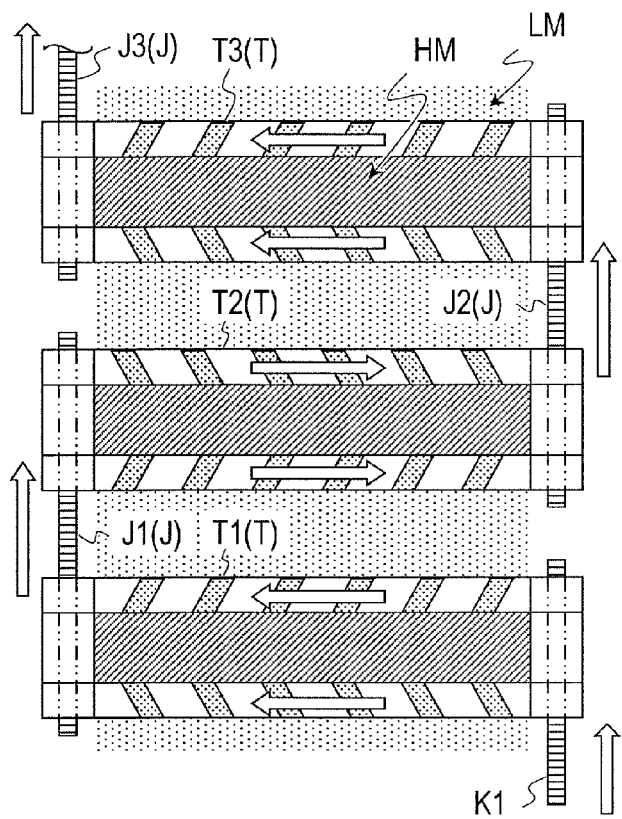
FIG. 32A schematically illustrates how electric current flows in tubular thermoelectric generators T which are electrically connected together in series.

FIG. 32A schematically illustrates how electric current flows in tubular thermoelectric generators T which are electrically connected together in series. FIG. 32A schematically illustrates cross sections of three (T1 to T3) of the tubular thermoelectric generators T1 to T10.

In FIG. 32A, an electrically conductive member (terminal plate) K1 is connected to one end of the tubular thermoelectric generator T1 (e.g., at the first electrode end), while an electrically conductive member (connection plate) J1 is connected to the other end (e.g., at the second electrode end) of the tubular thermoelectric generator T1. The electrically conductive member J1 is also connected to one end (i.e., at the first electrode end) of the tubular thermoelectric generator T2. As a result, the tubular thermoelectric generators T1 and T2 are electrically connected together. Furthermore, the other end (i.e., at the second electrode end) of the tubular thermoelectric generator T2 and one end (i.e., at the first electrode end) of the tubular thermoelectric generator T3 are electrically connected together via the electrically conductive member J2.

In this case, as shown in FIG. 32A, the tilt direction of the planes of stacking in the tubular thermoelectric generator T2 is opposite from the tilt direction of the planes of stacking in the tubular thermoelectric generator T1. Likewise, the tilt direction of the planes of stacking in the tubular thermoelectric generator T3 is opposite from the tilt direction of the planes of stacking in the tubular thermoelectric generator T2. That is to say, in this thermoelectric generator unit 100A, each of the tubular thermoelectric generator T1 to T10 has planes of stacking that is tilted in the opposite direction from those of an adjacent one of the tubular thermoelectric generators that is connected to itself via a connection plate.

Suppose the hot medium HM has been brought into contact with the inner peripheral surface of each of the tubular thermoelectric generators T1 to T3, and the cold medium LM has been brought into contact with their outer peripheral surface, as shown in FIG. 32A. In that case, in the tubular thermoelectric generator T1, electric current flows from the right to the left on the paper, for example. On the other hand, in the tubular thermoelectric generator T2, of which the planes of stacking are tilted in the opposite direction from those of the tubular thermoelectric generator T1, electric current flows from the left to the right on the paper.

Figure 33:
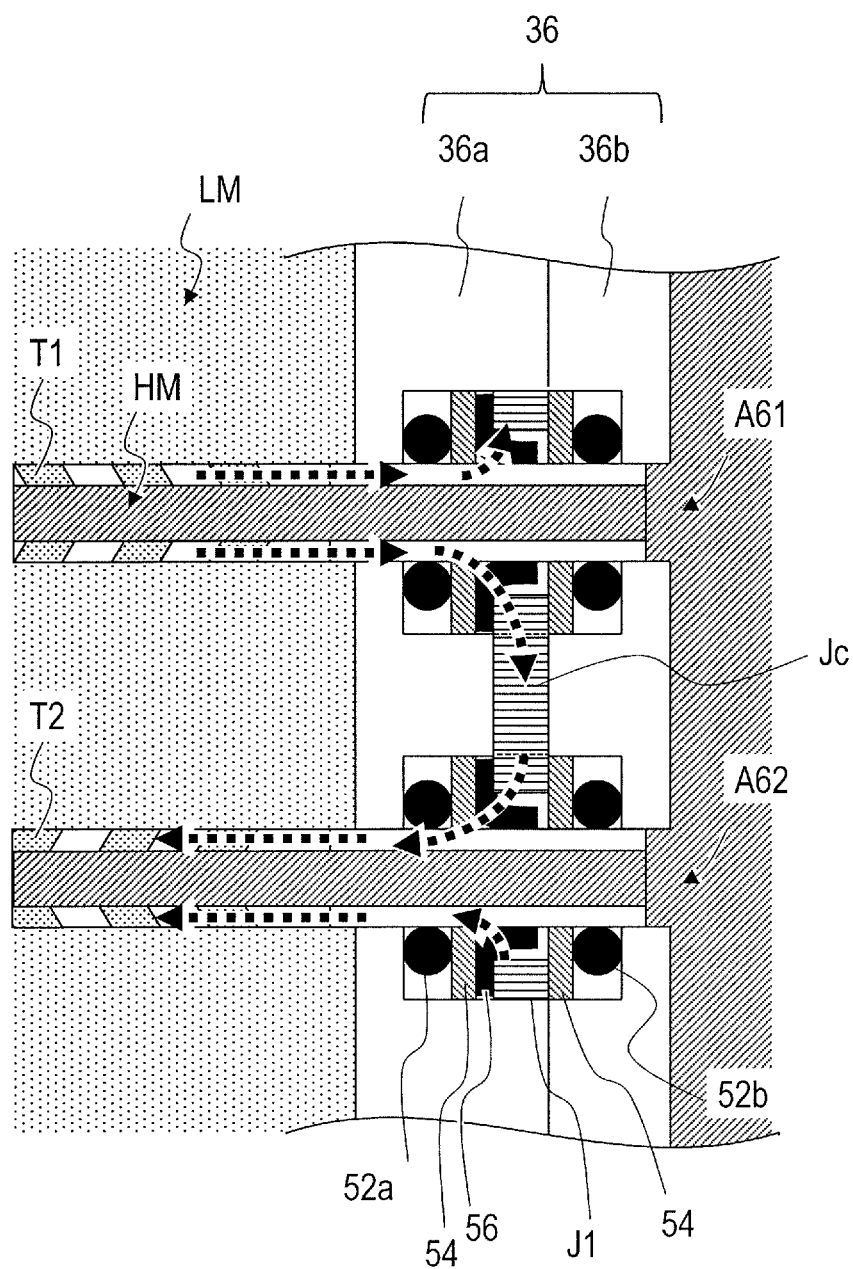
FIG. 33 schematically shows the directions in which electric current flows through the two openings A61 and A62 and their surrounding region.

FIG. 33 schematically shows the directions in which electric current flows through the two openings A61 and A62 and their surrounding region. FIG. 33 is a drawing corresponding to portion (a) of FIG. 26. In FIG. 33, the flow directions of the electric current are schematically indicated by the dotted arrows. As shown in FIG. 33, the electric current generated in the tubular thermoelectric generator T1 flows toward the tubular thermoelectric generator T2 through the electrically conductive ring member 56 of the opening A61, the electrically conductive member J1 and the electrically conductive ring member 56 of the opening A62 in this order. The electric current that has flowed into the tubular thermoelectric generator T2 is combined with electric current generated in the tubular thermoelectric generator T2, and the electric current thus combined flows toward the tubular thermoelectric generator T3. As shown in FIG. 32A, the planes of stacking of the tubular thermoelectric generator T3 are tilted in the opposite direction from those of the tubular thermoelectric generator T2. That is why in the tubular thermoelectric generator T3, the electric current flows from the right to the left in FIG. 32A. Consequently, the electromotive forces generated in the respective tubular thermoelectric generators T1 to T3 get superposed one upon the other without canceling each other. By sequentially connecting a plurality of tubular thermoelectric generators T together in this manner so that the tilt direction of their planes of stacking inverts alternately one generator after another, an even greater voltage can be extracted from the thermoelectric generator unit.

Figure 32B:
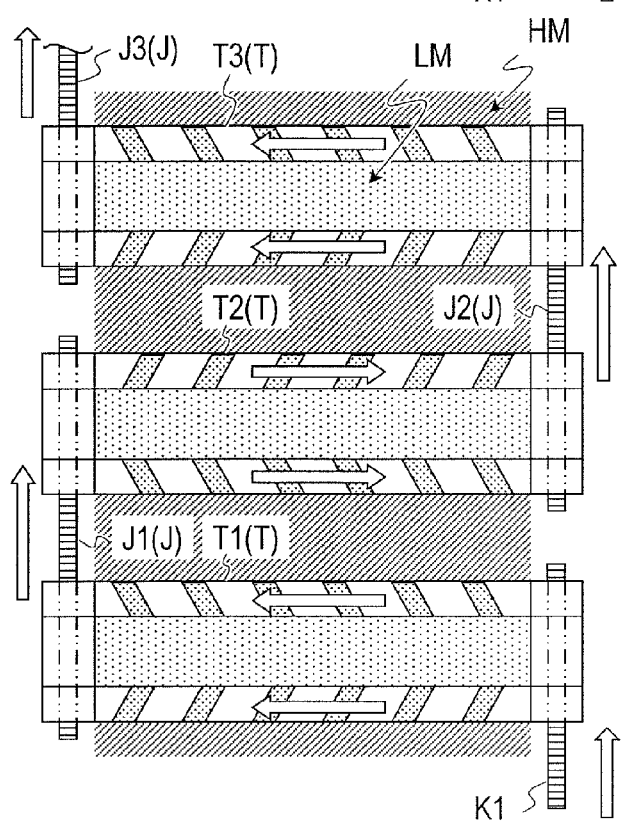
FIG. 32B schematically illustrates how electric current flows in tubular thermoelectric generators T which are electrically connected together in series.

Next, look at FIG. 32B, which also schematically shows, just like FIG. 32A, electric current flowing through tubular thermoelectric generators T which are electrically connected in series. As in the example shown in FIG. 32A, the tubular thermoelectric generators T1 to T3 are also sequentially connected in FIG. 32B so that the tilt direction of their planes of stacking inverts alternately one generator after another. In this case, since the planes of stacking in one of any two adjacent tubular thermoelectric generators connected together are tilted in the opposite direction from the planes of stacking in the other tubular thermoelectric generator, the electromotive forces generated in the respective tubular thermoelectric generators T1 to T3 get superposed one upon the other without canceling each other.

If the cold medium LM is brought into contact with the inner peripheral surface of each of the tubular thermoelectric generators T1 to T3 and the hot medium HM is brought into contact with their outer peripheral surface as shown in FIG. 32B, the polarity of voltage generated in each of the tubular thermoelectric generators T1 to T3 becomes opposite from the one shown in FIG. 32A. In other words, if the direction of the temperature gradient in each tubular thermoelectric generator is inverted, then the polarity of the electromotive force in that tubular thermoelectric generator (which may also be called the direction of electric current flowing through that tubular thermoelectric generator) inverts. Therefore, to make electric current flow from the electrically conductive member K1 toward the electrically conductive member J3 as in FIG. 32A, the configurations on the first and second electrode sides in each of the tubular thermoelectric generators T1 to T3 may be opposite from the configurations shown in FIG. 32A. It should be noted that electric current flow directions shown in FIGS. 32A and 32B are just examples. Depending on the material to make the metal layers 20 and the thermoelectric material to make the thermoelectric material layers 22, the electric current flow directions may be opposite from the ones shown in FIGS. 32A and 32B.

As already described with reference to FIGS. 32A and 32B, the polarity of the voltage generated in the tubular thermoelectric generator T depends on the tilt direction of the planes of stacking of that tubular thermoelectric generator T. That is why when the tubular thermoelectric generator T is going to be replaced, for example, the tubular thermoelectric generator T needs to be arranged appropriately with the temperature gradient between the inner and outer peripheral surfaces of the tubular thermoelectric generator T in the thermoelectric generator unit 100A taken into account.

Figure 34A:
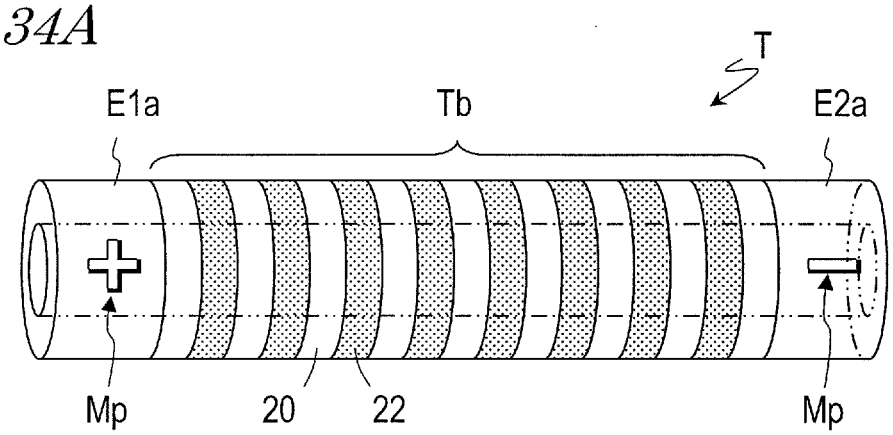
FIG. 34A is a perspective view illustrating an exemplary tubular thermoelectric generator, of which the electrodes have indicators of their polarity.
Figure 34B:
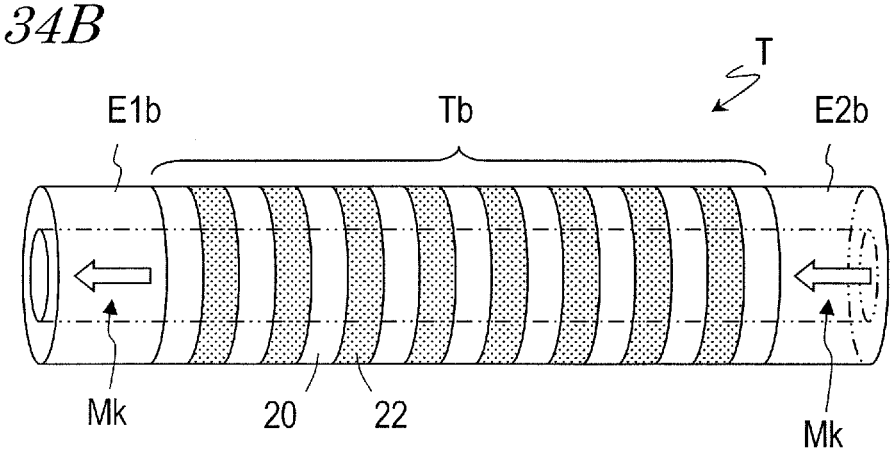
FIG. 34B is a perspective view illustrating another exemplary tubular thermoelectric generator, of which the electrodes have indicators of their polarity.

FIGS. 34A and 34B are perspective views each illustrating an exemplary tubular thermoelectric generator, of which the electrodes have indicators of their polarity. In the tubular thermoelectric generator T shown in FIG. 34A, molded portions (embossed marks) Mp indicating the polarity of the voltage generated in the tubular thermoelectric generator have been formed on the first and second electrodes E1a and E2a. On the other hand, in the tubular thermoelectric generator T shown in FIG. 34B, marks Mk indicating whether the planes of stacking in the tubular thermoelectric generator T are tilted toward the first electrode E1b or the second electrode E2b are left on the first and second electrodes E1b and E2b. These molded portions (e.g., convex or concave portions) and marks may be combined together. Optionally, these molded portions and marks may be added to the tube body Tb or to only one of the first and second electrodes.

In this manner, molded portions or marks indicating the polarity of the voltage generated in the tubular thermoelectric generator T may be added to the first and second electrodes, for example. In that case, it can be seen quickly just from the appearance of the tubular thermoelectric generator T whether the planes of stacking of the tubular thermoelectric generator T are tilted toward the first electrode or the second electrode. Optionally, instead of adding such molded portions or marks, the first and second electrodes may have mutually different shapes. For example, the lengths, thicknesses or cross-sectional shapes as viewed on a plane that intersects with the axial direction at right angles may be different from each other between the first and second electrodes.

<Electrical Connection Structure for Extracting Electric Power Out of Thermoelectric Generator Unit 100A>

Now look at FIG. 5 again. In the example illustrated in FIG. 5, ten tubular thermoelectric generators T1 to T10 are electrically connected in series via electrically conductive members J1 to J9. Each of these electrically conductive members J1 to J9 connects its associated two tubular thermoelectric generators T together just as described above. An exemplary electrical connection structure for extracting electric power out of the thermoelectric generator unit 100A from the two tubular generators T1 and T10 located at both ends of the series circuit will now be described.

Figure 35:
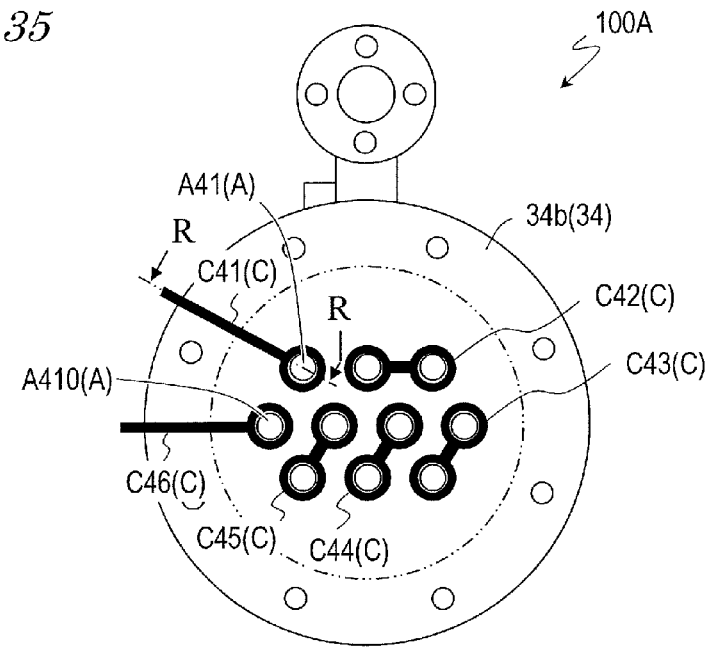
FIG. 35 illustrates the other side face of the thermoelectric generator unit 100A shown in FIG. 7 (left side view).

First, look at FIG. 35, which illustrates the other side face of the thermoelectric generator unit 100A shown in FIG. 7 (left side view). While FIG. 25 shows a configuration for the plate 36, FIG. 35 shows a configuration for the plate 34. Any member or operation that has already been described with respect to the plate 36 will not be described all over again to avoid redundancies.

As shown in FIG. 35, each of the channels C42 to C45 interconnects at least two of the openings A cut through the plate 34. In the present specification, such channels will be sometimes hereinafter referred to as "interconnections". The electrically conductive members housed in these interconnections may have the same configuration as the electrically conductive member J1. On the other hand, the channel C41 is provided for the plate 34 so as to run from the opening A41 to the outer edge of the plate 34. In the present specification, such a channel provided to run from an opening of a plate to its outer edge will be sometimes hereinafter referred to as a "terminal connection". The channels C41 and C46 shown in FIG. 35 are terminal connections. In each terminal connection, the electrically conductive member functioning as a terminal for connecting to an external circuit is housed.

Figure 36:
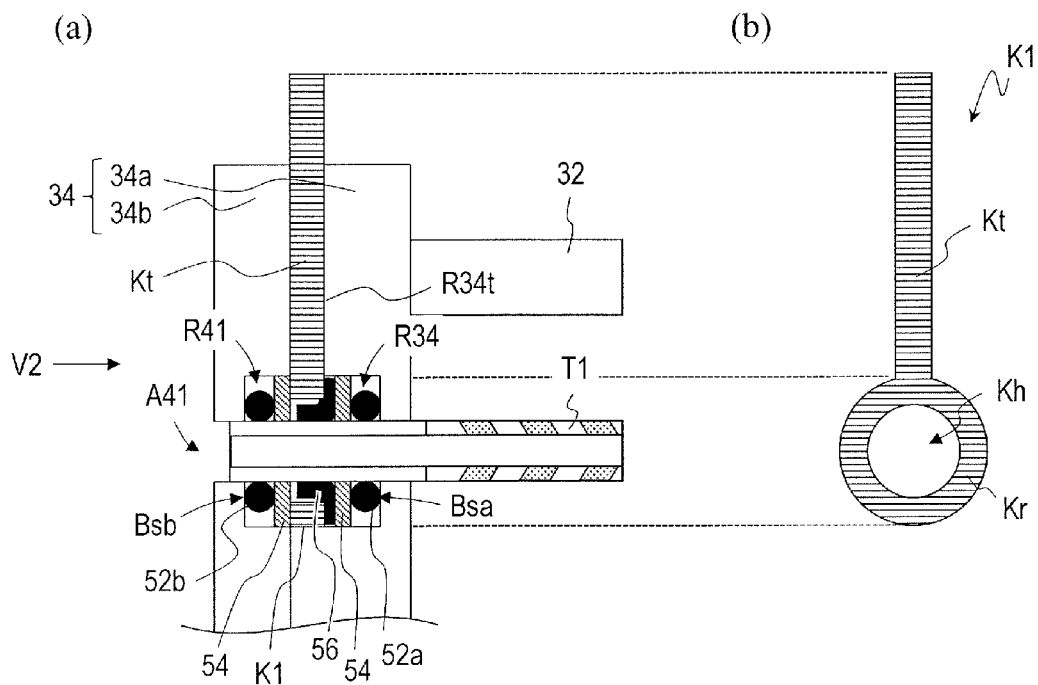
FIG. 36 schematically illustrates a cross section of a portion of a plate 34 and the appearance of an electrically conductive member K1.

Portion (a) of FIG. 36 is a schematic partial cross-sectional view of the plate 34. Specifically, portion (a) of FIG. 36 schematically illustrates a cross section of the plate 34 as viewed on a plane including the center axis of the tubular thermoelectric generator T1 and corresponding to the plane R-R' shown in FIG. 35. More specifically, portion (a) of FIG. 36 illustrates the structure of one A41 of multiple openings A that the plate 34 has and a region surrounding it. Portion (b) of FIG. 36 illustrates the appearance of an electrically conductive member K1 as viewed in the direction indicated by the arrow V2 in portion (a) of FIG. 36. This electrically conductive member K1 has a through hole Kh at one end. More specifically, this electrically conductive member K1 includes a ring portion Kr with the through hole Kh and a terminal portion Kt extending outward from the ring portion Kr. Just like the electrically conductive member J1, this electrically conductive member K1 is also typically made of a metal.

As shown in portion (a) of FIG. 36, one end of the tubular thermoelectric generator T1 (on the first electrode side) is inserted into the opening A41 of the plate 34. In this state, the end of the tubular thermoelectric generator T1 is inserted into the through hole Kh of the electrically conductive member K1. As can be seen, an electrically conductive member J or K1 can be said to be an electrically conductive plate with at least one hole to pass the tubular thermoelectric generator T through. The structure of the opening A410 and the region surrounding it is the same as that of the opening A41 and the region surrounding it except that the end of the tubular thermoelectric generator T10 is inserted into the opening A410 of the plate 34.

In the example illustrated in portion (a) of FIG. 36, the first plate portion 34a has a recess R34 which has been cut for the opening A41. This recess R34 includes a groove portion R34t which extends from the opening A41 through the outer edge of the first plate portion 34a. In this groove portion R34t, located is the terminal portion Kt of the electrically conductive member K1. In this example, the space defined by the recess R34 and a recess R41 which has been cut in the second plate portion 34b forms a channel to house the electrically conductive member K1. As in the example illustrated in portion (a) of FIG. 26, not only the electrically conductive member K1 but also a first O-ring 52a, washers 54, an electrically conductive ring member 56 and a second O-ring 52b are housed in the channel C41 in the example illustrated in portion (a) of FIG. 36, too. And the end of the tubular thermoelectric generator T1 goes through the holes of these members. The first O-ring 52a establishes sealing so as to prevent a fluid that has been supplied into the shell 32 from entering the channel C41. On the other hand, the second O-ring 52b establishes sealing so as to prevent a fluid located outside of the second plate portion 34b from entering the channel C41.

Figure 37:
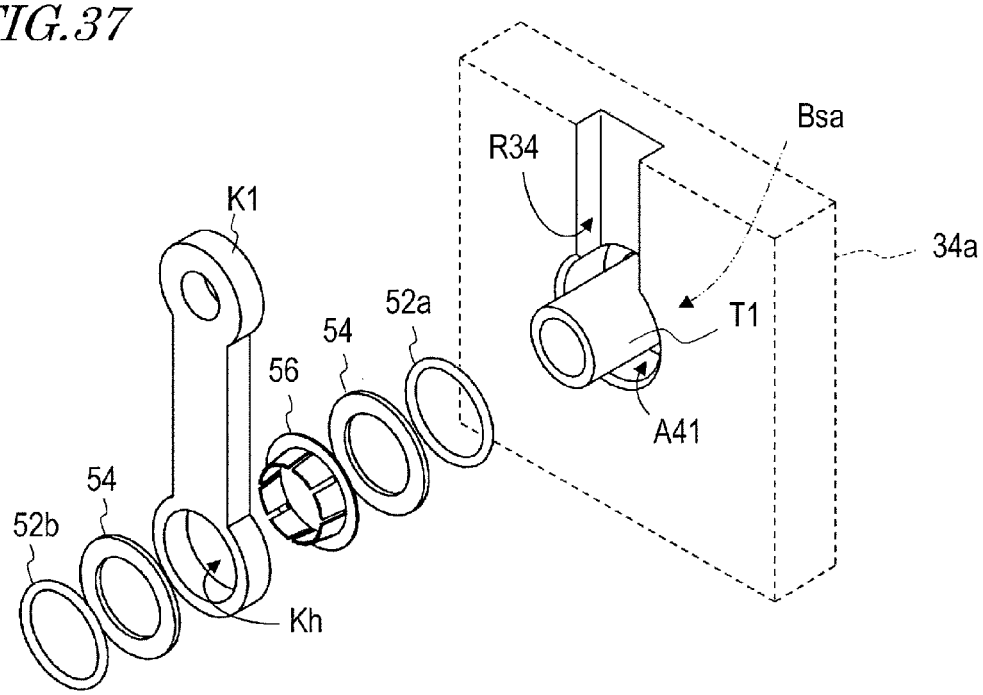
FIG. 37 is an exploded perspective view schematically illustrating the channel C41 to house the electrically conductive member K1 and its vicinity.

FIG. 37 is an exploded perspective view schematically illustrating the channel C41 to house the electrically conductive member K1 and its vicinity. For example, a first O-ring 52a, a washer 54, an electrically conductive ring member 56, the electrically conductive member K1, another washer 54 and a second O-ring 52b may be inserted into the opening A41 from outside of the container 30. The sealing surface of the second plate portion 34b (i.e., the surface that faces the first plate portion 34a) has substantially the same configuration as the sealing surface of the second plate portion 36b shown in FIG. 27B. Thus, by fastening the first and second plate portions 34a and 34b together, the second seating surface Bsb of the second plate portion 34b presses the first O-ring 52a against the seating surface Bsa of the first plate portion 34a through the second O-ring 52b, electrically conductive member K1 and electrically conductive ring member 56. In this manner, the electrically conductive member K1 can be sealed from the hot and cold media.

The ring portion Kr of the electrically conductive member K1 contacts with the flat portion 56f of the electrically conductive ring member 56 inside the opening A cut through the plate 34. In this manner, the electrically conductive member K1 is electrically connected to the outer peripheral surface at the end of the tubular thermoelectric generator T via the electrically conductive ring member 56. In this case, one end of the electrically conductive member K1 (i.e., the terminal portion Kt) sticks out of the plate 34 as shown in portion (a) of FIG. 36. Thus, that part of the terminal portion Kt that sticks out of the plate 34 may function as a terminal to connect the thermoelectric generator unit to an external circuit. As shown in FIG. 37, that part of the terminal portion Kt to stick out of the plate 34 may have a ring shape. In the present specification, an electrically conductive member, one end of which receives a tubular thermoelectric generator inserted and the other end of which sticks out, will be sometimes hereinafter referred to as a "terminal plate".

As described above, in this thermoelectric generator unit 100A, the tubular thermoelectric generators T1 and T10 are respectively connected to the two terminal plates housed in the terminal connections. In addition, between those two terminal plates, those tubular thermoelectric generators T1 through T10 are electrically connected together in series via the connection plate housed in the interconnection of the channel. Consequently, through the two terminal plates, one end of which sticks out of the plate (34, 36), the electric power generated by those tubular thermoelectric generators T1 to T10 can be extracted out of this thermoelectric generator unit 100A.

The arrangements of the electrically conductive ring member 56 and electrically conductive member J, K1 may be changed appropriately inside the channel C. In that case, the electrically conductive ring member 56 and the electrically conductive member (J, K1) just need to be arranged so that the elastic portions 56r of the electrically conductive ring member 56 are inserted into the through hole Jh1, Jh2 or Kh of the electrically conductive member. Also, as mentioned above, in an implementation in which the electrically conductive ring member 56 is omitted, the end of the tubular thermoelectric generator T may be electrically connected to the electrically conductive member K1. Optionally, part of the flat portion 56f of the electrically conductive ring member 56 may be extended and used in place of the terminal portion Kt of the electrically conductive member K1. In that case, the electrically conductive member K1 may be omitted.

In the example described above, a channel C is formed by respective recesses cut in the first and second plate portions. However, the channel C may also be formed by a recess which has been cut in one of the first and second plate portions. If the container 30 is made of a metallic material, the inside of the channel C may be coated with an insulator to prevent the electrically conductive members (i.e., the connection plates and the terminal plates) from becoming electrically conductive with the container 30. For example, the plate 34 (consisting of the plate portions 34a and 34b) may be comprised of a body made of a metallic material and an insulating coating which covers the surface of the body at least partially. Likewise, the plate 36 (consisting of the plate portions 36a and 36b) may also be comprised of a body made of a metallic material and an insulating coating which covers the surface of the body at least partially. If the respective surfaces of the recesses cut in the first and second plate portions are coated with an insulator, the insulating coating can be omitted from the surface of the electrically conductive member.

<Another Exemplary Structure to Establish Sealing and Electrical Connection>

Figure 38:
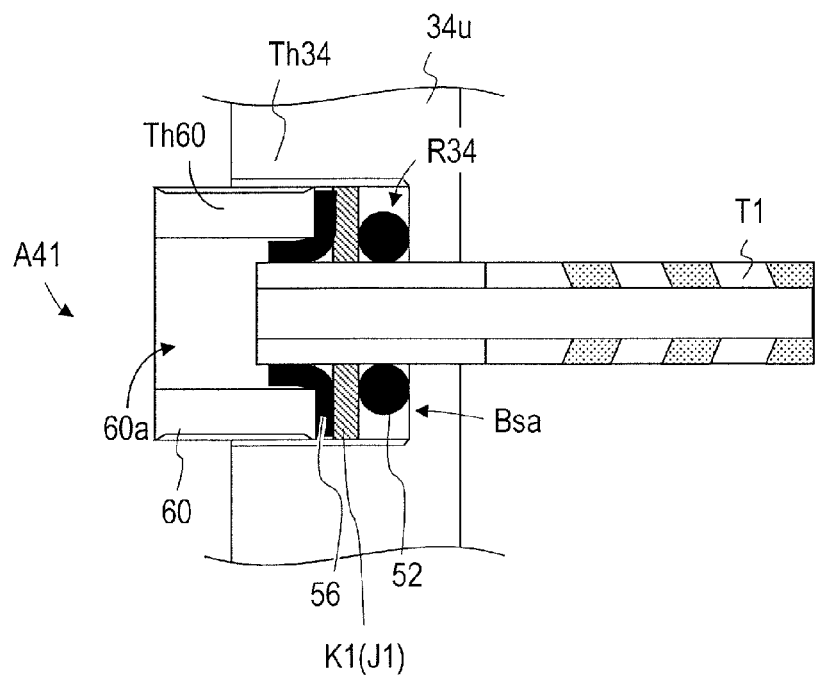
FIG. 38 is a cross-sectional view illustrating an exemplary structure for separating the medium in contact with the outer peripheral surface of each of the tubular thermoelectric generators T1 to T10 from the medium in contact with the inner peripheral surface of the tubular thermoelectric generator T so as to prevent those media from mixing together.

FIG. 38 is a cross-sectional view illustrating an exemplary structure for separating the medium in contact with the outer peripheral surface of each of the tubular thermoelectric generators T1 to T10 from the medium in contact with the inner peripheral surface of the tubular thermoelectric generator T so as to prevent those media from mixing together. In the example illustrated in FIG. 38, a busing 60 is inserted from outside of the container 30, thereby separating the hot and cold media from each other and electrically connecting the tubular thermoelectric generator and the electrically conductive member together.

In the example illustrated in FIG. 38, the opening A41 cut through the plate 34u has an internal thread portion Th34. More specifically, the wall surface of the recess R34 that has been cut with respect to the opening A41 of the plate 34u has the thread. The busing 60 with an external thread portion Th60 is inserted into the recess R34. The bushing 60 has a through hole 60a that runs in the axial direction. In this case, the end of the tubular thermoelectric generator T1 has been inserted into the opening A41 of the plate 34u. That is why when the busing 60 is inserted into the recess R34, the through hole 60a communicates with the internal flow path of the tubular thermoelectric generator T1.

Inside the space left between the recess R34 and the busing 60, arranged are various members to establish sealing and electrical connection. In the example illustrated in FIG. 38, an O-ring 52, the electrically conductive member K1 and the electrically conductive ring member 56 are arranged in this order from the seating surface Bsa of the plate 34u toward the outside of the container 30. The end of the tubular thermoelectric generator T1 is inserted into the respective holes of these members. The O-ring 52 contacts with the seating surface Bsa of the plate 34u and the outer peripheral surface at the end of the tubular thermoelectric generator T1. In this case, when the external thread portion Th60 is inserted into the internal thread portion Th34, the external thread portion Th60 presses the O-ring 52 against the seating surface Bsa via the flat portion 56f of the electrically conductive ring member 56 and the electrically conductive member K1. As a result, sealing can be established so as to prevent the fluid supplied into the shell 32 and the fluid supplied into the internal flow path of the tubular thermoelectric generator T1 from mixing with each other. In addition, since the outer peripheral surface of the tubular thermoelectric generator T1 contacts with the elastic portions 56r of the electrically conductive ring member 56 and since the flat portion 56f of the electrically conductive ring member 56 contacts with the ring portion Kr of the electrically conductive member K1, the tubular thermoelectric generator and the electrically conductive member can be electrically connected together.

As can be seen, by using the members shown in FIG. 38, the hot and cold media can be separated from each other and the tubular thermoelectric generator and the electrically conductive member can be electrically connected together with a simpler configuration.

Figure 39A:
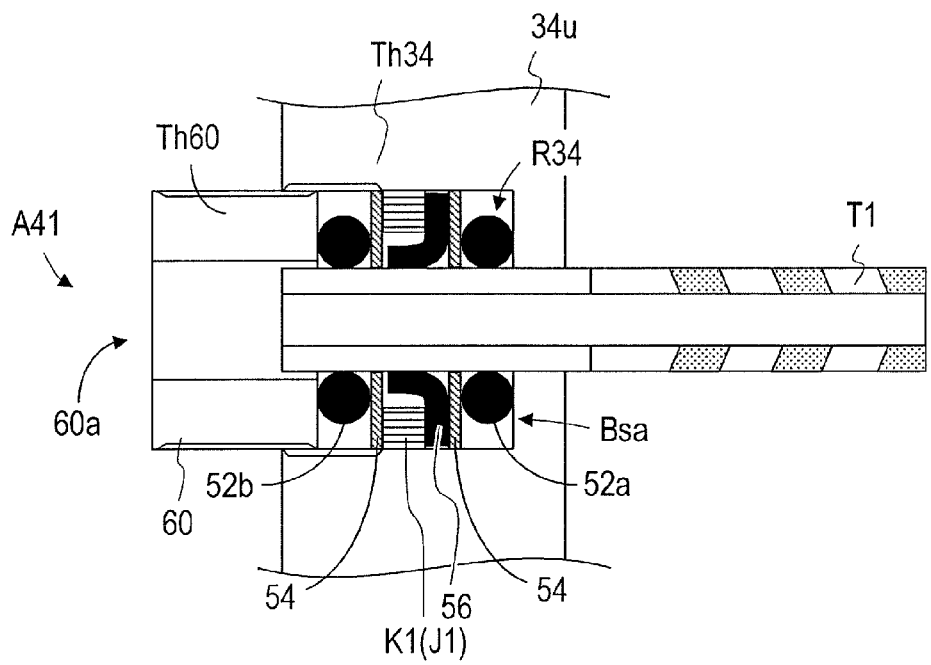
FIG. 39A is a cross-sectional view illustrating another exemplary structure for separating the hot and cold heat transfer media from each other and electrically connecting the tubular thermoelectric generator and the electrically conductive member together.
Figure 39B:
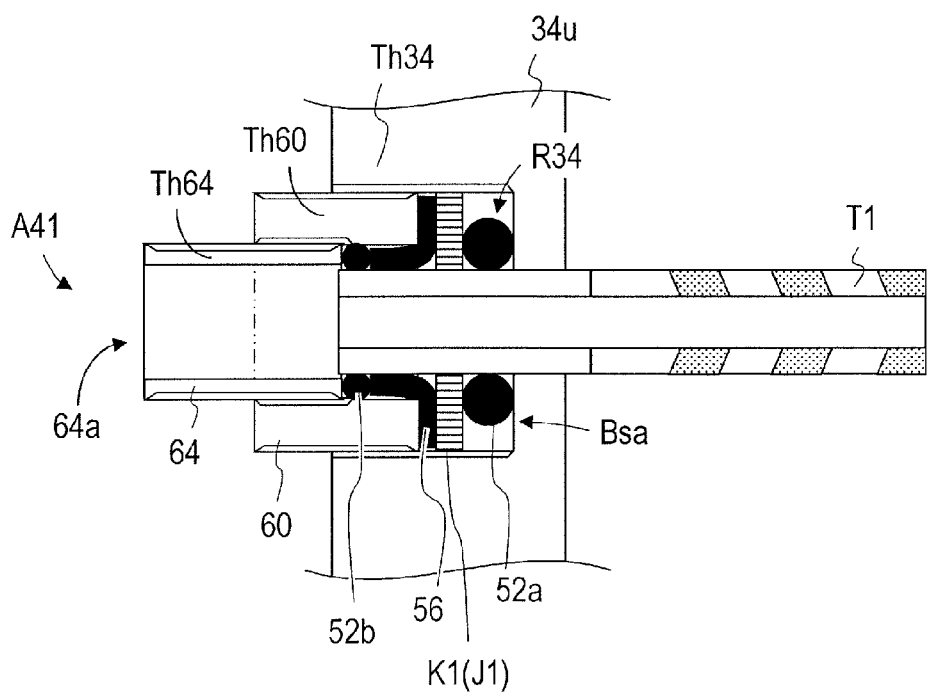
FIG. 39B is a cross-sectional view illustrating still another exemplary structure for separating the hot and cold heat transfer media from each other and electrically connecting the tubular thermoelectric generator and the electrically conductive member together.

FIGS. 39A and 39B are cross-sectional views illustrating two other exemplary structures for separating the hot and cold media from each other and electrically connecting the tubular thermoelectric generator and the electrically conductive member together. Specifically, in the example shown in FIG. 39A, a first O-ring 52a, a washer 54, the electrically conductive ring member 56, the electrically conductive member K1, another washer 54 and a second O-ring 52b are arranged in this order from the seating surface Bsa of the plate 34u toward the outside of the container 30. In the example illustrated in FIG. 39A, the external thread portion Th60 presses the O-ring 52a against the seating surface Bsa via the electrically conductive member K1 and the flat portion 56f of the electrically conductive ring member 56. On the other hand, in the example shown in FIG. 39B, a first O-ring 52a, the electrically conductive member K1, the electrically conductive ring member 56 and a second O-ring 52b are arranged in this order from the seating surface Bsa of the plate 34u toward the outside of the container 30. In addition, in FIG. 39B, another busing 64 with a through hole 64a has been inserted into the through hole 60a of the busing 60. The through hole 64a also communicates with the internal flow path of the tubular thermoelectric generator T1. In the example illustrated in FIG. 39B, the external thread portion Th64 of the busing 64 presses the second O-ring 52*b* against the seating surface Bsa. Sealing from both of the fluids (the hot and cold media) can be established by arranging the first and second O-rings 52*a* and 52*b* in this manner. By establishing sealing from both of the fluids (the hot and cold media), corrosion of the electrically conductive ring member 56 can be minimized.

As described above, one end of the terminal portion Kt of the electrically conductive member K1 sticks out of the plate 34*u* and can function as a terminal to connect the thermoelectric generator unit to an external circuit. In the implementations shown in FIGS. 38, 39A and 39B, the electrically conductive member K1 (terminal plate) may be replaced with a connection plate such as the electrically conductive member J1. In that case, the end of the tubular thermoelectric generator T1 is inserted into the through hole Jh1. If necessary, a washer 54 may be arranged between the O-ring and the electrically conductive member, for example.

<Embodiment of Thermoelectric Generator System Including the Thermoelectric Generator Units>

Next, an embodiment of a thermoelectric generator system including the thermoelectric generator units according to the present disclosure will be described.

The thermoelectric generator unit 100A, 100B or 100C described above may be used by itself or a plurality of thermoelectric generator units 100A, 100B or 100C may be used in combination. For example, if a thermoelectric generator system includes two thermoelectric generator units 100A, that thermoelectric generator system has a first a plurality of openings communicating with the respective flow paths of the multiple tubular thermoelectric generators T in the one thermoelectric generator unit 100A and a second plurality of openings communicating with the respective flow paths of the multiple tubular thermoelectric generators T in the other thermoelectric generator unit 100A. Those thermoelectric generator units 100A may be connected either in series to each other or parallel with each other.

In a thermoelectric generator system in which a number of thermoelectric generator units are connected together, when the system is going to start operating again after having gone through maintenance, for example, the air needs to be removed from inside of the container of each of those thermoelectric generator units. That is why the flow speed of the liquid introduced into the containers of those thermoelectric generator units is set to be higher than in a situation where a single thermoelectric generator unit is used. When such a thermoelectric generator system in which a number of thermoelectric generator units are connected together is starting to operate again, liquid with higher flow speed is introduced into the containers. For that reason, the chances that the liquid flowing into the containers does damage on the tubular thermoelectric generators should be higher than in a situation where there is only a single thermoelectric generator unit. Thus, it would be beneficial to ensure that the liquid flowing into the containers of the thermoelectric generator units will not damage the tubular thermoelectric generators.

Figure 40A:
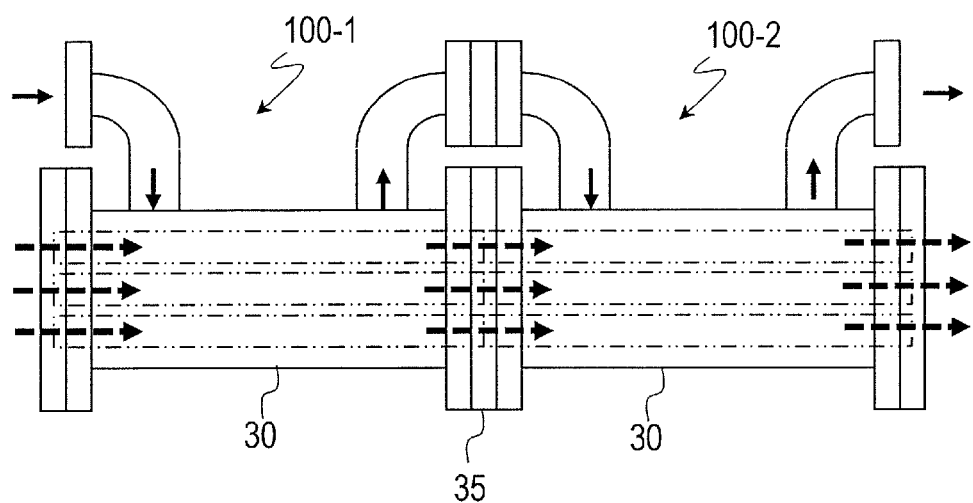
FIG. 40A illustrates an exemplary configuration for a thermoelectric generator system including a plurality of thermoelectric generator units.
Figure 40B:
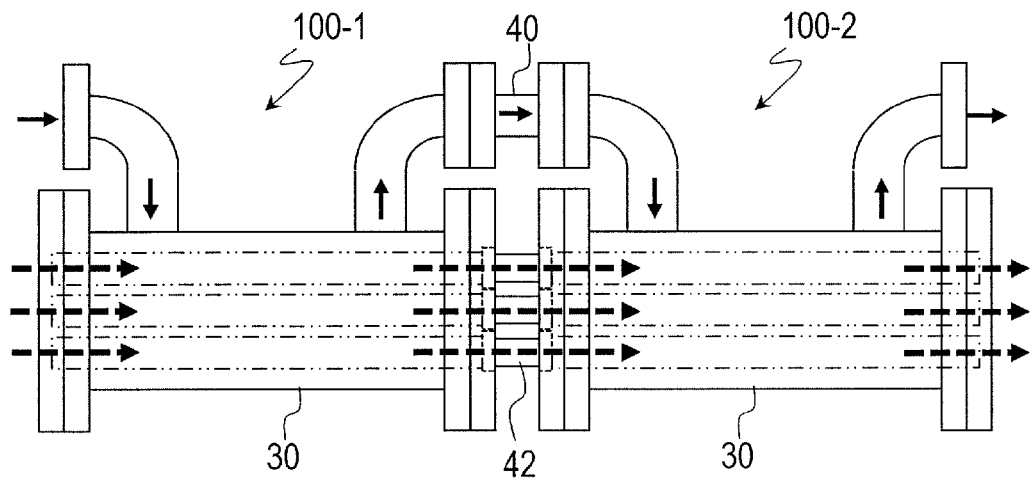
FIG. 40B illustrates an exemplary configuration for a thermoelectric generator system including a plurality of thermoelectric generator units.
Figure 40C:
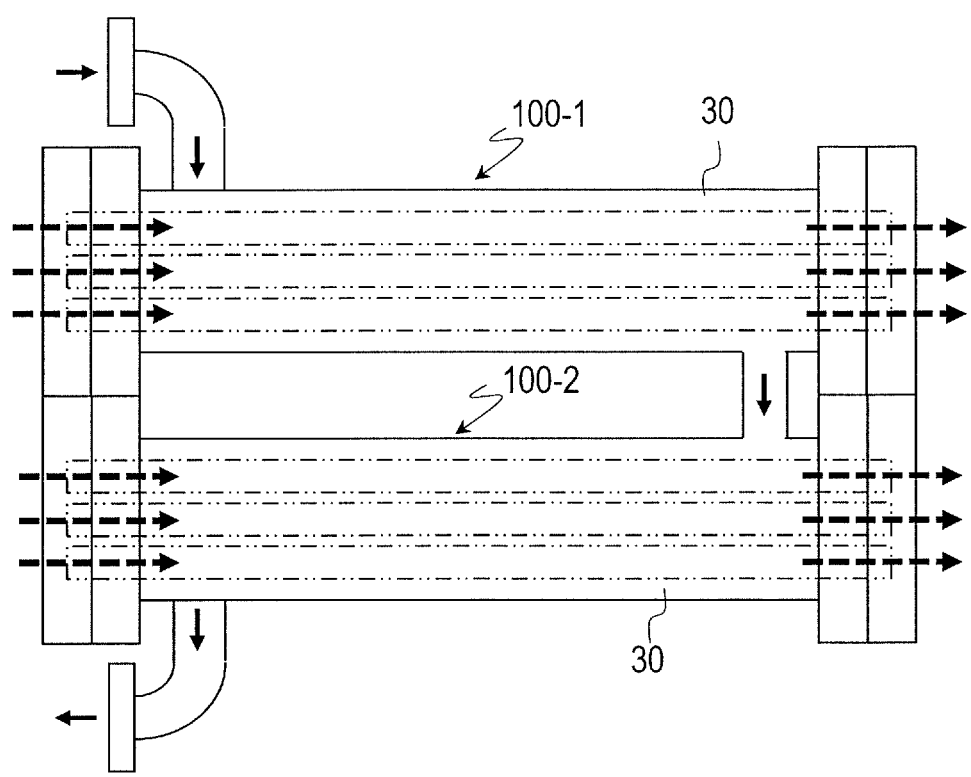
FIG. 40C illustrates an exemplary configuration for a thermoelectric generator system including a plurality of thermoelectric generator units.

Next, an exemplary configuration for a thermoelectric generator system including a plurality of thermoelectric generator units will be described with reference to FIGS. 40A, 40B and 40C. In FIGS. 40A, 40B and 40C, the bold solid arrows generally indicate the flow direction of the medium in contact with the outer peripheral surface of a tubular thermoelectric generator (i.e., the medium flowing inside of the container 30 (and outside of the tubular thermoelectric generator)). On the other hand, the bold dashed arrows generally indicate the flow direction of the medium in contact with the inner peripheral surface of a tubular thermoelectric generator (i.e., the medium flowing through the through hole (i.e., the inner flow path)). In the present specification, a path communicating with the fluid inlet and outlet ports of each container 30 will be sometimes hereinafter referred to as a "first medium path" and a path encompassing the respective flow paths of the plurality of tubular thermoelectric generators will be sometimes hereinafter referred to as a "second medium path".

First of all, look at FIG. 40A. The thermoelectric generator system shown in FIG. 40A includes first and second thermoelectric generator units 100-1 and 100-2, each of which may have the same configuration as any of the thermoelectric generator units 100A, 100B and 100C described above. From the drawings to be referred to in the following description, illustration of the baffles 70 and 70*a* to 70*f* and internal confining walls 33*a* and 33*b* will be sometimes omitted. In the example illustrated in FIG. 40A, the space communicating with the fluid inlet and outlet ports of the container 30 of the first thermoelectric generator unit 100-1 and with the fluid inlet and outlet ports of the container 30 of the second thermoelectric generator unit 100-2 forms the first medium path. Also, in the example illustrated in FIG. 40A, an intervening plate 35 is provided to make the respective flow paths of the multiple tubular thermoelectric generators that the first thermoelectric generator unit 100-1 has communicate with their associated flow paths of the multiple tubular thermoelectric generators that the second thermoelectric generator unit 100-2 has. As a result, a second medium path, communicating with the respective flow paths of the tubular thermoelectric generators T of the first and second thermoelectric generator units 100-1 and 100-2, is formed.

Next, look at FIG. 40B. As in the example shown in FIG. 40A, the thermoelectric generator system shown in FIG. 40B also includes first and second thermoelectric generator units 100-1 and 100-2. In the example shown in FIG. 40B, however, the respective flow paths of the multiple tubular thermoelectric generators that the first thermoelectric generator unit 100-1 has and their associated flow paths of the multiple tubular thermoelectric generators that the second thermoelectric generator unit 100-2 has communicate with each other via tubes 42. The medium that has been supplied into the container 30 of the first thermoelectric generator unit 100-1 is supplied to the inside of the container 30 of the second thermoelectric generator unit 100-2 through another tube 40. It should be noted that these tubes 40, 42 do not have to be straight ones but may be bent ones, too.

Next, look at FIG. 40C. The thermoelectric generator system shown in FIG. 40C includes first and second thermoelectric generator units 100-1 and 100-2 which are arranged parallel with each other. In the example illustrated in FIG. 40C, the medium flowing through the tubular thermoelectric generators of the first thermoelectric generator unit 100-1 and the medium flowing through the tubular thermoelectric generators of the second thermoelectric generator unit 100-2 run parallel to each other. However, the medium that has been supplied into the container 30 of the first thermoelectric generator unit 100-1 is also supplied into the container 30 of the second thermoelectric generator unit 100-2.

Figure 41A:
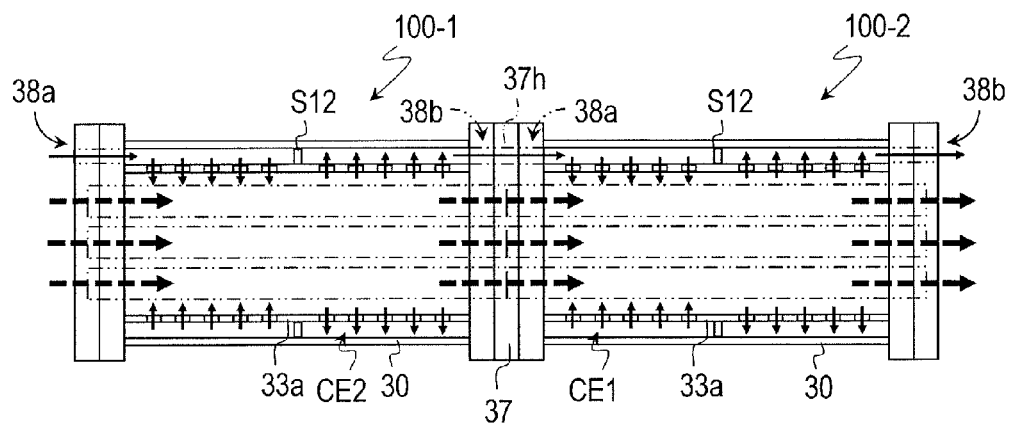
FIG. 41A illustrates another exemplary configuration for a thermoelectric generator system including a plurality of thermoelectric generator units.
Figure 41B:
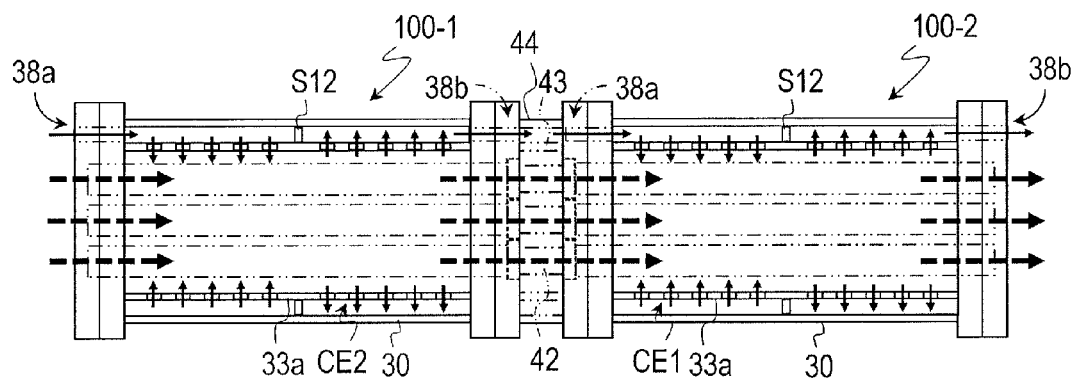
FIG. 41B illustrates another exemplary configuration for a thermoelectric generator system including a plurality of thermoelectric generator units.

Optionally, the fluid inlet port 38*a* or the fluid outlet port 38*b* may be cut through at least one of the pair of plates fixed to the shell as shown in FIGS. 41A and 41B. In the configurations shown in FIGS. 41A and 41B, each of the containers 30 of the first and second thermoelectric generator units 100-1 and 100-2 has an internal confining wall 33a as in the thermoelectric generator unit 100C shown in FIG. 21. In FIGS. 41A and 41B, illustrated is a schematic cross section of the shell of each thermoelectric generator unit.

In the example illustrated in FIG. 41A, an intervening plate 37 is provided to make the respective flow paths of the multiple tubular thermoelectric generators that the first thermoelectric generator unit 100-1 has communicate with their associated flow paths of the multiple tubular thermoelectric generators that the second thermoelectric generator unit 100-2 has. Also, in the example illustrated in FIG. 41A, the intervening plate 37 has a hole 37h at such a position as to face the fluid outlet port 38b of the first thermoelectric generator unit 100-1 and the fluid inlet port 38a of the second thermoelectric generator unit 100-2. The fluid in the second space CE2 of the first thermoelectric generator unit 100-1 flows into the first space CE1 of the second thermoelectric generator unit 100-2 through the hole 37h of the intervening plate 37. In this manner, a first medium path is formed. If the first thermoelectric generator unit 100-1 has a plurality of fluid outlet ports 38b and if the second thermoelectric generator unit 100-2 has a plurality of fluid inlet ports 38a, then the intervening plate 37 may have a plurality of holes.

In the example illustrated in FIG. 41B, the respective flow paths of the multiple tubular thermoelectric generators that the first thermoelectric generator unit 100-1 has communicate with their associated flow paths of the multiple tubular thermoelectric generators that the second thermoelectric generator unit 100-2 has via the tubes 42 as in the example shown in FIG. 40B. Also, in the example illustrated in FIG. 41B, another shell 44 is interposed between the first and second thermoelectric generator units 100-1 and 100-2.

As shown in FIG. 41B, the shell 44 may have an internal confining wall 43 which separates the hot and cold media from each other inside the shell 44. In the example illustrated in FIG. 41B, this internal confining wall 43 surrounds the tubes 42. The fluid in the second space CE2 of the first thermoelectric generator unit 100-1 flows into the space between the inner wall of the shell 44 and the internal confining wall 43 through the fluid outlet port 38b of the first thermoelectric generator unit 100-1. Then, the fluid that has flowed into the space between the inner wall of the shell 44 and the internal confining wall 43 flows into the first space CE1 of the second thermoelectric generator unit 100-2 through the fluid inlet port 38a of the second thermoelectric generator unit 100-2. As a result, a first medium path is formed. If the shell 44 has the internal confining wall 43, the tubes 42 may be omitted.

In the examples shown in FIGS. 41A and 41B, the first and second conduits 72a and 72b shown in FIG. 21 are not needed. Thus, the appearance of this thermoelectric generator system may be made similar to that of an ordinary piping system.

As can be seen, in a thermoelectric generator system including a plurality of thermoelectric generator units, the flow paths of the hot and cold media may be designed in various manners. FIGS. 40A, 40B, 40C, 41A and 41B illustrate just some examples of those various designs. And the first medium path communicating with the fluid inlet and outlet ports of respective containers and the second medium path encompassing the respective flow paths of the tubular thermoelectric generators may be designed arbitrarily. In the exemplary embodiments shown in FIGS. 40A, 40B, 40C, 41A and 41B, the second medium path is configured to make the fluid flow in the same direction through the respective flow paths of the multiple tubular thermoelectric generators T. However, the fluid does not have to flow in the same direction through the respective flow paths of the multiple tubular thermoelectric generators T. Rather the direction in which the fluid flows through the respective flow paths of those tubular thermoelectric generators T may be set in various manners according to the design of the flow paths of the hot and cold media.

<Exemplary Configuration for Thermoelectric Generator System's Electric Circuit>

Next, an exemplary configuration for an electric circuit that the thermoelectric generator system according to the present disclosure includes will be described with reference to FIG. 42.

Figure 42:
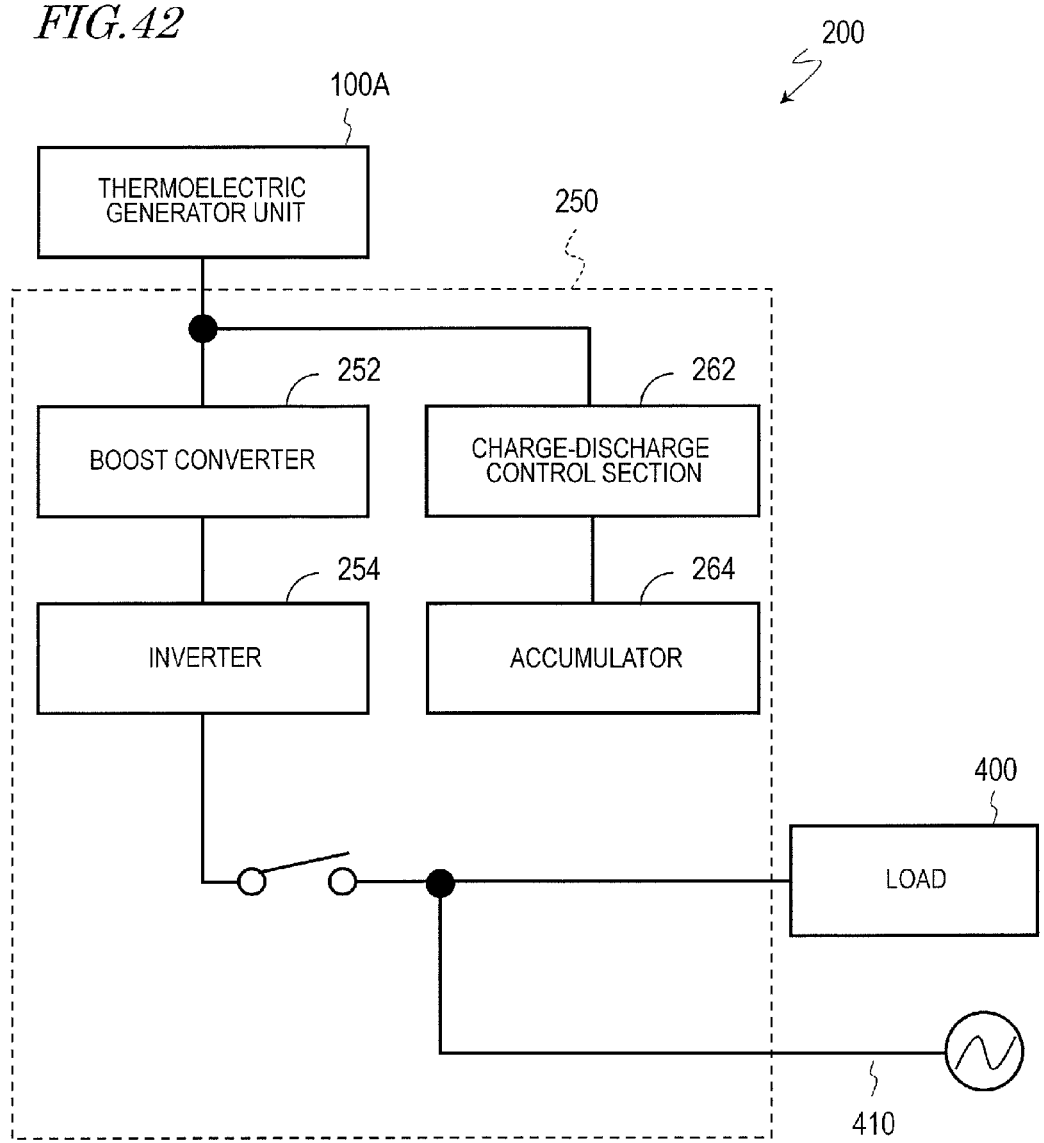
FIG. 42 is a block diagram illustrating an exemplary configuration of an electric circuit that the thermoelectric generator system according to the present disclosure may include.

In the example shown in FIG. 42, the thermoelectric generator system 200 according to this embodiment includes an electric circuit 250 which receives electric power from the thermoelectric generator unit. The thermoelectric generator unit that the thermoelectric generator system 200 has may be any of the thermoelectric generator units 100A, 100B and 100C described above. In this example, the thermoelectric generator unit is supposed to be the thermoelectric generator unit 100A. This electric circuit 250 includes a boost converter 252 which boosts the voltage of the electric power supplied from the thermoelectric generator unit 100A, and an inverter (DC-AC inverter) 254 which converts the DC power supplied from the boost converter 252 into AC power (of which the frequency may be 50/60 Hz, for example, but may also be any other frequency). The AC power may be supplied from the inverter 254 to a load 400. The load 400 may be any of various electrical or electronic devices that operate using AC power. The load 400 may have a charging function in itself, and does not have to be fixed to the electric circuit 250. Any AC power that has not been dissipated by the load 400 may be connected to a commercial grid 410 so that the electricity can be sold.

The electric circuit 250 in the example shown in FIG. 42 includes a charge-discharge control section 262 and an accumulator 264 for storing the DC power obtained from the thermoelectric generator unit 100A. The accumulator 264 may be a chemical battery such as a lithium ion secondary battery, or a capacitor such as an electric double-layer capacitor, for example. The electric power stored in the accumulator 264 may be fed as needed to the boost converter 252 by the charge-discharge control section 262, and may be used or sold as AC power via the inverter 254.

The magnitude of the electric power supplied from the thermoelectric generator unit 100A may vary with time either periodically or irregularly. For example, if the heat source of the hot medium is the waste heat discharged from a factory, the temperature of the hot medium may vary according to the operating schedule of that factory. In that case, the power generation state of the thermoelectric generator unit 100A will vary so significantly that the voltage of the electric power supplied from the thermoelectric generator unit 100A and/or the amount of electric current will vary, too. However, even if the power generation state varies in this manner, the thermoelectric generator system 200 shown in FIG. 42 can also minimize the influence caused by such a variation in power output level by making the charge-discharge control section 262 accumulate electric power in the accumulator 264.

If the electric power generated is dissipated in real time, then the voltage step-up ratio of the boost converter 252 may be adjusted according to the variation in power generation state. Alternatively, a control operation may also be carried out so that the power generation state is maintained in steady state by regulating the flow rate, temperature and other parameters of the hot or cold medium to be supplied to the thermoelectric generator unit 100A with such a variation in power generation state sensed or predicted.

Now take a look at FIG. 4 again. In the system illustrated in FIG. 4, the flow rate of the hot medium may be adjusted by the pump P1. In the same way, the flow rate of the cold medium may be adjusted by the pump P2. By adjusting the flow rate(s) of one or both of the hot and cold media, the power output level of the tubular thermoelectric generator can be controlled.

Optionally, the temperature of the hot medium may be controlled by adjusting the quantity of heat supplied from a high-temperature heat source (not shown) to the hot medium. In the same way, the temperature of the cold medium may also be controlled by adjusting the quantity of heat dissipated from the cold medium into a low-temperature heat source (not shown, either).

Although not shown in FIG. 4, the flow rates of the respective media supplied to the thermoelectric generator system may be adjusted by providing a valve and a branch path for at least one of the flow paths of the hot and cold media.

<Another Embodiment of Thermoelectric Generator System>

Another embodiment of a thermoelectric generator system according to the present disclosure will now be described with reference to FIG. 43.

In this embodiment, a thermoelectric generator unit according to the present disclosure is provided for a general waste disposal facility (that is a so-called "garbage disposal facility" or a "clean center"). In recent years, at a waste disposal facility, high-temperature, high-pressure steam (at a temperature of 400 to 500 degrees Celsius and at a pressure of several MPa) is sometimes generated from the thermal energy produced when garbage (waste) is incinerated. Such steam energy is converted into electricity by turbine generator and the electricity thus generated is used to operate the equipment in the facility.

The thermoelectric generator system 300 of this embodiment includes at least one of the thermoelectric generator units described above. The thermoelectric generator unit that the thermoelectric generator system 300 may be any of the thermoelectric generator units 100A, 100B and 100C described above. In this example, the thermoelectric generator unit is supposed to be the thermoelectric generator unit 100A. In the example illustrated in FIG. 43, the hot medium supplied to the thermoelectric generator unit 100A has been produced based on the heat of combustion generated at the waste disposal facility. More specifically, this system includes an incinerator 310, a boiler 320 to produce high-temperature, high-pressure steam based on the heat of combustion generated by the incinerator 310, and a turbine 330 which is driven by the high-temperature, high-pressure steam produced by the boiler 320. The energy generated by the turbine 330 driven is given to a synchronous generator (not shown), which converts the energy into AC power (such as three-phase AC power).

The steam that has been used to drive the turbine 330 is turned back by a condenser 360 into liquid water, which is then supplied by a pump 370 to the boiler 320. This water is a working medium that circulates through a "heat cycle" formed by the boiler 320, turbine 330 and condenser 360. Part of the heat given by the boiler 320 to the water does work to drive the turbine 330 and then is given by the condenser 360 to cooling water. In general, cooling water circulates between the condenser 360 and a cooling tower 350 as indicated by the dotted arrows in FIG. 43.

As can be seen, only a part of the heat generated by the incinerator 310 is converted by the turbine 330 into electricity, and the thermal energy that the low-temperature, low-pressure steam has after the turbine 330 has been driven has not been converted into, and used as, electrical energy but often just dumped into the ambient according to conventional technologies. According to this embodiment, however, the low-temperature steam or hot water that has done work to drive the turbine 330 can be used effectively as a heat source for the hot medium. In this embodiment, heat is obtained by the heat exchanger 340 from the steam at such a low temperature (of 140 degrees Celsius, for example) and hot water at 99 degrees Celsius is obtained, for example. And this hot water is supplied as hot medium to the thermoelectric generator unit 100A.

On the other hand, a part of the cooling water used at a waste disposal facility, for example, may be used as the cold medium. If the waste disposal facility has the cooling tower 350, water at about 10 degrees Celsius can be obtained from the cooling tower 350 and used as the cold medium. Alternatively, the cold medium does not have to be obtained from a special cooling tower but may also be well water or river water inside the facility or in the neighborhood.

Figure 43:
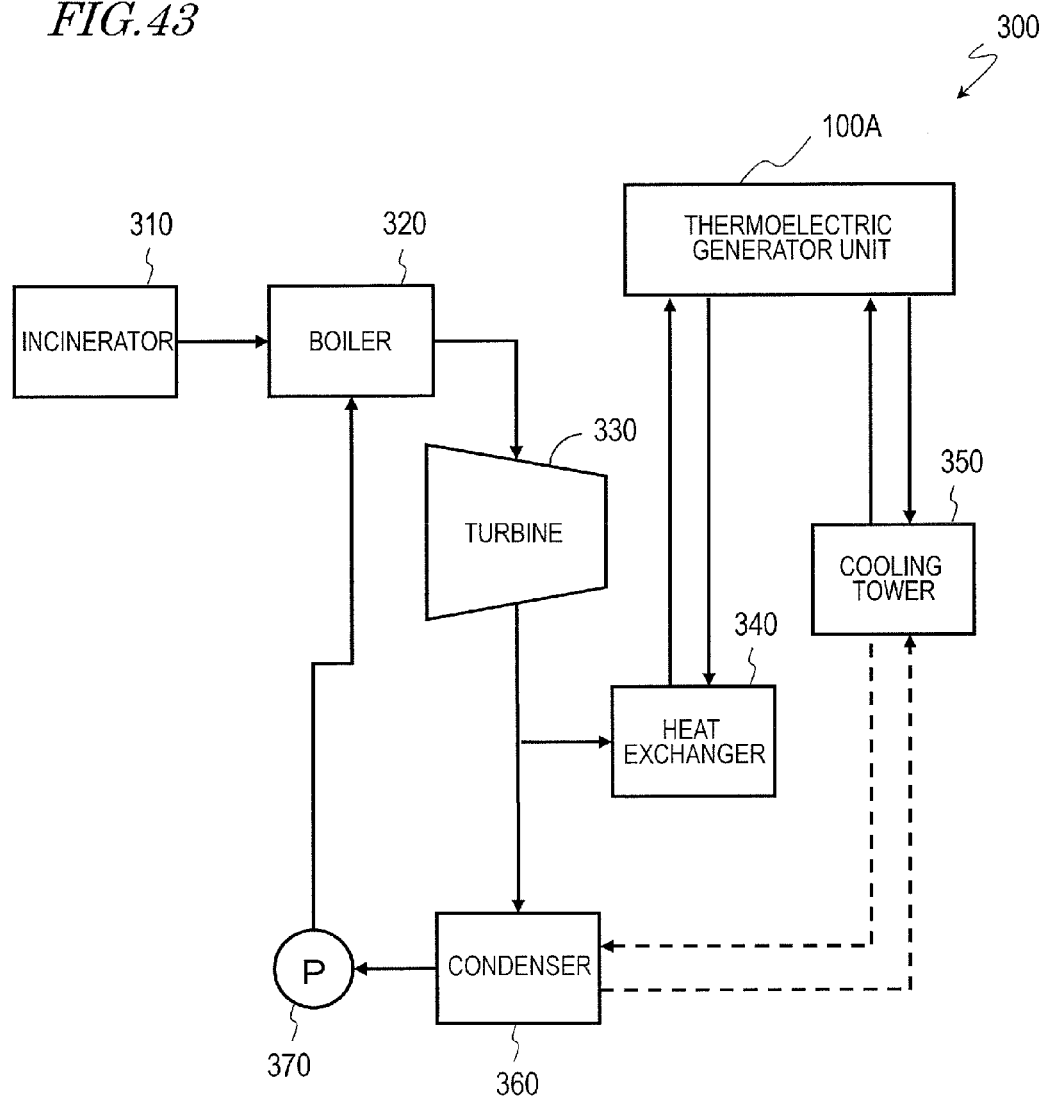
FIG. 43 is a block diagram illustrating an exemplary configuration for another embodiment in which a thermoelectric generator system according to the present disclosure may be used.

The thermoelectric generator unit 100A shown in FIG. 43 may be connected to the electric circuit 250 shown in FIG. 42, for example. The electricity generated by the thermoelectric generator unit 100A may be either used in the facility or accumulated in the accumulator 264. The extra electric power may be converted into AC power and then sold through the commercial grid 410.

The thermoelectric generator system 300 shown in FIG. 43 has a configuration in which a thermoelectric generator unit according to the present disclosure is incorporated into the waste heat utilization system of a waste disposal facility including the boiler 320 and the turbine 330. However, to operate the thermoelectric generator unit 100A of the present disclosure, the boiler 320, turbine 330, condenser 360 and heat exchanger 340 are not indispensable members. If there is any gas or hot water at a relatively low temperature which has been just disposed of according to conventional technologies, that gas or water may be effectively used as hot medium directly. Or another gas or liquid may be heated by a heat exchanger and used as a hot medium. The system shown in FIG. 43 is just one of many practical examples.

It should be noted that inside the container of the thermoelectric generator unit, a number of tubular thermoelectric generators may be arranged parallel to the horizontal direction, for example. Alternatively, those tubular thermoelectric generators may also be arranged parallel to the vertical direction, too.

As is clear from the foregoing description, in one embodiment of a thermoelectric generator unit according to the present disclosure, a baffle is arranged between a fluid inlet port and a plurality of tubular thermoelectric generators. This baffle changes the flow direction of a fluid that has flowed into a container. In another embodiment of a thermoelectric generator unit according to the present disclosure, a conduit, one end of which is connected to the fluid inlet port, is arranged so that an extension of the center axis of the conduit passes between the plurality of tubular thermoelectric generators and an inner wall of a shell. In still another embodiment of a thermoelectric generator unit according to the present disclosure, the container has an internal confining wall which is arranged between the plurality of tubular thermoelectric generators and the shell.

According to at least any of the embodiments of a thermoelectric generator unit according to the present disclosure, the chances of allowing liquid flowing into an empty container to do damage on the tubular thermoelectric generators can be reduced and the practicality of thermoelectric power generation can be increased.

A thermoelectric generator unit as one implementation of the present disclosure comprises: a plurality of tubular thermoelectric generators, each of which has an outer peripheral surface, an inner peripheral surface and a flow path defined by the inner peripheral surface, and each of which generates electromotive force in an axial direction of each said tubular thermoelectric generator based on a difference in temperature between the inner and outer peripheral surfaces; a container housing the plurality of tubular thermoelectric generators inside, the container having fluid inlet and outlet ports through which a fluid flows inside the container, and a plurality of openings into which the respective tubular thermoelectric generators are inserted; a plurality of electrically conductive members providing electrical interconnection among the plurality of tubular thermoelectric generators; and a baffle provided between the fluid inlet port and the plurality of tubular thermoelectric generators, wherein the baffle changes the flow direction of the fluid that has flowed into the container through the fluid inlet port.

In one embodiment, the baffle is arranged to cover at least one of the plurality of tubular thermoelectric generators inside the container.

In one embodiment, the baffle has such a shape as to shield the plurality of tubular thermoelectric generators from the fluid that has flowed into the container through the fluid inlet port.

In one embodiment, on a plane which intersects with the axial direction of the plurality of tubular thermoelectric generators at right angles, the baffle has a cross section projecting toward the fluid inlet port.

A thermoelectric generator unit as another implementation of the present disclosure comprises: a plurality of tubular thermoelectric generators, each of which has an outer peripheral surface, an inner peripheral surface and a flow path defined by the inner peripheral surface, and each of which generates electromotive force in an axial direction of each said tubular thermoelectric generator based on a difference in temperature between the inner and outer peripheral surfaces; a container housing the plurality of tubular thermoelectric generators inside, the container having fluid inlet and outlet ports through which a fluid flows inside the container, a plurality of openings into which the respective tubular thermoelectric generators are inserted, and a shell surrounding the plurality of tubular thermoelectric generators; a conduit, one end of the conduit being connected to the fluid inlet port, and an extension of the center axis of the conduit passing between the plurality of tubular thermoelectric generators and an inner wall of the shell; and a plurality of electrically conductive members providing electrical interconnection among the plurality of tubular thermoelectric generators.

In one embodiment, an inner wall of the conduit and the inner wall of the shell are smoothly connected together.

In one embodiment, the conduit is connected to the fluid inlet port so that the fluid that has flowed into the container through the fluid inlet port flows along the inner wall of the shell.

A thermoelectric generator unit as still another implementation of the present disclosure comprises: a plurality of tubular thermoelectric generators, each of which has an outer peripheral surface, an inner peripheral surface and a flow path defined by the inner peripheral surface, and each of which generates electromotive force in an axial direction of each said tubular thermoelectric generator based on a difference in temperature between the inner and outer peripheral surfaces; a container housing the plurality of tubular thermoelectric generators inside, the container having fluid inlet and outlet ports through which a fluid flows inside the container, a plurality of openings into which the respective tubular thermoelectric generators are inserted, a shell surrounding the plurality of tubular thermoelectric generators, and an internal confining wall provided between the plurality of tubular thermoelectric generators and the shell; and a plurality of electrically conductive members providing electrical interconnection among the plurality of tubular thermoelectric generators.

In one embodiment, the internal confining wall surrounds the plurality of tubular thermoelectric generators and has a plurality of throughholes.

In one embodiment, the fluid inlet port is arranged so that the fluid enters a space inside of the internal confining wall through the plurality of throughholes.

In one embodiment, the container further has a partition which divides a space between the shell and the internal confining wall into first and second spaces.

In one embodiment, the container includes a pair of plates at least one of the plates having a channel and the plurality of openings, the channel housing plural electrically conductive members and interconnecting at least two of the plurality of openings together, and respective ends of the tubular thermoelectric generators are inserted into the plurality of openings of the plates.

In one embodiment, the plurality of electrically conductive members connect the plurality of tubular thermoelectric generators electrically in series.

Yet another implementation of the present disclosure is a thermoelectric generator system having a plurality of thermoelectric generator units including first and second thermoelectric generator units. Each of the first and second thermoelectric generator units may be any of the thermoelectric generator units set forth above. The system has a first plurality of openings communicating with the respective flow paths of the plurality of tubular thermoelectric generators in the first thermoelectric generator unit and a second plurality of openings communicating with the respective flow paths of the plurality of tubular thermoelectric generators in the second thermoelectric generator unit.

The thermoelectric generator system may comprise: a first medium path communicating with the fluid inlet and outlet ports of the container in the first thermoelectric generator unit and the fluid inlet and outlet ports of the container in the second thermoelectric generator unit; and a second medium path encompassing the respective flow paths of the plurality of tubular thermoelectric generators in the first and second thermoelectric generator units.

In one embodiment, in the second medium path, the fluid flows in the same direction through the respective flow paths of the plurality of tubular thermoelectric generators.

A thermoelectric generator unit according to the present disclosure may be used as a power generator which utilizes the heat of hot water that has sprung from a hot spring or an exhaust gas exhausted from a factory, for example.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A thermoelectric generator unit comprising:
a plurality of tubular thermoelectric generators, each of which has an outer peripheral surface, an inner peripheral surface and a flow path defined by the inner peripheral surface, and each of which generates electromotive force in an axial direction of each said tubular thermoelectric generator based on a difference in temperature between the inner and outer peripheral surfaces;
a container housing the plurality of tubular thermoelectric generators inside, the container having fluid inlet and outlet ports through which a fluid flows inside the container, and a plurality of openings into which the respective tubular thermoelectric generators are inserted;
a plurality of electrically conductive members providing electrical interconnection among the plurality of tubular thermoelectric generators; and
a baffle physically positioned between the fluid inlet port and the plurality of tubular thermoelectric generators,
wherein the baffle changes the flow direction of the fluid that has flowed into the container through the fluid inlet port.

2. The thermoelectric generator unit of claim 1, wherein the baffle is arranged to cover at least one of the plurality of tubular thermoelectric generators inside the container.

3. The thermoelectric generator unit of claim 1, wherein the baffle has such a shape as to shield the plurality of tubular thermoelectric generators from the fluid that has flowed into the container through the fluid inlet port.

4. The thermoelectric generator unit of claim 1, wherein, on a plane which intersects with the axial direction of the plurality of tubular thermoelectric generators at right angles, the baffle has a cross section projecting toward the fluid inlet port.

5. A thermoelectric generator unit comprising:
a plurality of tubular thermoelectric generators, each of which has an outer peripheral surface, an inner peripheral surface and a flow path defined by the inner peripheral surface, and each of which generates electromotive force in an axial direction of each said tubular thermoelectric generator based on a difference in temperature between the inner and outer peripheral surfaces;
a container housing the plurality of tubular thermoelectric generators inside, the container having fluid inlet and outlet ports through which a fluid flows inside the container, a plurality of openings into which the respective tubular thermoelectric generators are inserted, and a shell surrounding the plurality of tubular thermoelectric generators and defining a volume of the fluid flowing inside the container in which the thermoelectric generators are inserted;
a conduit, one end of the conduit being connected to the fluid inlet port, and an extension of the center axis of the conduit passing between the plurality of tubular thermoelectric generators and an inner wall of the shell with no thermoelectric generator therebetween; and
a plurality of electrically conductive members providing electrical interconnection among the plurality of tubular thermoelectric generators.

6. The thermoelectric generator unit of claim 5, wherein an inner wall of the conduit and the inner wall of the shell are connected together such that the inner wall of the conduit has a continuous transition into the inner wall of the shell.

7. The thermoelectric generator unit of claim 5, wherein the conduit is connected to the fluid inlet port so that the fluid that has flowed into the container through the fluid inlet port flows along the inner wall of the shell.

8. A thermoelectric generator unit comprising:
a plurality of tubular thermoelectric generators, each of which has an outer peripheral surface, an inner peripheral surface and a flow path defined by the inner peripheral surface, and each of which generates electromotive force in an axial direction of each said tubular thermoelectric generator based on a difference in temperature between the inner and outer peripheral surfaces;
a container housing the plurality of tubular thermoelectric generators inside, the container having fluid inlet and outlet ports through which a fluid flows inside the container, a plurality of openings into which the respective tubular thermoelectric generators are inserted, a shell surrounding the plurality of tubular thermoelectric generators, and an internal confining wall provided between the plurality of tubular thermoelectric generators and the shell, at least a portion of the internal confining wall being physically positioned between the fluid inlet port and the plurality of tubular thermoelectric generators; and
a plurality of electrically conductive members providing electrical interconnection among the plurality of tubular thermoelectric generators.

9. The thermoelectric generator unit of claim 8, wherein the internal confining wall surrounds the plurality of tubular thermoelectric generators and has a plurality of throughholes.

10. The thermoelectric generator unit of claim 9, wherein the fluid inlet port is arranged so that the fluid enters a space inside of the internal confining wall through the plurality of throughholes.

11. The thermoelectric generator unit of claim 8, wherein the container further has a partition which divides a space between the shell and the internal confining wall into first and second spaces.

12. The thermoelectric generator unit of claim 1, wherein the container includes a pair of plates at least one of the plates having a channel and the plurality of openings, the channel housing plural electrically conductive members and interconnecting at least two of the plurality of openings together, and
respective ends of the tubular thermoelectric generators are inserted into the plurality of openings of the plates.

13. The thermoelectric generator unit of claim 1, wherein the plurality of electrically conductive members connect the plurality of tubular thermoelectric generators electrically in series.

14. A thermoelectric generator system having a plurality of thermoelectric generator units including first and second thermoelectric generator units,
wherein each of the first and second thermoelectric generator units is the thermoelectric generator unit of claim 1, and
the system has a first plurality of openings communicating with the respective flow paths of the plurality of tubular thermoelectric generators in the first thermoelectric generator unit and a second plurality of openings communicating with the respective flow paths of the plurality of tubular thermoelectric generators in the second thermoelectric generator unit.

15. The thermoelectric generator system of claim 14, comprising:
- a first medium path communicating with the fluid inlet and outlet ports of the container in the first thermoelectric generator unit and the fluid inlet and outlet ports of the container in the second thermoelectric generator unit; and
- a second medium path encompassing the respective flow paths of the plurality of tubular thermoelectric generators in the first and second thermoelectric generator units.

16. The thermoelectric generator system of claim 15, wherein in the second medium path, the fluid flows in the same direction through the respective flow paths of the plurality of tubular thermoelectric generators.

17. The thermoelectric generator unit of claim 5, wherein the container includes a pair of plates at least one of the plates having a channel and the plurality of openings, the channel housing plural electrically conductive members and interconnecting at least two of the plurality of openings together, and
- respective ends of the tubular thermoelectric generators are inserted into the plurality of openings of the plates.

18. The thermoelectric generator unit of claim 8, wherein the container includes a pair of plates at least one of the plates having a channel and the plurality of openings, the channel housing plural electrically conductive members and interconnecting at least two of the plurality of openings together, and
- respective ends of the tubular thermoelectric generators are inserted into the plurality of openings of the plates.

19. A thermoelectric generator system having a plurality of thermoelectric generator units including first and second thermoelectric generator units,
- wherein each of the first and second thermoelectric generator units is the thermoelectric generator unit of claim 5, and
- the system has a first plurality of openings communicating with the respective flow paths of the plurality of tubular thermoelectric generators in the first thermoelectric generator unit and a second plurality of openings communicating with the respective flow paths of the plurality of tubular thermoelectric generators in the second thermoelectric generator unit.

20. A thermoelectric generator system having a plurality of thermoelectric generator units including first and second thermoelectric generator units,
- wherein each of the first and second thermoelectric generator units is the thermoelectric generator unit of claim 8, and
- the system has a first plurality of openings communicating with the respective flow paths of the plurality of tubular thermoelectric generators in the first thermoelectric generator unit and a second plurality of openings communicating with the respective flow paths of the plurality of tubular thermoelectric generators in the second thermoelectric generator unit.

* * * * *